(12) United States Patent
Satoh et al.

(10) Patent No.: US 6,459,612 B2
(45) Date of Patent: Oct. 1, 2002

(54) NONVOLATILE SEMICONDUCTOR MEMORY DEVICE

(75) Inventors: Shinji Satoh; Fumitaka Arai, both of Yokohama; Riichiro Shirota, Fujisawa, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/953,687

(22) Filed: Sep. 14, 2001

Related U.S. Application Data

(62) Division of application No. 09/500,315, filed on Feb. 8, 2000, now Pat. No. 6,314,026.

(30) Foreign Application Priority Data

Feb. 8, 1999 (JP) ............................................ 11-029971
Feb. 16, 1999 (JP) ............................................ 11-037733

(51) Int. Cl.[7] ............................................. G11C 16/04
(52) U.S. Cl. ........................... 365/185.03; 365/185.22; 365/185.24; 365/185.3
(58) Field of Search ..................... 365/185.03, 185.17, 365/185.22, 185.24, 185.29, 185.3, 185.33

(56) References Cited

U.S. PATENT DOCUMENTS

| 5,132,935 A | | 6/1992 | Ashmore et al. | ...... 365/185.24 |
| 5,521,865 A | * | 5/1996 | Ohuchi et al. | ......... 365/185.03 |
| 5,600,593 A | | 2/1997 | Fong | .................... 365/185.19 |
| 5,847,992 A | * | 12/1998 | Tanaka et al. | ......... 365/185.03 |
| 5,892,715 A | | 4/1999 | Hirata et al. | ........... 365/185.29 |
| 5,910,925 A | * | 6/1999 | Guterman et al. | ..... 365/189.01 |
| 5,930,174 A | | 7/1999 | Chen et al. | ............. 365/185.29 |
| 6,046,935 A | * | 4/2000 | Takeuchi et al. | ....... 365/185.03 |
| 6,134,140 A | | 10/2000 | Tanaka et al. | ......... 365/185.03 |
| 6,252,798 B1 | | 6/2001 | Satoh et al. | ........... 365/185.02 |

FOREIGN PATENT DOCUMENTS

| JP | 54-106139 | 8/1979 |
| JP | 9-124493 | 5/1997 |
| JP | 11-031392 | 2/1999 |
| JP | 11-066871 | 3/1999 |
| JP | 11-176175 | 7/1999 |

* cited by examiner

Primary Examiner—Son Mai
(74) Attorney, Agent, or Firm—Hogan & Hartson, LLP

(57) ABSTRACT

With a local self boost (LSB) technique, the distribution, of threshold voltages after data erase is set toward a higher side and the distribution width is narrowed sufficiently within the range in which cell erase states can be read. To this end, block write is carried out on a memory cell array. Next, setting a predetermined voltage as a start voltage, soft erase is carried out for each block. After carrying out erase verification read, the threshold voltages of the cells are compared with a determination reference value. As a result of this comparison, if the threshold voltages of the cells do not reach the determination reference value, soft erase is repeated. In that case, the predetermined voltage during the soft erase is changed from the start voltage. When the threshold voltages of all the cells have reached the determination reference value, the soft erase is ended.

8 Claims, 38 Drawing Sheets

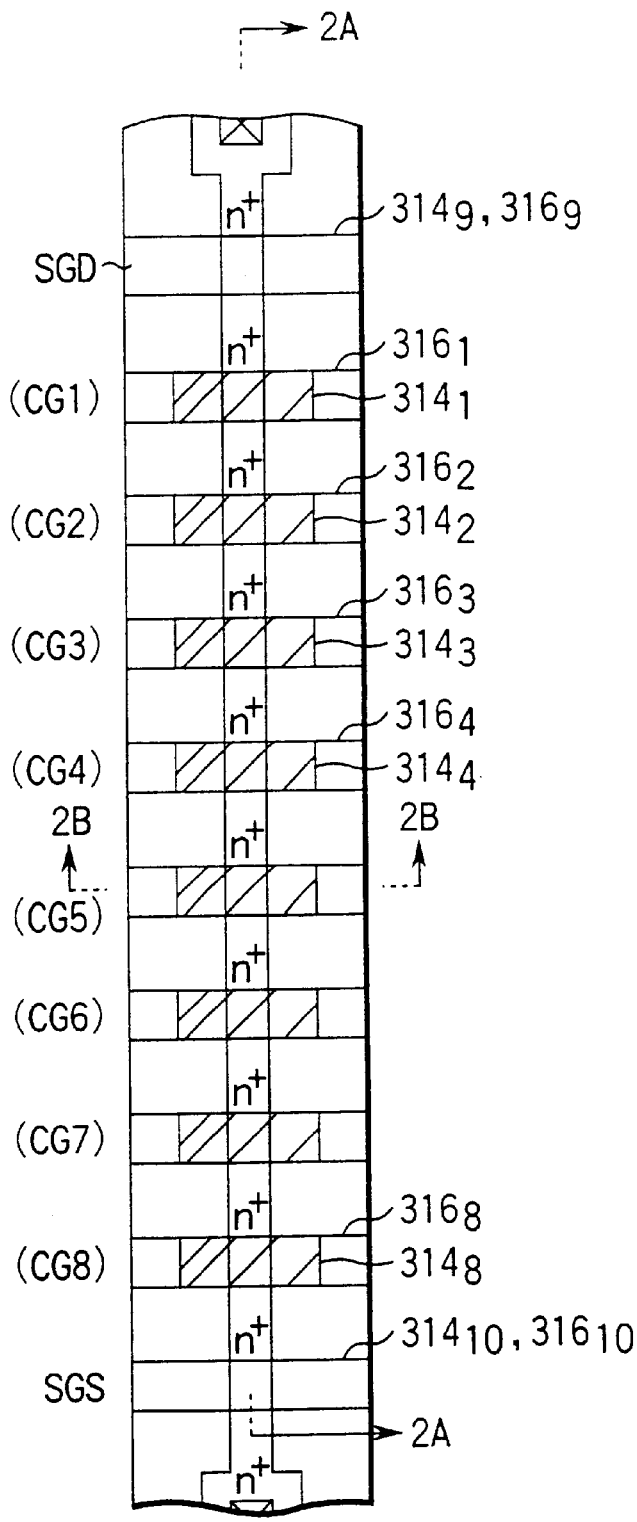
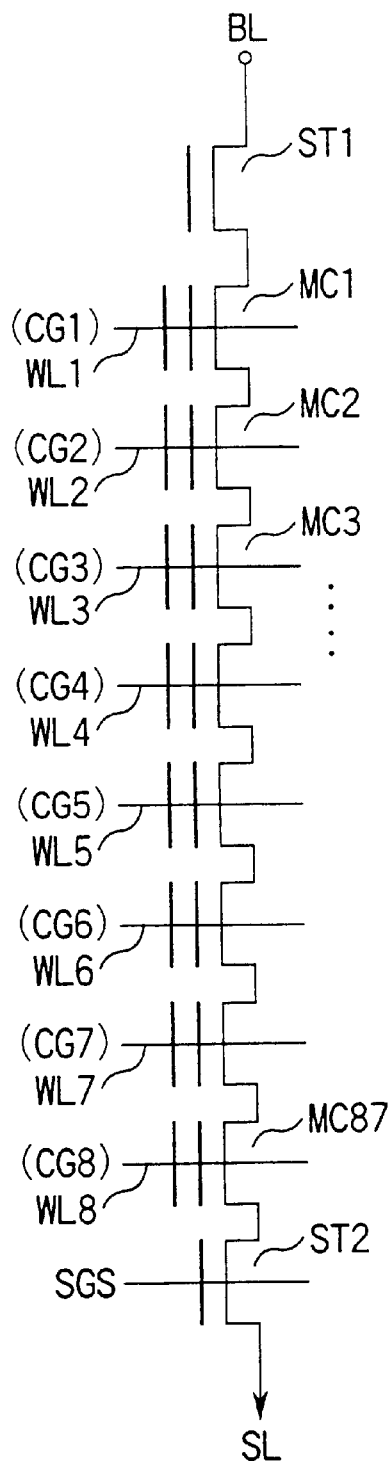
FIG. 1A
PRIOR ART
FIG. 1B
PRIOR ART

WRITE CHARACTERISTIC

ERASE CHARACTERISTIC

RELATIONSHIP BETWEEN ADJACENT CELL THRESHOLDS AND VPASS

VPWELL PULSE DURING SOFT ERASE (EXAMPLE)

EACH POTENTIAL DURING SOFT ERASE (EXAMPLE)

VPP PULSE DURING SOFT WRITE AFTER SOFT ERASE (EXAMPLE)

EACH POTENTIAL DURING SOFT
WRITE AFTER SOFT ERASE (EXAMPLE)

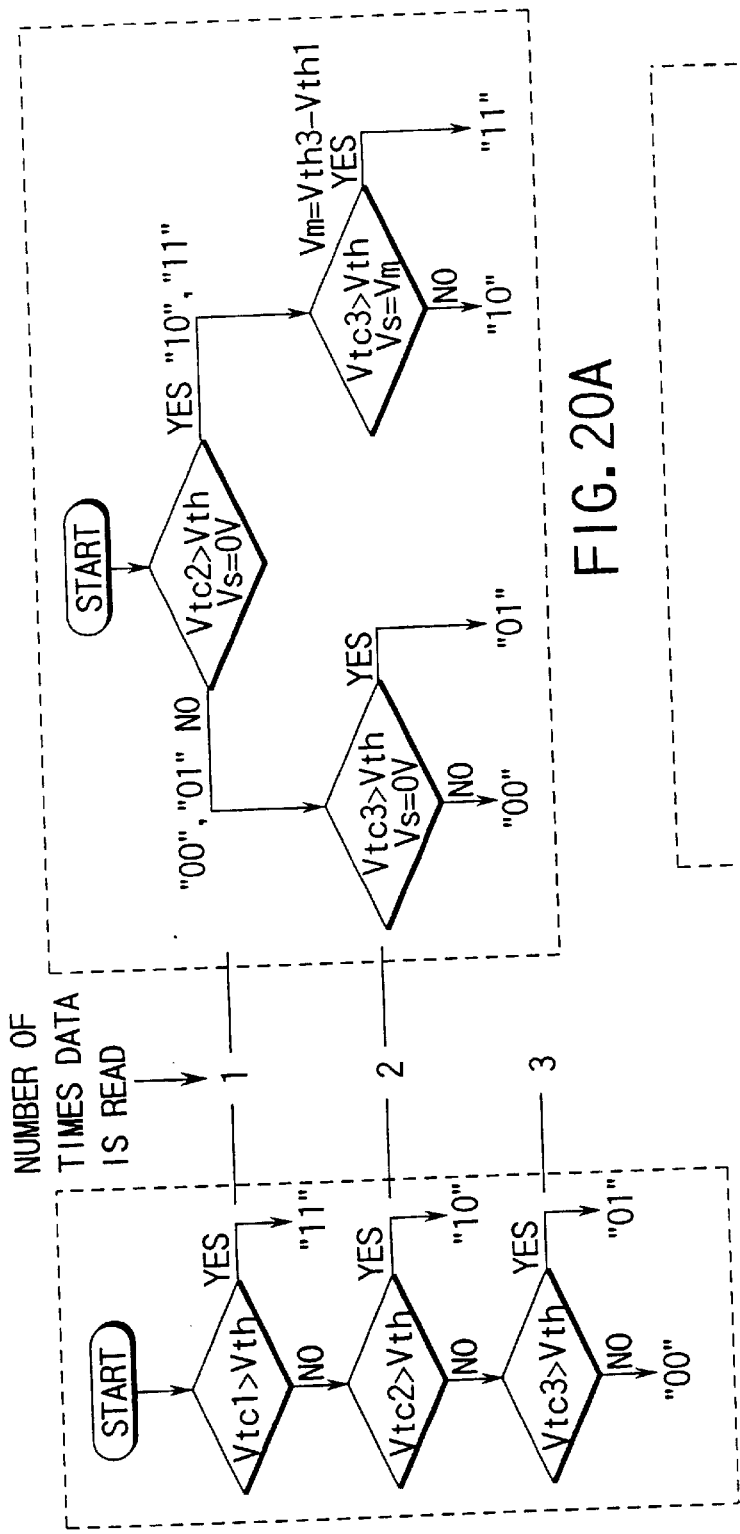
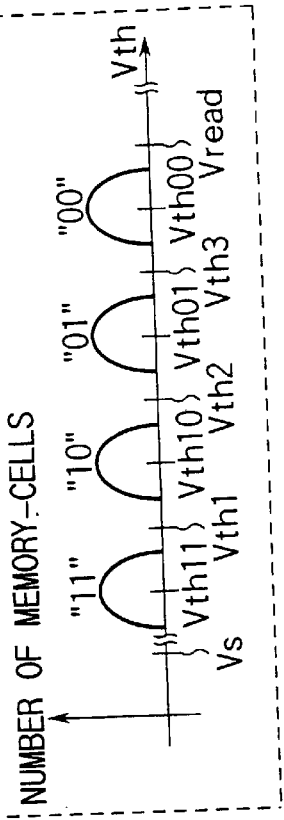
FIG. 20A
FIG. 20B
FIG. 20C

NONVOLATILE SEMICONDUCTOR MEMORY DEVICE

This is a continuation divisional of application Ser. No. 09/500,315 filed Feb. 8, 2000, now U.S. Pat. No. 6,314,026 which application is hereby incorporated by reference in its entirety.

BACKGROUND OF THE INVENTION

The present invention relates to a nonvolatile semiconductor memory and particularly relates to an electrically rewritable nonvolatile semiconductor memory (EEPROM, flash memory) employing memory cells each having a stack of a floating gate (charge accumulation layer) and a control gate.

The present invention also relates to a nonvolatile semiconductor memory utilizing a multilevel storage technique.

There is conventionally known, as a nonvolatile semiconductor memory which is electrically rewritable and capable of realizing high integration, an NAND type EEPROM having a plurality of memory cells mutually connected in series.

FIG. 1A is a plan view showing one NAND cell formed on a memory cell array on an EEPROM chip and FIG. 1B is an equivalent circuit thereof. FIG. 2A is a cross-sectional view taken along the line 2A—2A of FIG. 1A.

FIG. 2B is a cross-sectional view showing one example of a cross section taken along the line 2B—2B of FIG. 1A and particularly shows a case of employing an LOCOS element isolation film (312).

FIG. 3 is a cross-sectional view showing another example of a cross section taken along the line 2B—2B of FIG. 1A and particularly shows a case of employing a trench element isolation insulating film (322). It is noted that a portion surrounded by a dashed line corresponds to the portion shown in FIG. 2B.

As shown in FIGS. 1A, 2A, 2B and 3, a memory cell array consisting of a plurality of NAND cells are formed on a P type silicon substrate (or P type well which will be referred to as herein) 311 surrounded by the element isolation oxide film 312. One NAND cell includes, for example, eight memory cells MC (MC1 to MC8) mutually connected in series.

Each memory cell MC has a stacked gate structure. The stacked gate structure consists of an insulating film 313 formed on the P type well 311, a floating gate 314 ($314_1$ to $314_8$) formed on the insulating film 313, an insulating film 315 formed on the floating gate 314 and a control gate (CG) 316 ($316_1$ to $316_8$ or CG1 to CG8) formed on the insulating film 315.

An $N^+$ diffused layer (source/drain region) 319 of one memory cell MC is shared with its adjacent memory cell MC, whereby, for example, eight memory cells MC are connected to one another in series and one NAND cell is formed.

One end of a current path of the NAND cell is connected to a bit line BL (318) through a drain-side select gate transistor ST1 and the other end thereof is connected to a source line SL through a source-side select gate transistor ST2.

The gate electrode of each of the select gate transistors ST1 and ST2 has a structure in which the floating gate 314 ($314_9$, $314_{10}$) and the control gate 316 ($316_9$, $316_{10}$), for example, are electrically connected with each other at a portion which is not shown.

The P type well 311, on which memory cells MC, the select gate transistors ST1, ST2 and the like are formed, is covered with a CVD oxide film 317 or the like. The bit line (BL) 318 is arranged on the CVD oxide film 317. The bit line (BL) 318 extends in column direction.

The control gate CG (CG1 to CG8) of each memory cell MC is shared among NAND cells arranged in row direction and functions as a word line WL (WL1 to WL8). The row direction is a direction orthogonal to the column direction.

The gate electrode ($314_9$, $316_9$) of the drain-side select gate transistor ST1 is shared among drain-side select gate transistors ST1 arranged in row direction and functions as a drain-side select gate line SGD.

The gate electrode ($314_{10}$, $316_{10}$) of the source-side select gate transistor ST2 is shared among source-side gate transistors ST2 arranged in row direction and functions as a source-side select gate line SGS.

The data stored by one memory cell MC in the NAND cell is multilevel, i.e., binary or more.

In case of storing binary data, the range of the possible threshold voltages of the memory cells MC is divided into two types which are assigned data "1" and "0", respectively. In case of the NAND type memory, the threshold voltages after data erase are normally "negative" and defined as, for example, "1". The threshold voltages after data write are normally "positive" and defined as "0".

In case of storing multilevel data, e.g., four-level data, the range of the possible threshold voltages of the memory cells MC is divided into four types, which are assigned data "11", "10", "01" and "00", respectively. In case the NAND type memory, the threshold voltages after data erase are normally "negative" and defined as "11". The threshold voltages after data write are normally "positive" and defined as "10", "01" and "00" in the order in which threshold voltages are higher.

It is not always necessary that only the data after data erase have "negative" threshold voltages. It suffices that the range of the possible threshold voltages of memory cells MC is divided into a plurality of types. It also suffices that the polarity of a threshold voltage, i.e., whether the threshold voltage is "negative" or "positive", is opposite to that described above.

In the data write operation technique of such an NAND type EEPROM, a local self boost technique (LSB technique) is recently regarded as a favorable one. The operation of the NAND type EEPROM adopting the LSB technique will be described hereinafter with reference to FIG. 1B.

(Data Erase Operation)

Data erase is roughly divided into two ways, i.e., batch erase and block erase.

In batch erase, the data of all the memory cells MC existing on the memory cell array are simultaneously erased. In this case, the potentials of all the control gates CG (word lines WL) on the memory cell array are set at 0V, the bit lines BL and the source lines SL are turned into a floating state, respectively and then a high voltage (e.g., 20V) is applied to the P type well 311. By doing so, electrons are discharged into the P type well 311 from the floating gates 314 of all the memory cells MC existing in the memory cell array and the threshold voltages of all the memory cells MC are shifted in negative direction.

In block erase, the data of the memory cells MC existing on the memory cell array are erased in units of blocks. Normally, one block consists of a group of NAND cells which are arranged in row direction and which share control gates CG (word lines WL). In this case, the potentials of the control gates CG (word lines WL) in a select block are set at 0V, a high voltage (e.g., 20V) is applied to control gates CG (word lines WL) in non-select blocks, the bit lines BL and the source lines SL are turned into a floating state, respectively and a high voltage (e.g., 20V) is applied to the P type well 311. By doing so, electrons are discharged from the floating gates 314 of the memory cells MC existing in the select block into the P type wall 31 and the threshold voltages of the memory cells MC in the select block are shifted in negative direction.

The above-stated data erase operation is executed prior to the data write operation to be conducted to the entire memory cell array or the data write operation to be conducted in block units.

(Data Write Operation (LSB technique))

Before starting the description of the data write operation, it is assumed that a select control gate CG in the select block is "CG2 (word line WL2)".

In the data write operation, a predetermined positive voltage Vsgd is applied to a select gate line SGD in a select block and 0V is applied to a select gate line SGS. Also, 0V is applied to all word lines WL and all select gate lines SGD and SGS in non-select blocks.

In this state, if data write is carried out by means of the LSB technique, the select word line WL2 is applied with a high voltage Vpp for data write, non-select word lines WL1 and WL3 adjacent to the select word line WL2 are applied with 0V, respectively, and non-select word lines WL4 to WL8 other than the non-select word lines WL1 and WL3 are applied with a voltage Vpass, respectively. The voltage Vpass is almost in the middle of 0V and the data write high voltage Vpp. Although 0V is applied to the non-select word lines WL1 and WL3 in the above example, a positive voltage lower than Vpass may be applied thereto.

Data write is normally carried out sequentially from the memory cell MC8 farthest from the bit line BL toward the memory cell MC1 closest thereto.

(Data "0" write)

When data "0" (or data having a "positive" threshold voltage in this example) is written, 0V (write select voltage) is applied to a select bit line BL.

The data of the memory cell MC1 closer to the bit line BL than the select memory cell MC2 is always in an erase state (which data has a "negative" threshold voltage in this example). Due to this, even if the voltage of the word line WL1 is set at 0V, the voltage of 0V applied to the bit line BL is transferred to the channel of the select memory cell MC2 and to an N$^+$ type diffused layer 319 thereof. As a result, in the select memory cell MC2, electrons move from the P type well 311 to the floating gate 314 and the threshold voltage of the select memory cell MC2 is shifted in the positive direction.

(Data "1" write)

When data "1" (or data having a "negative" threshold voltage in this example) is written, a voltage (write non-select voltage) equal to or higher than the voltage Vsgd is applied to the select bit line BL.

Here, the select gate SGD is applied with the voltage Vsgd. Due to this, the select gate transistor ST1 becomes non-conductive and the channels and N$^+$ type diffused layers 319 of the memory cells MC1 to MC8 are turned into a "floating state", respectively. In this state, if the write high voltage Vpp and the voltage Vpass are applied to the select word line WL2 and to the non-select word lines WL4 to WL8 other than the non-select word lines WL1 and WL3, respectively, then the channel potential of the select memory cell MC2 and those of the non-select memory cells MC4 to MC8 as well as the potentials of the N$^+$ type diffused layers 319 are increased.

The memory cells MC1 and MC3 adjacent to the select memory cell MC2 are cut off by the back-bias effect caused by the increased channel potentials. At this moment, the high voltage Vpp is applied to the control gate CG2 (word line WL2) of the select memory cell MC2. Thus, the channel potential of the select memory cell MC2 is increased further. The channel potential of the select memory cell MC2 rises to about 8 to 9V if the high voltage Vpp is, for example, 18V and a channel boost ratio is 0.5. Namely, the potential difference between the word line WL2 and the channel of the select memory cell MC2 is decreased to a value sufficient to provide a write inhibit voltage. As a result, in the select memory cell MC2, there is little movement of electrons from the P type well 311 to the floating gate 314 and the threshold voltage of the select memory cell MC2 is kept "negative".

(Data read operation)

In data read operation, a voltage (e.g., 3.5V) for continuity is applied to the select gate lines SGD and SGS in the select block and to the control gates CG (word lines WL) of the non-select memory cells. By doing so, the select gate transistor ST1 and ST2 in the select block and the non-select memory cells are turned "on". In this state, a read voltage of 0V or the like is applied to the control gate CG (word line WL) of the select memory cell in the select block. At this moment, the potential of the bit line BL is changed according to a current flowing thereto through the select memory cell. Whether data is data "1" or "0" is determined by detecting the changed bit line potential. In case of storing four-level data, it is determined whether the data is data "11", "10", "01" or "00".

As described above, in data write operation employing the LSB technique, a voltage not less than 0V and less than Vpass is applied to non-select word lines adjacent to a select word line which is applied with a high voltage, and the voltage Vpass is applied to the remaining non-select word lines.

With such an LSB technique, it is possible to increase the channel potential of the select memory cell, thus occurrences for writing errors at the time of particularly writing data "1" can be suppressed. Besides, since the variation of the threshold voltages of cells becomes quite small, the LSB technique is regarded as a favorable one particularly for writing data to a multilevel memory.

Nevertheless, problems are rising in the LSB technique as cells are made smaller in size and higher integration progresses.

The greatest feature of the LSB technique is that non-select memory cells adjacent to a select memory cell must be turned into a cutoff state irrespectively of the data stored in these non-select memory cells. The non-select memory cells adjacent to the select memory cell have arbitrary threshold voltages. Owing to this, there are cases where one of the adjacent non-select memory cells has a "positive" threshold voltage or both of them have "negative" threshold voltages (erase state).

To cut off these adjacent non-select memory cells by means of the back-bias effect caused by the channel potential, it is necessary to sufficiently increase the voltage Vpass or to control threshold voltage distribution after data erase to thereby sufficiently increase the lowest threshold voltage.

As regard the former case, to suppress the voltage Vpass-induced variation of the threshold voltages of the non-select memory cells connected to the non-select word lines and to the selected bit line, the voltage Vpass cannot be set so high. To the contrary, the lower the voltage Vpass, the more effectively the threshold voltage variation of the non-select memory cells can be suppressed and writing error can be prevented. Considering this, therefore, it is essential to set the threshold voltage distribution after data erase to be higher within the range in which the erase state can be read and to sufficiently narrow the distribution width.

It is necessary that the distribution width of the threshold voltage after erase is limited within the range of, for example, "−3V to −0.5V".

In these circumstances, the present applicant proposed a soft write technique. The soft write technique is to gradually write data on a memory cell after erasing data and to gradually move the threshold voltage of the memory cell in positive direction. To be specific, after data is erased, using a sufficiently low voltage as a start voltage, a write pulse is applied to word lines for each block while repeatedly stepping up the start voltage and conducting verification for each block. This makes it possible to greatly narrow the distribution width of the threshold voltages after data erase.

The write operation in an NAND type EEPROM by means of the LSB technique and a technique for controlling a threshold voltage distribution after data erase by means of the soft write technique are mentioned in detail in the following references.

Japanese Patent Application No. 10-104652 (priority application of Japanese Patent Application No. 9-124493) discloses a technique for turning a memory cell in an over-erase state to a normal state by soft write (as well as for making erase verification).

Japanese Patent Application No. 9-340971 discloses a technique for conducting soft write and erase verification after erasing data from an NAND cell, determining that there are predetermined number of memory cells which threshold voltages reach a predetermined threshold voltage to finish the soft write and turning memory cells in an over-erase state into a normal state.

Japanese Patent Application No, 9-224922 discloses a technique for conducting erase verification and over-erase detection read while erasing data from an NAND cell and conducting data erase and soft write so that the threshold voltages in an erase state can be set between a desired upper limit and a desired lower limit while monitoring the threshold voltages of the memory cells.

FIGS. 4A and 4B show the concept of the soft write technique.

AS indicated by "INITIAL" in solid line in FIG. 4B, the distribution of threshold voltages Vth after block erase or batch erase is very wide.

AS indicated by "Tb" which is gradient shown in FIG. 4A, however, a memory cell easy to erase is also easy to write.

Accordingly, by optimizing a voltage for block erase or batch erase, a start voltage for later soft write as well as a step-up width to conduct erase verification for each block, it is possible to narrow the distribution width of threshold voltages Vth after data erase as indicated by "SOFTW" in dotted line shown in FIG. 4B. The reason for conducting verification for each block is that it requires shorter time to complete verification than the time required for conducting verification for each bit. As a result, it is possible to narrow the distribution width of the threshold voltages Vth compared with that after block erase or batch erase. Naturally, however, the distribution width narrowed by the soft write is greatly influenced by the irregularity of the write characteristic of memory cells within the respective blocks. For that reason, there is fear that the following problems may occur to the controlling of the distribution width by means of the soft write technique as miniaturization progresses in the future.

FIG. 5A shows the dependency of write characteristic on gate length. It is noted that the dependency is obtained under constant conditions for a voltage applied during data write and for a write pulse width.

As shown in FIG. 5A, the dependency of write characteristic on gate length is particularly great when a gate length L is within the range of 0.25 $\mu$m or less. This is due to the influence of process irregularity, the short channel effect and the like. The great dependency of write characteristic on gate length means that write characteristic varies according to wafers, chips and blocks as the gate length L is shorter. It is not favorable to conduct verification at the time of soft write for each bit due to the limited erase time. Verification is, therefore, conducted on a block-by-block basis.

Thus, the irregularity of write characteristic has great influence on the distribution of threshold voltages after soft write. Consequently, writing errors and the variation of the threshold voltage increase particularly in a memory cell having a gate length L decreased to not more than 0.25 $\mu$m.

As can be seen from the above, the LSB technique is a promising technique among NAND cell write techniques, for preventing writing error or threshold voltage variation which may occur during write operation.

Nevertheless, as the miniaturization of memory cells progresses, it becomes more difficult to control the distribution of threshold voltages after data erase. Such controlling is quite significant for the LSB technique. If the distribution width of threshold voltages after data erase increases, writing errors or the like occur to the write operation after erase operation, resulting in the deterioration of reliability.

BRIEF SUMMARY OF THE INVENTION

The present invention has been made in view of the above circumstances. The main object of the present invention is to provide a nonvolatile semiconductor memory capable of preventing the increase of the distribution width of threshold voltages after data erase even if the miniaturization of memory cells progresses.

Another object of the present invention is to provide a nonvolatile semiconductor memory capable of shortening time required for reading multilevel data.

In order to attain the above main object, there is provided a nonvolatile semiconductor memory device comprising: a memory section including at least one variable threshold voltage type memory cell, the variable threshold voltage type memory cell storing data according to a threshold voltage of the memory cell; and a signal line which transmits a potential related to data stored by the variable threshold voltage type memory cell, wherein during a data stored in the memory cell is erased, a soft erase operation to gradually shifted the threshold voltage of the memory cell in one of a negative direction or a positive direction is carried out.

According to the above invention, the threshold voltage of the nonvolatile memory cell is gradually moved in the negative direction and then data is erased from the nonvolatile memory cell.

With such an erase technique, the dependency of, for example, the nonvolatile memory cell on gate length is small, compared with a conventional soft write technique for gradually moving the threshold voltage of a nonvolatile memory cell in positive direction and narrowing the distribution width of the threshold value after data erase.

Thus, even if the miniaturization of a memory cell progresses, it is possible to suppress the increase of the distribution width of the threshold value after data erase. As a result, it is possible to suppress the occurrence of writing errors and threshold voltage variation during data write operation carried out after the data erase. The suppression of the threshold voltage variation contributes to the stabilization of data particularly in a multilevel storage memory.

Moreover, since the increase of the distribution width of the threshold value after the data erase can be suppressed, it is possible to effectively utilize the local self boost technique for data write.

In order to attain the above another object, there is provided a nonvolatile semiconductor device comprising: a memory cell array including at least first and second memory cells each storing n-level data, where n is an integer not less than 4; a first wiring which applies a source potential to the first memory cell; and a second wiring which applies a source potential to the second memory cell, wherein when determining the n-level data, read of the n-level data is divided into not less than m and less than (n–1) data read operations, where m is a lowest integer satisfying $\log_2 n \leq m$; among the divided data read operations, a first data read operation is carried out while setting the source potentials of the first and second memory cells at a common potential; and a second data read operation following the first data read operation is carried out according to a result of the first data read operation while individually setting the source potentials of the first and second memory cells.

According to the above invention, the second data read following the first data read is carried out while individually setting the source potentials of the first and second memory cells in accordance with the result of the first data read. By individually setting the source potentials during the second data read, the threshold voltages of the memory cells are shifted according to the result of the first data read. As a result of shifting the threshold voltages, it is possible to apply a common potential to the gates of the memory cells in the second data read.

Needless to say, by individually setting the source potentials of the first and second memory cells according to the result of the previous data read as in the case of the above, it is possible to apply a common potential to the gates of the memory cells in data read following the second data read.

Hence, the number of times of data read can be reduced compared with the conventional one and time required for reading multilevel data can be shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a plan view of an NAND cell;

FIG. 1B is an equivalent circuit of the NAND cell;

FIG. 20A is a flowchart showing a four-level data reading method in the third embodiment according to the present invention;

FIG. 20B is a flowchart showing an ordinary four-level data reading method;

FIG. 20C is a graph showing the distribution of threshold voltages;

DETAILED DESCRIPTION OF THE INVENTION

As already described above, it is important to set the erase threshold voltage distribution to be put on a higher side within a range in which a cell erase state is readable and to sufficiently narrow the distribution width in case of the local self boost (LSB) technique.

Figure 2A:
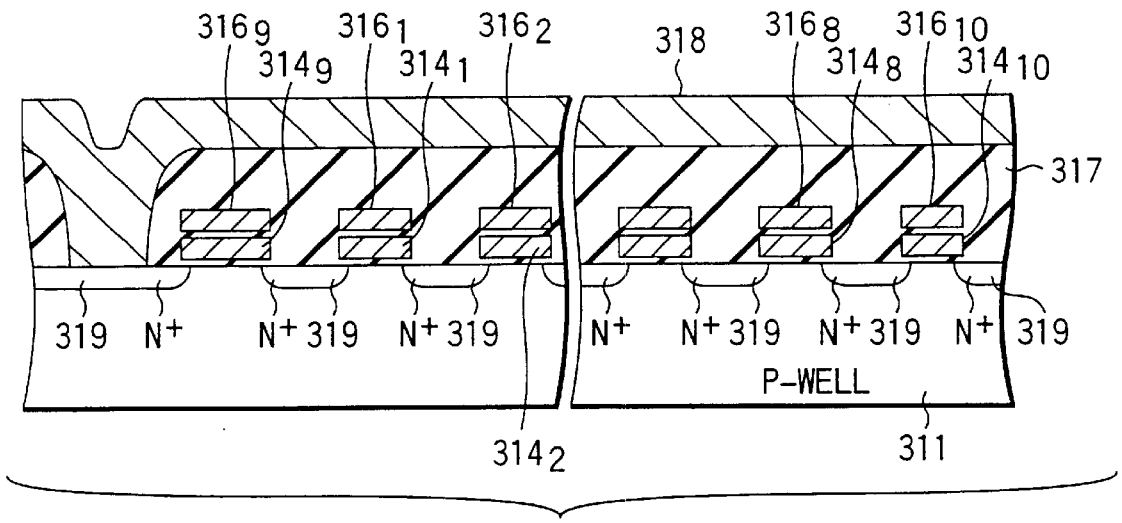
FIG. 2A is a cross-sectional view taken along the line 2A—2A of FIG. 1A.
Figure 2B:
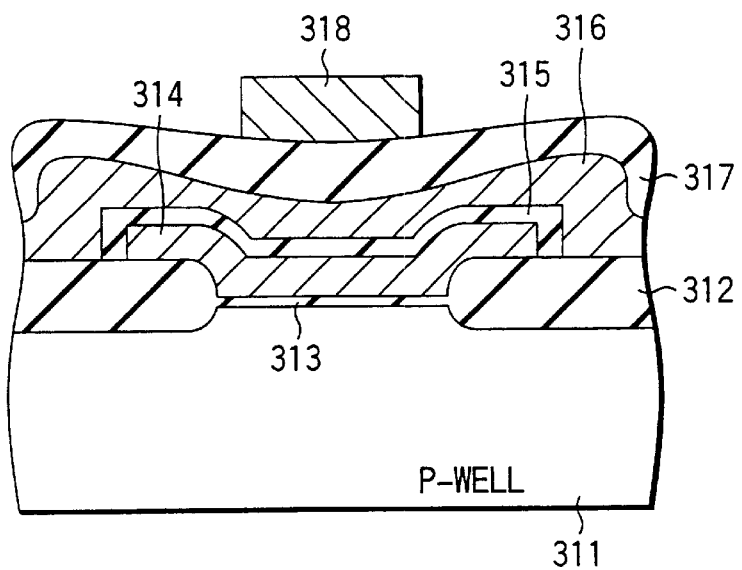
FIG. 2B is a cross-sectional view taken along the line 2B—2B of FIG. 1A.
Figure 3:
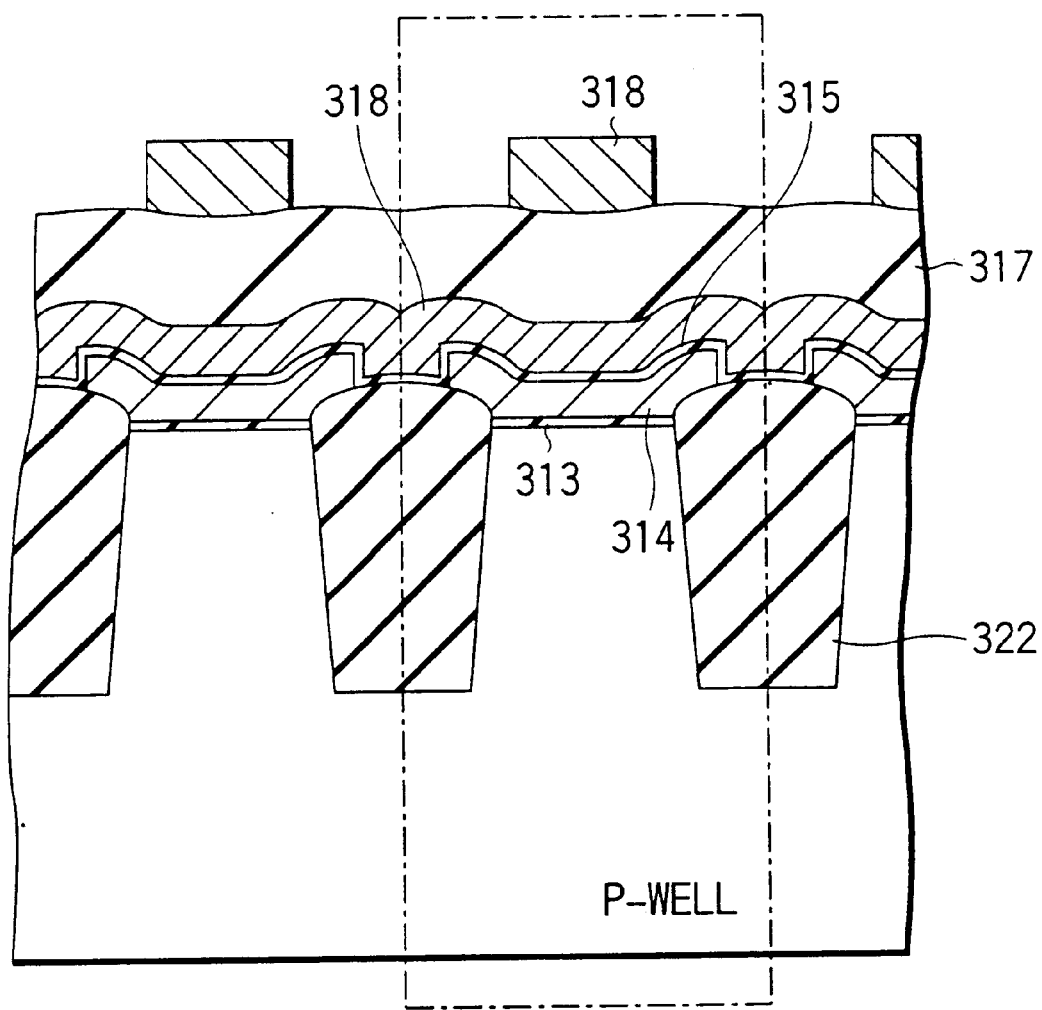
FIG. 3 is a cross-sectional view taken along the line 2B—2B of FIG. 1A and showing another example.
Figure 4A:
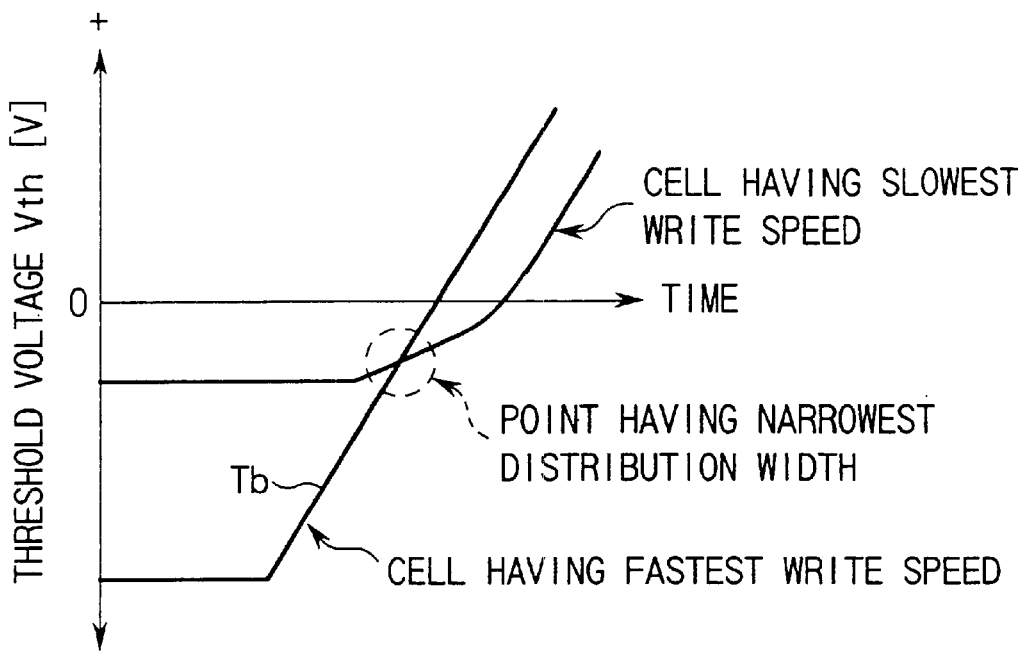
FIGS. 4A and 4B show the concept of a soft write technique, respectively.
Figure 4B:
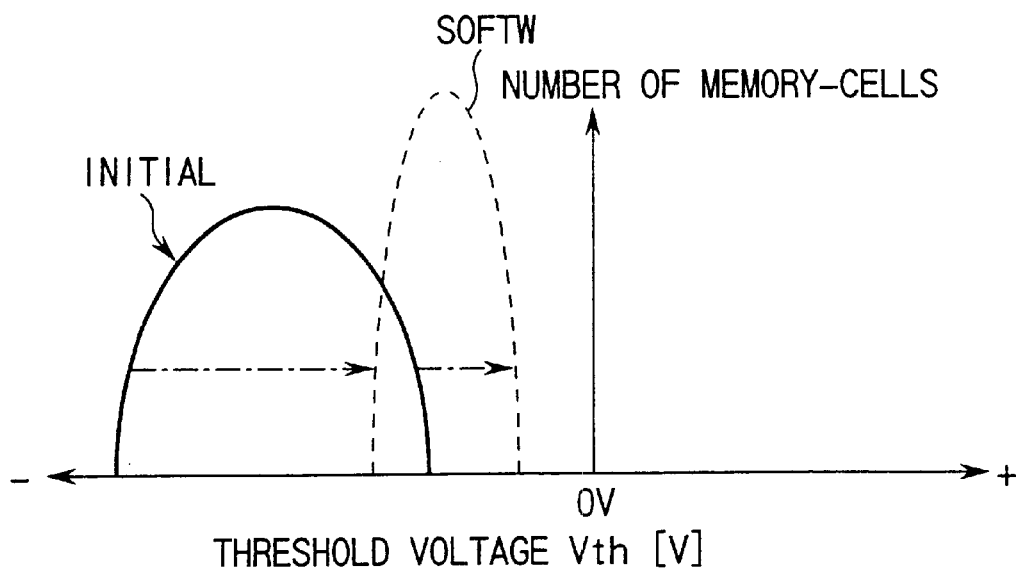
Figure 5A:
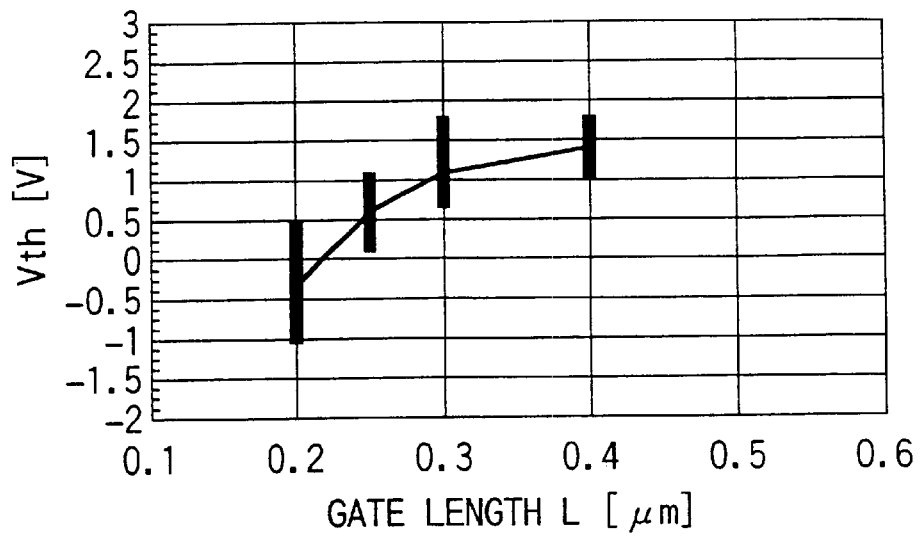
FIG. 5A is a graph showing the dependency of write characteristic on gate length.
Figure 5B:
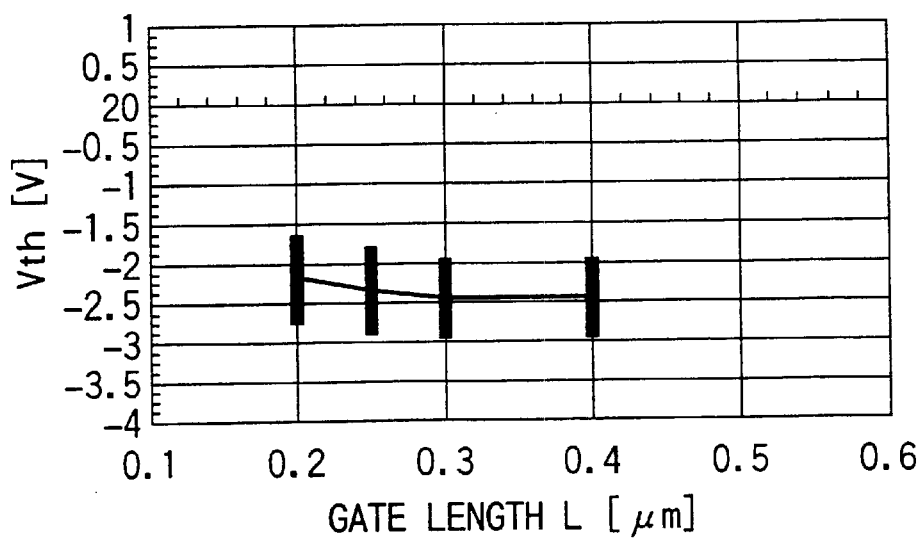
FIG. 5B is a graph showing the dependency of erase characteristic on gate length.

FIG. 5B is a graph showing the dependency of erase characteristic on gate length. The dependency on the gate length shown therein is obtained under constant conditions for a voltage applied and an erase pulse width during data erase.

As shown in FIG. 5B, the dependency of erase characteristic on gate length is far smaller than that of write characteristic on gate length shown in FIG. 5A. Owing to this, even if the gate length is reduced, the variation of threshold voltages due to erase operation can be made small. The present invention utilizes the characteristics.

(First Embodiment)

Figure 6:
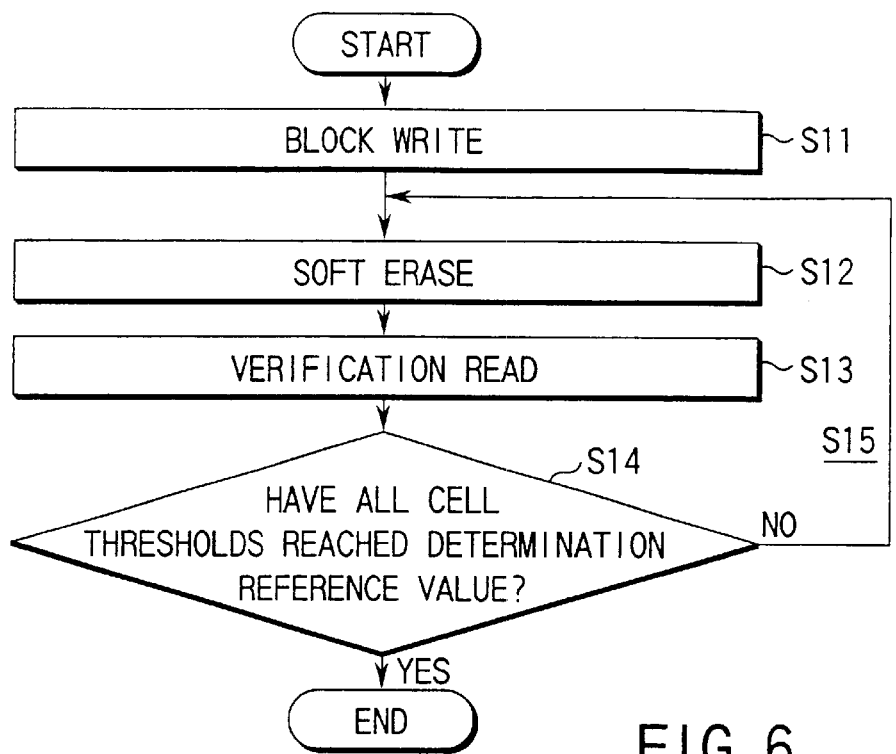
FIG. 6 is a flowchart showing data erase operation in the first embodiment according to the present invention.

FIG. 6 is a flowchart showing the data erase operation of an NAND type EEPROM in the first embodiment according to the present invention.

In this embodiment, as shown in FIG. 6, when the distribution of threshold voltages of memory cells to be turned into an erase state is controlled, batch write operation is carried out first to each block in a memory cell array to be erased as shown in a step S11(prewrite operation).

Thereafter, as shown in a step 12, using a predetermined voltage as a start voltage, soft erase is carried out to each block.

Next, as shown in a step S13, erase verification read is carried out. In a step S14, the threshold voltages of cells are compared with a determination reference value.

As a result of the comparison in the step S14, if the threshold voltages of the cells do not reach the determination reference value ("NO" in the step S14), soft erase is repeated (in a loop S15). The predetermined voltage in the repeated soft erase is changed to a value different from the start voltage.

As a result of the comparison in the step S14, if all the threshold voltages of the cells reach the determination reference value ("YES" in the step S14), soft write is finished here.

The control including the operation for converging the threshold values of the cells after data erase is referred to as a soft erase technique. This soft erase technique indicates particularly useful data erase working with the LSB technique to erase verification in the units of blocks. It originally differs from conventional erase operation.

Figure 7:
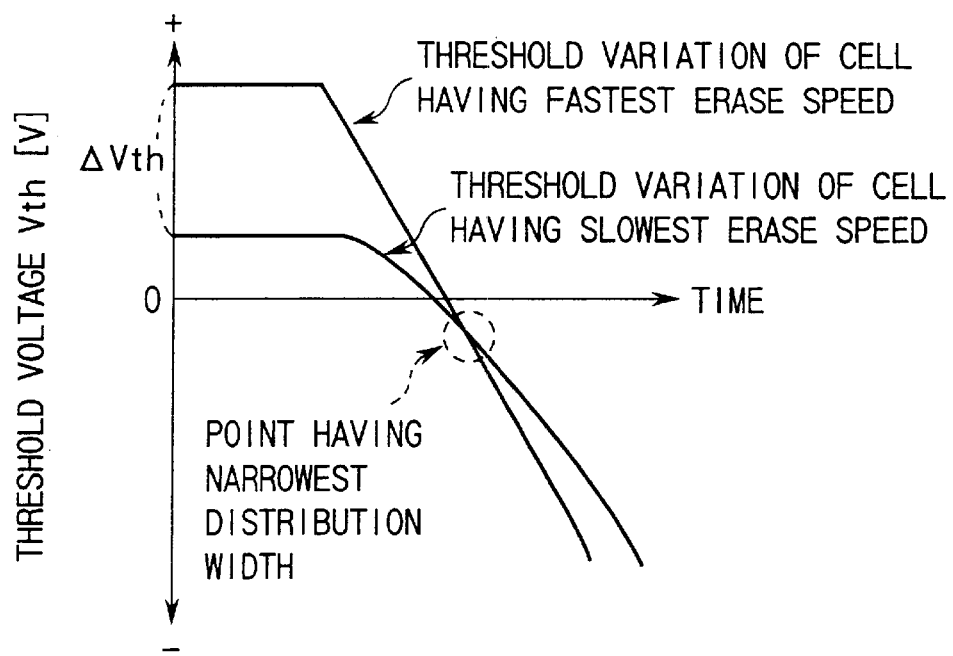
FIG. 7 shows the concept of a soft write technique according to the present invention.

FIG. 7 shows the concept of the soft erase technique.

As shown therein, there is a difference ΔVth between the threshold voltage of a cell in which data is erased at the fastest speed and that of a cell in which data is erased at the lowest speed at the time of data write in the step S11 of FIG. 6. The difference ΔVth is regarded as the distribution width of threshold voltages and controlled to be closer to a point at which the distribution width becomes the narrowest as a result of soft erase, as will be described in detail below.

Figure 8:
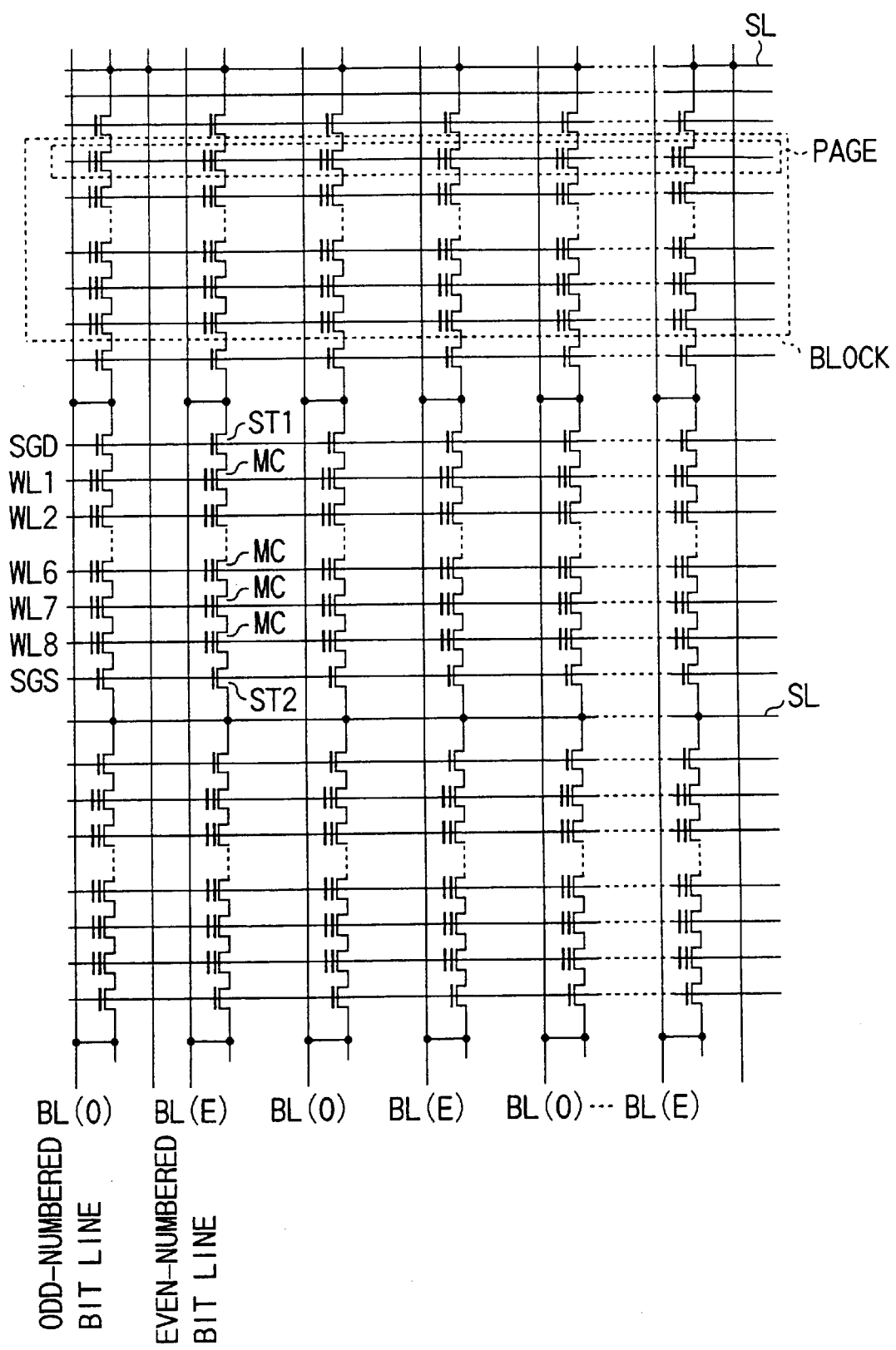
FIG. 8 is a circuit diagram of a memory cell array.

FIG. 8 is a circuit diagram showing an example of the configuration of a memory cell array on which NAND cells serving as memory cell units (memory cell sections) are arranged in a matrix. While FIG. 8 shows a case where eight memory cells MC are connected in series to thereby construct an NAND cell, the NAND cell may be constructed by connecting in series 4, 16 or 32 memory cells. The number of memory cells in an NAND cell should not be limited to any specific number.

Control gates (word lines WL (WL1 to WL8)) of memory Cells MC, drain-side select gate lines SGD and source-side select gate lines SGS are arranged in row direction. Normally, a group of the memory cells MC connected to one control gate is referred to as "one page" and a group of pages put between a set of a drain-side select gate line SGD and a source-side select gate line SGS is referred to as "one NAND block" or "one block".

"One page" consists of, for example, 256-byte (256×8) memory cells MC. Data are written to the memory cells MC included in "one block" almost simultaneously.

"One block" consists of, for example, 2048-byte (2048×8) memory cells MC. Data are erased from the memory cells MC included in "one page" almost simultaneously.

FIGS. 9A to 9D are explanatory views sequentially showing the soft erase technique of the present invention conducted for the NAND cells shown in FIG. 8 and particularly show the variation of the threshold voltage distributions.

Figure 9A:
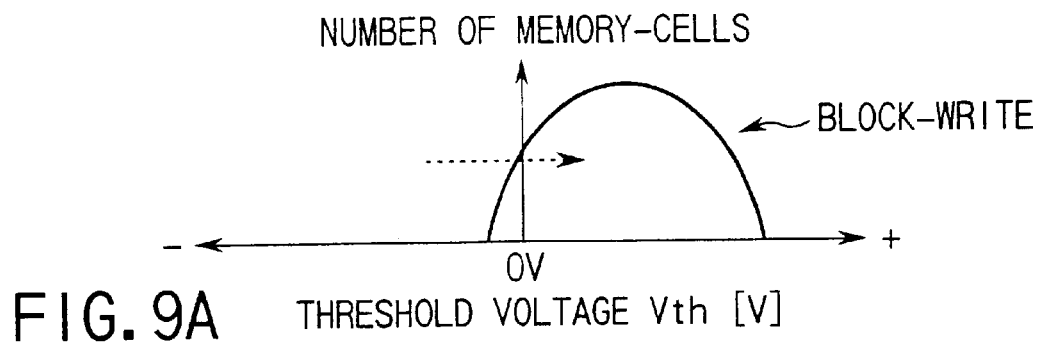
FIGS. 9A, 9B, 9C and 9D are graphs showing threshold voltage distributions, respectively.

As shown in FIG. 9A, a predetermined high voltage Vpp, e.g. of 20V is applied to word lines WL1 to WL8 connected to all of the bits in a block in which data are erased (see FIG. 8), and data write is carried out (which operation corresponds to the step S11 shown in FIG. 6). By doing so, the threshold voltages of all of the memory cells MC in the erase target block are moved in positive direction. At the time of carrying out this data write, the voltages of the respective bit lines BL are 0V, that of the bit-side select gate line SGD is a predetermined positive voltage Vsgd, that of a source line SL is 0V or Vs which is a positive voltage, and the source-side select gate line SGS is 0V.

The write voltage Vpp should not be limited to 20V and may be selected so that all of the bits in the block may have sufficiently high threshold voltages (e.g., preferably about 1.5V, which voltages largely depend on erase speed, the neutral threshold voltage of memory cells and the like and need to be optimized).

Figure 9B:
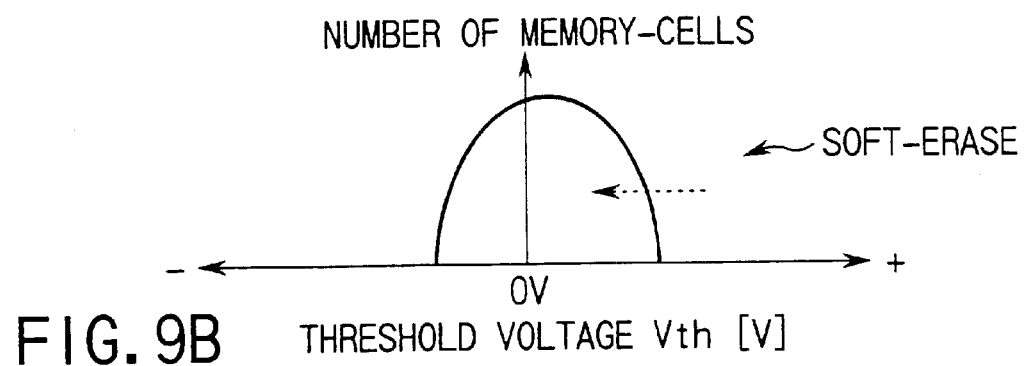

Next, as shown in FIG. 9B, 0V or a sufficiently low voltage, positive or negative, is applied to all of the word lines WL1 to WL8 in the data erase target block, a start voltage of Vpp, e.g., 12V, is applied to a well and data erase is carried out (which operation corresponds to the step S12 shown in FIG. 6). At this moment, word lines in blocks in which data erase is not carried out are applied with a voltage, for example, the same voltage as that of the well, to prevent data erase.

Next, an erase state is read for each block (which operation corresponds to the step S13 shown in FIG. 6).

To do so, all the word lines WL1 to WL8 in the block are applied with, for example, 0V and a positive voltage is applied from the source line SL to the channels of the memory cells in this block.

Figure 9C:
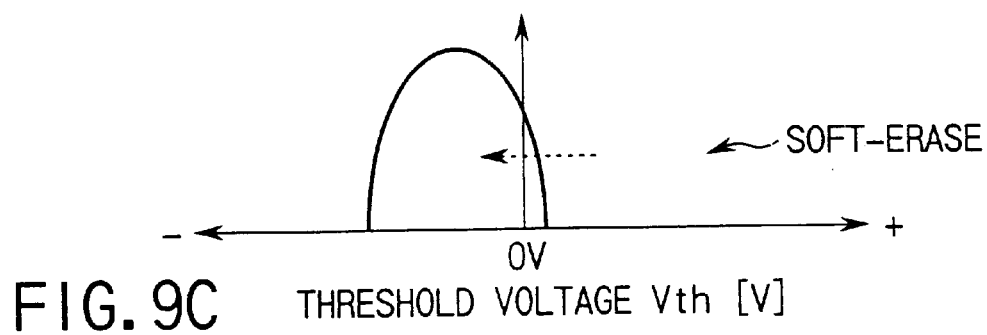

At this time, if the memory cell having the highest threshold voltage is still in a write state among the memory cells MC in the block, the potentials of the bit lines do not increase sufficiently. Consequently, it is judged that soft erase has not been carried out enough (which judgment corresponds to the step S14 shown in FIG. 6). If so judged, as shown in FIG. 9C, soft erase is carried out once again (which operation corresponds to the loop S15 shown in FIG. 6). The erase voltage of the second erase differs from the above-stated start voltage and is set at, for example, 12.2V higher than the start voltage by 0.2V (with a step voltage of 0.2V).

The above start voltage Vpp or step voltage is selected so that the threshold voltage distribution width after soft erase becomes the narrowest and that soft erase time is the shortest and, therefore, should not be limited to the above values. Specifically, they are set at optimum values in light of the neutral threshold value of memory cells, a coupling ratio which determines write/erase characteristics and the like.

Thereafter, memory cell verification is read for each block as in the case of the above. If the memory cell having the highest threshold voltage in the block does not reach a certain determination reference value, soft erase is further carried out with the voltage Vpp stepped up by, for example, 0.2V repeatedly (which operation corresponds to the loop S15 shown in FIG. 6).

Figure 9D:
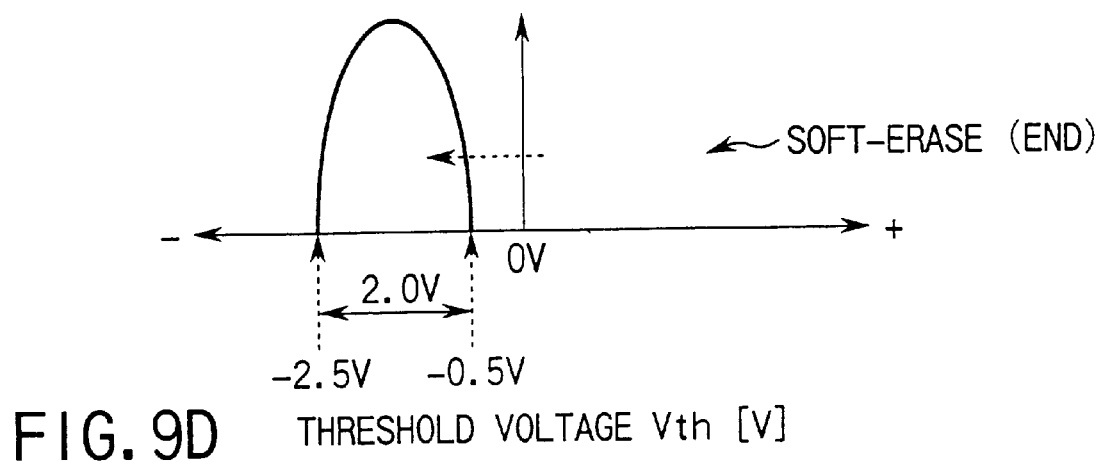

Here, assuming that the threshold voltage by which the end of soft erase is determined is, for example, −0.5V, the bit lines BL are applied with a potential of 0.5V from the source line SL in the step S13 shown in FIG. 6. Following this, by monitoring whether the potentials of the bit lines BL are not less than 0.5V or not more than 0.5V, verification operation after data erase may be carried out. Namely, if the memory cell having the highest threshold voltage reaches a desired threshold voltage (determination reference voltage), the potentials of the bit lines sufficiently rise to not less than 0.5V and the end of soft erase is determined (FIG. 9D).

In the above-stated first embodiment, the desired distribution width of threshold voltages after data erase is such that the highest threshold voltage is above −0.5V and the lowest threshold voltage is about −2.5V. The narrower the distribution width, the better.

The reason for setting the desired distribution width between −0.5 to −2.5V lies in the fact that the threshold voltage distribution width is preferably 2V or less. Thus, the distribution width should not be limited to the range between −0.5V and −2.5V.

In addition, in the first embodiment, an example of controlling of erase verification read operation is described. The control technique should not be limited to that described in the first embodiment. Any technique which allows reading negative threshold voltages for each block may be employed.

Furthermore, in the first embodiment, it is detected that the higher threshold voltage of those after erase is not more than a desired upper limit. It is also possible to detect that the lower threshold voltage of the threshold voltages after erase is not less than a desired lower limit.

Conventionally, soft write controls the distribution width of threshold voltages after erase so as to narrow it. The soft write is, like ordinary write operation, an operation for injecting electrons into a floating gate. Due to this, as shown in FIG. 5A, the soft write largely depends on the gate length. As a result, if the gate length is shortened particularly to 0.25 μm or less, the distribution width of threshold voltages after soft write in the block increases, making it difficult to control threshold voltages so as to be suitable for miniaturization.

In the first embodiment, by contrast, soft erase controls the distribution width of threshold voltages after erase so as to narrow it. The soft erase is, like ordinary erase operation, an operation for taking out electrons from the floating gate and has, therefore, small dependency on the gate length as shown in FIG. 5B. Do to this, compared with the conventional soft write, the soft erase technique in the first embodiment is quite effective for miniaturization in the future. The soft erase can suppress, in particular, the distribution width of threshold voltages to be sufficiently narrow even if the gate length is shortened to 0.25 μm or less.

Further, since it is possible to control threshold voltages after erase with high accuracy, the soft erase technique in the first embodiment is quite effective for multilevel data memories required to separate threshold voltage into a plurality of voltages.

By employing the soft erase technique stated above, it is possible to make the threshold voltage distribution after data erase very narrow and to realize memory cells having the far smaller variation of threshold voltages and far less chances of writing errors in the later write operation.

Data are written to the cells by using the soft erase right after narrowing the threshold voltage distribution after data erase. This data write operation is preferably carried out by means of the LSB technique described in "Prior Art" section.

Figure 10:
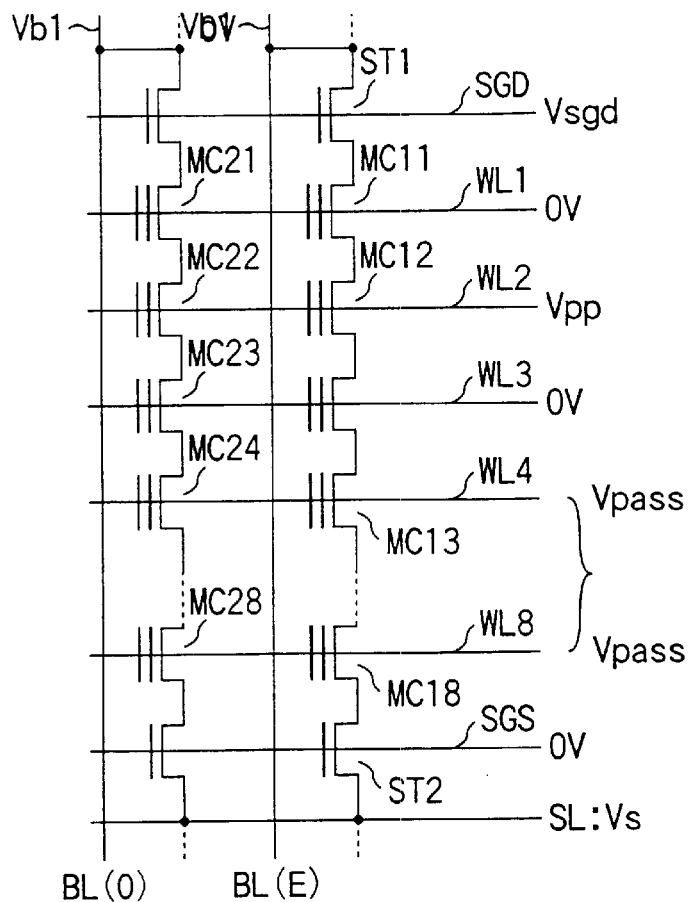
FIG. 10 is a circuit diagram showing two NAND cells.

FIG. 10 is a circuit diagram showing two NAND cell units picked out from FIG. 8. FIG. 10 also shows the relationship among the voltages of the respective terminal in regard of data write employing the LSB technique.

(Data Write Operation (LSB technique))

Before starting the description of the data write operation, it is assumed that a select word line WL (control gate) in a select block is "WL2" shown in FIG. 10.

In the data write, a predetermined positive voltage Vsgd is applied to a select gate line SGD in the select block and a voltage of 0V (Vss) is applied to the select gate line SGS. A voltage of 0V (Vss) is applied to all of the word lines WL in the non-select blocks and all of the select gate lines SGD and SGS in the non-select blocks.

In the data write by means of the LSB technique in this state, a high voltage Vpp for data write is applied to the select word line WL2, a voltage of 0V (Vss) is applied to the non-select word lines WL1 and WL3 adjacent to the select word line WL2, and a voltage Vpass is applied to non-select word lines WL4 to WL8 other than the non-select word lines WL1 and WL3. The voltage Vpass is almost in the middle of 0V (Vss) and the high voltage Vpp for data write. The high voltage Vpp may be, for example, 18V and the voltage Vpass may be, for example, 9V. Although 0V is applied to the non-select word lines WL1 and WL3, a positive voltage lower than the voltage Vpass may be applied thereto.

Normally, data write is sequentially carried out from memory cells MC18 and MC28 farthest from the bit lines BL toward memory cells MC11 or MC21 closest to the bit lines BL.

If data "0" (which is data having a "positive" threshold voltage in this example) is written to, for example, the memory cell MC12, 0V (write select voltage) is applied to the select bit line BL(E). The data of the memory cell MC11 existing at the bit line BL side with respect to the select memory cell MC12 is always in an erase state (which is data having a "negative" threshold voltage in this example). Owing to this, even if the voltage of the word line WL1 is set at 0V, the voltage of 0V applied to the bit line BL is transferred up to the channel of and the N+ type diffused layer of the select memory cell MC12. As a result, in the select memory cell MC12, electrons are moved from the P type well to the floating gate thereof and the threshold voltage of the select memory cell MC12 is shifted in positive direction.

If data "1" (which data has a "negative" threshold voltage) is written to the memory cell M22 simultaneously, a voltage Vb1 (write non-select voltage) is applied to the select bit line BL(O). The voltage Vb1 is normally set at a positive voltage equal to or higher than the voltage Vsgd.

At this moment, the voltage of the drain-side select gate line SGD is Vsgd, so that a select gate transistor ST1 becomes non-conductive and the channels of the memory cells MC21 to MC28 and N+ type diffused layers thereof are turned into "a floating state", respectively. Here, the high voltage Vpp is applied to the select word line WL2 and the voltage Vpass is applied to the non-select word lines WL4 to WL8. Due to this, the channel potential of the select memory cell MC22 and those of the non-select memory cells MC24 to MC28 as well as those of the N+ type diffused layers thereof increase.

Memory cells MC21 and MC23 adjacent to the select memory cell MC22 are cut off by means of the back-bias effect derived from the increased channel potentials. At this moment, if the high voltage Vpp has been applied to the control gate of the select memory cell MC22, then the control gate of the memory cell MC22 is coupled with the channel and N+ type diffused layer of the memory cell MC22 and the channel potential of the memory cell MC22 increases.

This channel potential rises to about 8 to 9V if the high voltage Vpp is 18V and a channel boost ratio is 0.5. That is, the difference between the potential of the word line WL2 and the channel potential of the select memory cell MC22 is decreased to a sufficient value to provide a write prohibit voltage. As a result, in the select memory cell MC22, there is little movement of electrons from the P type well to the floating gate and the threshold voltage of the select memory cell MC22 is kept "negative".

It is noted that the voltages of the word lines WL1 and WL3 adjacent to the select word line WL2 are not necessarily 0V and may be low enough to be capable of turning the memory cells in a cutoff state.

Furthermore, the voltage of the source-side word line WL3 adjacent to the select word line WL2 may be negative.

It is also possible to apply a low voltage enough to be capable of turning the memory cells into a cutoff state, only to the source-side word line WL3 out of the word lines WL1 and WL3 adjacent to the select word-line WL2 and to sequentially write data to arbitrary memory cells in the NAND cells.

As the above-stated voltage Vpass is higher, the variation of the threshold voltages of the memory cells connected to the word line applied with a high voltage (select word line) and to the bit lines applied with the write non-select voltage Vb1, i.e., the memory cells to which "1" data is written can be limited to be smaller.

However, since the variation of the threshold voltages of the memory cells connected to the word lines (non-select word lines) applied with the voltage Vpass and to the bit lines applied with the write select voltage 0V becomes greater, the voltage Vpass cannot be set so high.

Figure 11:
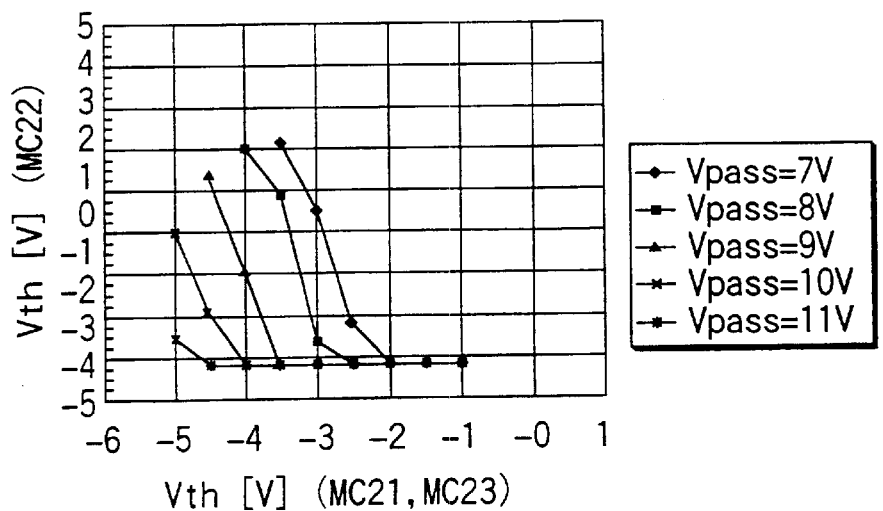
FIG. 11 is a graph showing the relationship between the threshold voltages of adjacent cells and a voltage Vpass.

FIG. 11 shows the relationship between the threshold voltages Vth of the memory cells MC21 and MC23 both in an erase state and the voltage Vpass, and the relationship between the threshold voltage Vth of the memory cell MC22 and the voltage Vpass. It is noted that the relationships shown in FIG. 11 indicate the variation of threshold voltages at the time of wiring data "1" to the memory cell M22 while 0V is being applied to the control gates of the memory cells MC21 and MC23, respectively.

As can be seen from FIG. 11, not to vary the threshold voltages when the voltage Vpass is, for example, 8V, it is necessary that the lowest threshold voltage among the possible threshold voltages Vth of the memory cells in the erase state is higher than about −2.5V.

It is also preferable that the highest threshold voltage among the possible threshold voltages of the memory cells in the erase state is lower than, for example, −0.5V. This is intended to ensure a margin at the time of data read. From this viewpoint, the allowable distribution width of threshold voltages is set at −2.5<Vth<−0.5V. In this way, it is necessary to set the distribution width of the threshold voltages to be smaller than about 2V.

Furthermore, as the distribution width of the threshold voltages of the memory cells in the erase state can be set narrower, the highest threshold voltage can be further made low such as −1V. In this way, if the highest threshold voltage can be made low further, a read margin extends and the reliability of a nonvolatile semiconductor memory enhances.

(Second Embodiment)

Figure 12:
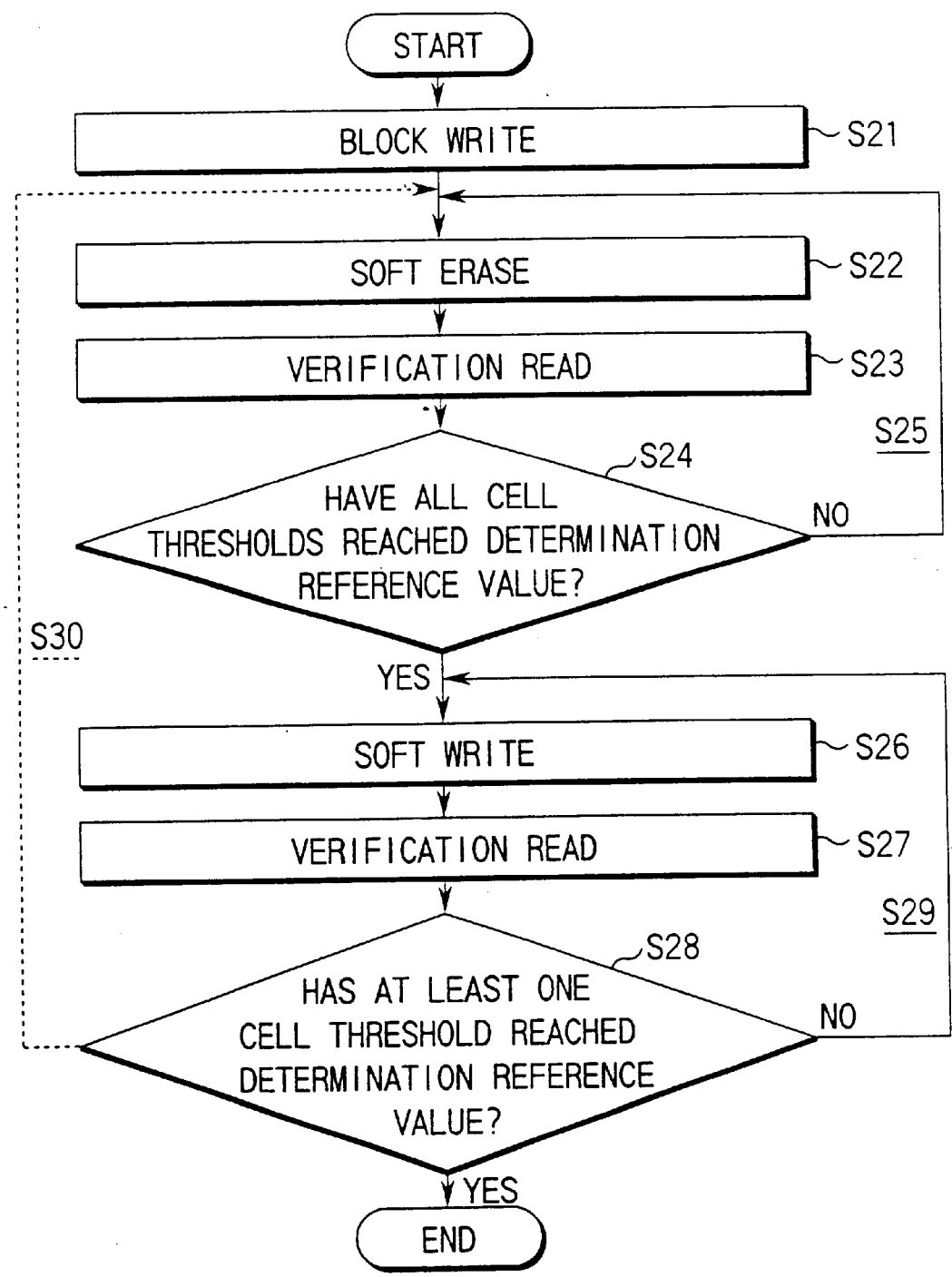
FIG. 12 is a flowchart showing data erase operation in the second embodiment according to the present invention.

FIG. 12 is a flowchart showing the data erase operation of an NAND type EEPROM in the second embodiment according to the present invention.

In this embodiment, to further narrow the distribution width of threshold voltages after data erase, soft write is carried out after soft erase. By doing so, it is possible to realize an NAND type nonvolatile semiconductor memory by means of the LSB technique with the less chances of writing errors.

Namely, as shown in FIG. 12, when the distribution of the threshold voltages of memory cells to be turned into an erase state is controlled, data write is first carried out for each block as shown in a step S21.

Thereafter, as shown in a step S22, using a predetermined voltage as a start voltage, soft erase is carried out for each block.

Next, verification read is executed in a step S23 and then the threshold voltages of the cells are compared with a determination reference voltage as shown in a step S24.

As a result of the comparison in the step S24, if the threshold voltages of the cells do not reach the determination reference value ("NO" in the step S24), soft erase is repeated (in a loop S25). The predetermined voltage of the soft erase is changed from the start voltage. When the threshold voltages of all the cells reach the determination reference value (or, in this embodiment, when the higher erase threshold voltage decreases and reaches the determination reference value), the soft erase is finished.

Thereafter, as shown in steps S26 to S29, the soft write and the verification read are repeated and the lower erase threshold voltage are made higher and higher. That is to say, after the verification read in the step S27, the higher threshold voltage of the cell is compared with the determination reference value as shown in the step S28. Then, if the higher threshold voltage of the cell does not reach the determination reference value, soft write is repeated (in the loop S29). The predetermined voltage in the soft write is changed from the start voltage. When the threshold voltage of at least one cell reaches the determination reference value (or, in this embodiment, when the higher erase threshold voltage grows higher and reaches the determination reference value), the soft write operation is finished.

Figure 13A:
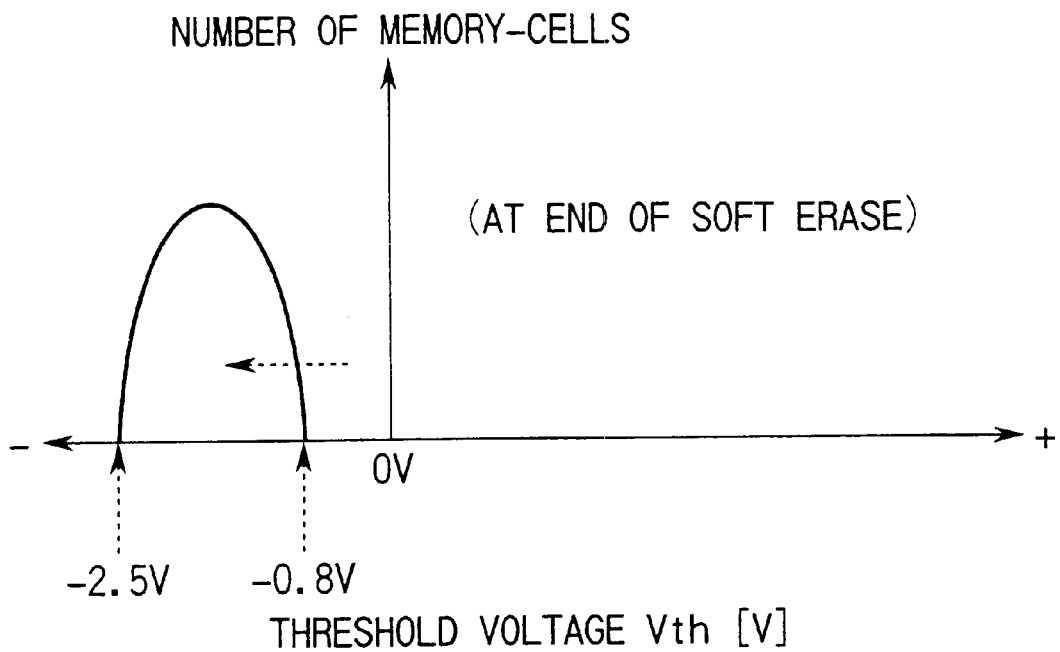
FIGS. 13A and 13B are graphs showing threshold voltage distributions, respectively.
Figure 13B:
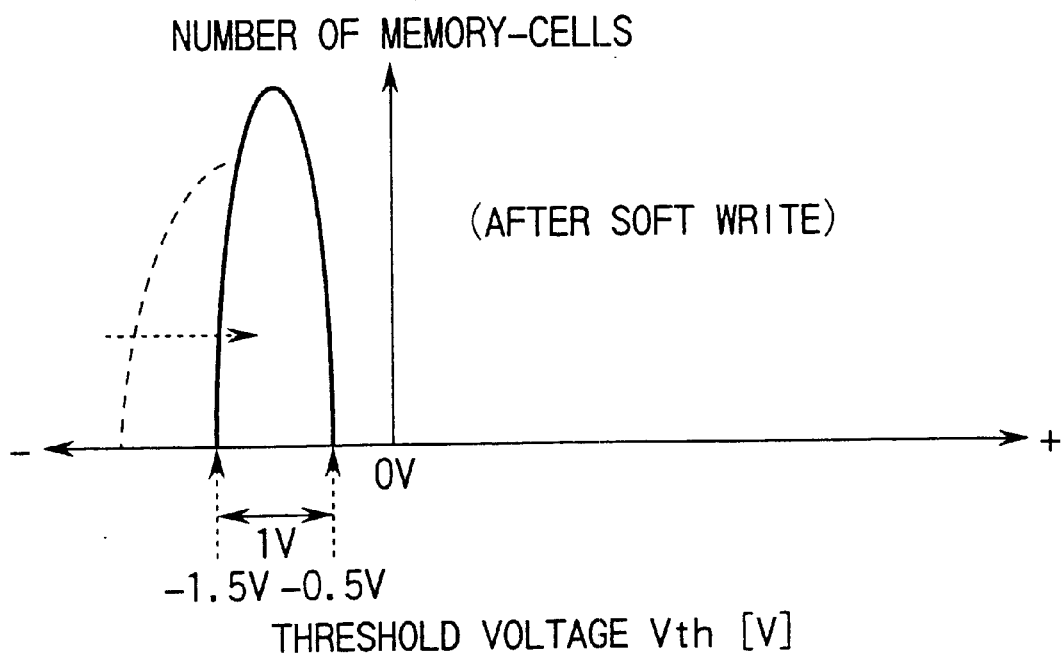

FIGS. 13A and 13B are graphs showing the distributions of erase threshold voltages for describing the above-stated operation example, respectively. First, a determination reference value for soft write is set at, for example, −0.8V. The soft erase is then carried out (in steps S22 to S25 in FIG. 12). When the highest threshold voltage of the memory cell in the erase threshold voltage distribution becomes lower than −0.8V, the soft erase is finished (FIG. 13A).

For the later soft write, a determination reference value is set at, for example, −0.5V. The soft write is then carried out (which operation corresponds to that in steps S26 to S29 in FIG. 12). When the highest threshold voltage of the cell in the erase threshold voltage distribution exceeds −0.5V, the soft write is finished (FIG. 13B).

In the above-stated verification reading method, a margin voltage of, for example, 0.3V is applied as a word line voltage. In this case, if a bit line potential of 0.8V is defined as a fixed determination reference value, it is possible to determine whether or not the threshold voltages of the memory cells are higher than −0.8V and not more than −0.5V. In other words, it is possible to make a determination of "FAILURE" when the threshold voltages are not more than −0.5V (see Japanese Patent Application No. 9-340971).

These series of the soft erase and soft write are carried out once or several times (in the loop S30 in dotted line shown in FIG. 12) while appropriately selecting the determination reference value, thereby making it possible to provide a narrower distribution of threshold voltages after data erase than that in the first embodiment. The very narrow distribution of threshold voltages after data erase thus provided allows data write at quite a low voltage Vpass (e.g., 7V). Consequently, it is possible to further prevent the occurrence of writing errors and to thereby realize highly reliable memory cells.

Figure 14A:
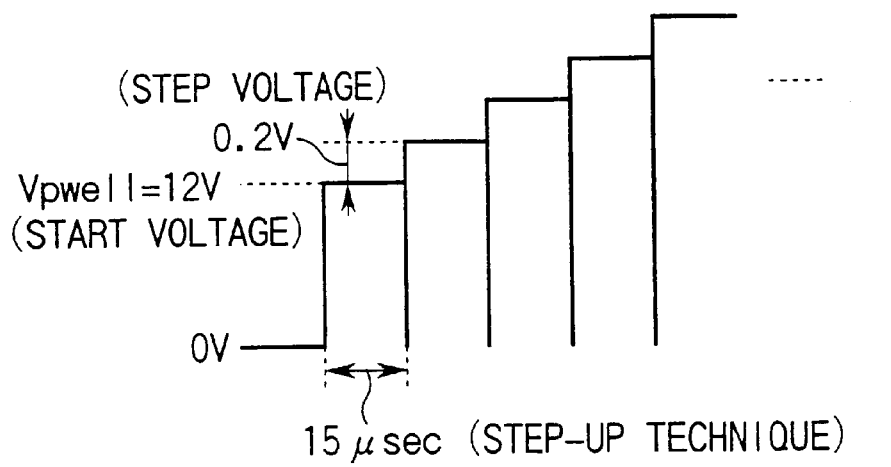
FIG. 14A shows an example of a Vpwell pulse during soft erase.
Figure 14B:
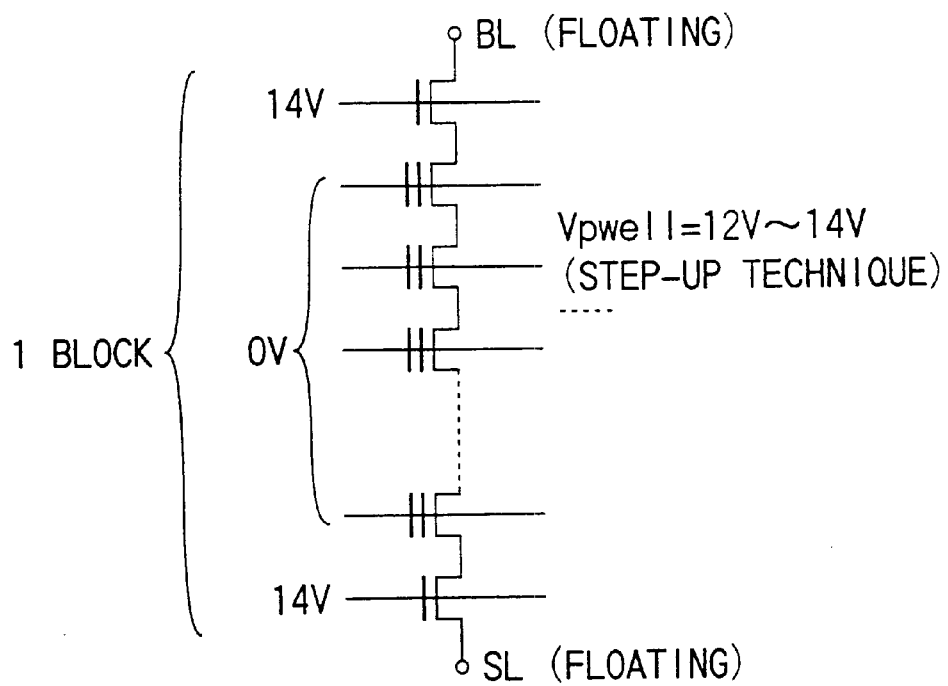
FIG. 14B shows an example of a voltage at each terminal during soft erase.

FIG. 14A is a waveform view showing an example of controlling the start voltage and step-up voltage for soft write applied to the present invention. FIG. 14B is a circuit diagram showing one NAND cell in one block. In FIG. 14B, an example of a voltage applied during soft write by means of a step-up technique is shown.

A voltage Vpwell applied to the P type well is stepped up by 0.2V with a start voltage of, for example, 12V. Each application time is 15 $\mu$sec. The voltage Vpwell finally applied to the well is controlled so that it can be stepped up to 14V. Needless to say, if set conditions for erase threshold voltages are satisfied in a step-up stage before the voltage Vpwell becomes 14V, the soft erase is finished. This control is applicable to the soft erase operation in both the first and second embodiments.

Figure 15A:
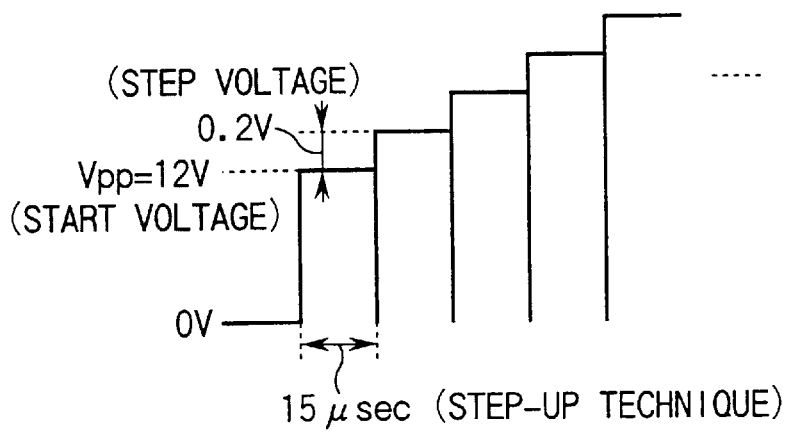
FIG. 15A shows an example of a Vpwell pulse during soft write.
Figure 15B:
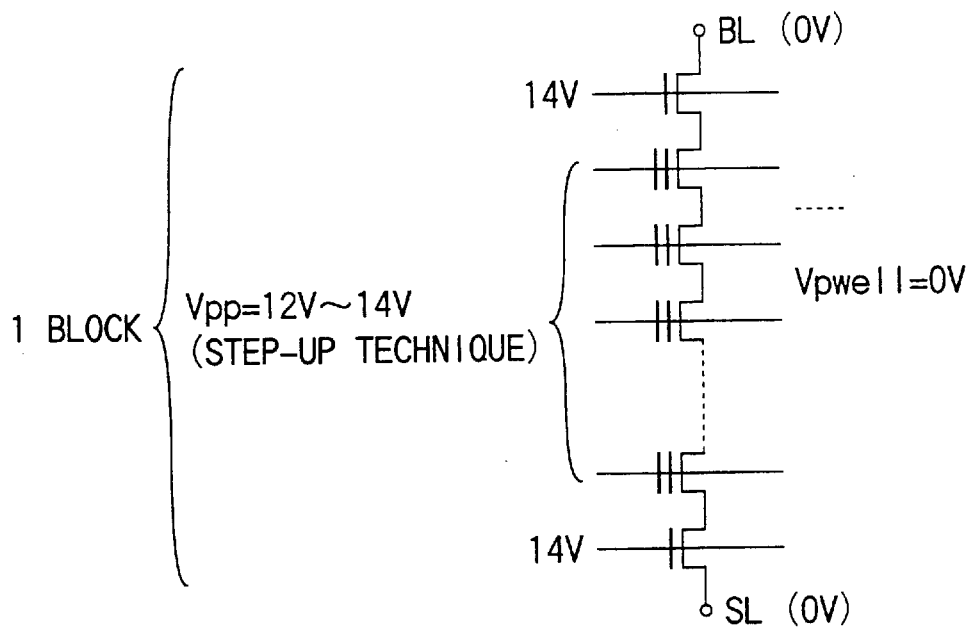
FIG. 15B shows an example of a voltage at each terminal during soft write.

FIG. 15A is a waveform view showing an example of controlling a start voltage and a step voltage for soft write applied to the present invention. FIG. 15B is a circuit diagram showing one NAND cell in one block. In FIG. 15B, an example of a voltage applied during soft write by means of the step-up technique is shown.

It is assumed that a voltage Vpwell applied to the well is 0V. A voltage Vpp applied to word lines (control gates) is stepped up by 0.2V with a start voltage of, for example, 12V. Each voltage application time is 15 $\mu$sec. and a voltage finally applied to the word lines is controlled to be stepped up to 14V. Needless to say, if set conditions for erase threshold voltages are satisfied in a step-up stage before the voltage becomes 14V, the soft write is finished. Such control is applicable to the soft write operation in the second embodiment stated above.

The start voltage and step voltage of the voltage Vpwell or those of the high voltage Vpp are selected so that the distribution width of threshold voltages after soft erase and soft write can become smallest and time for converging the erase threshold voltage can be shortest, and they should not be limited to those described above. They may be appropriately determined in view of, for example, the neutral threshold voltage of the memory cells, a coupling ratio for determining write/erase characteristic and the like.

Figure 16:
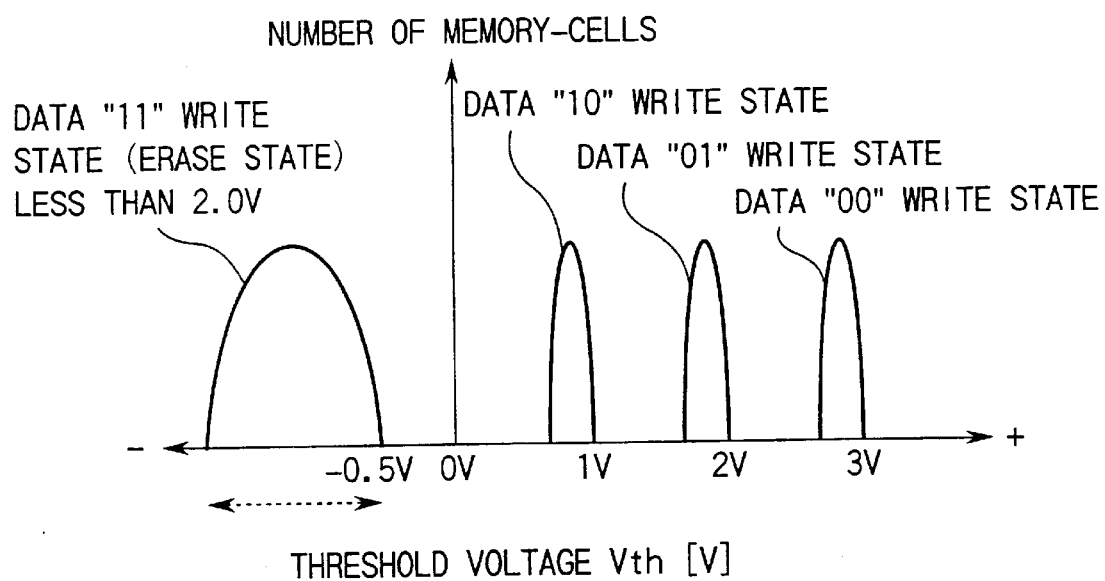
FIG. 16 is a graph showing the distribution of threshold voltages of memory cells having the data level number of "1"

FIG. 16 is a graph showing a threshold voltage distribution for dividing the storage data of memory cells in a four-level multilevel memory in the first and second embodiments. In FIG. 16, data are divided into one data ("11") at an erase side (at which threshold voltages are negative) and three items of data ("10", "01" and "00") at a write side (at which threshold voltages are positive).

The way to divide three items of data having positive threshold voltages is described in, for example, Japanese Patent Application No. 10-104652. For instance, time for applying a control voltage necessary for data write is set differently according to data.

That is to say, when writing data "10", time for applying a write select voltage of 0V to bit lines is set shorter than that when wiring data "01" and "00". This is because the smaller amount of electrons may be injected to floating gates of memory cells to store the data "10" than those injected to store data "01" and "00".

Likewise, when writing data "01", time for applying a write select voltage of 0V to bit lines is set shorter than that for wiring data "00". When writing the data "00", time for applying a write select voltage of 0V to bit lines may be set longer than that for writing the data "10" and "01". For example, a write pulse length may be controlled so that time for applying a write select voltage of 0V to the bit lines for writing the data "10", "01" and "00" may be 1 μsec., 5 μsec. and 25 μsec., respectively.

During data read, a read voltage Vread (e.g., 3.5V) is applied to a select gate line in a select block and word lines in non-select memory cells, respectively. By doing so, the non-select memory cells are turned on. In this state, a predetermined read voltage is applied to the word line of the select memory cell. The predetermined voltage value is selected so that the select memory cell can be turned into either "a conductive state" or "a non-conductive state" according to the state of the threshold voltage of the select memory cell. By applying such a predetermined voltage to the control gate of the select memory cell, the select memory cell is turned into either "a conductive state" or "a non-conductive state" according to the state of the threshold voltage of the select memory cell. As a result, a current flowing through the bit lines varies according to whether the select memory cell is in "a conductive state" or "a non-conductive state" and the potentials of the bit lines vary accordingly. By detecting the varied bit line potentials, one of a plurality of types of data is determined.

The soft erase technique of the present invention is employed to set the storage data of such a multilevel data memory. If so, it is possible to greatly narrow the threshold voltage distribution at the time of erasing data (or setting data "11") and to thereby realize memory cells having the smaller variation of threshold voltages and less chances of writing errors when writing the respective data.

Figure 17:
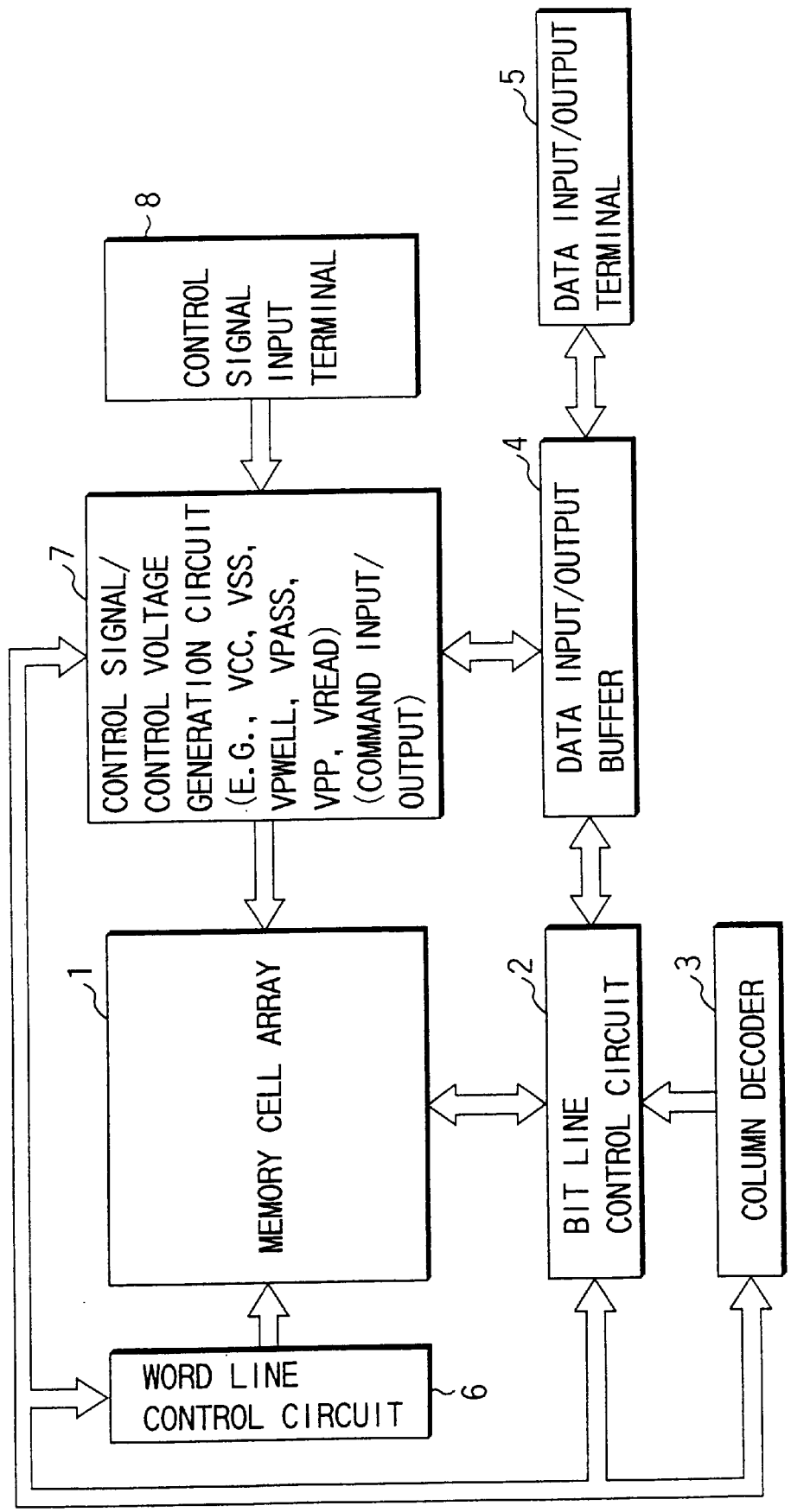
FIG. 17 is a block diagram of a four-level data storage NAND type EEPROM.
Figure 18A:
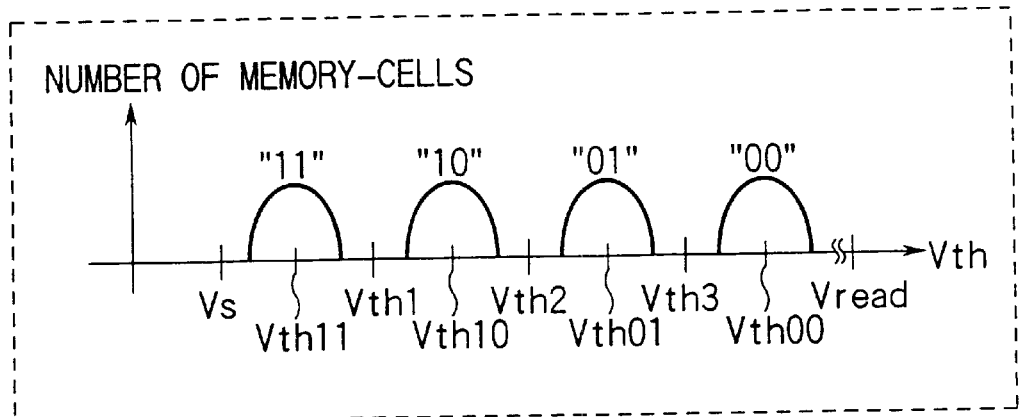
FIG. 18A is a graph showing the distribution of threshold voltages of memory cells having the data level number of "4"
Figure 18B:
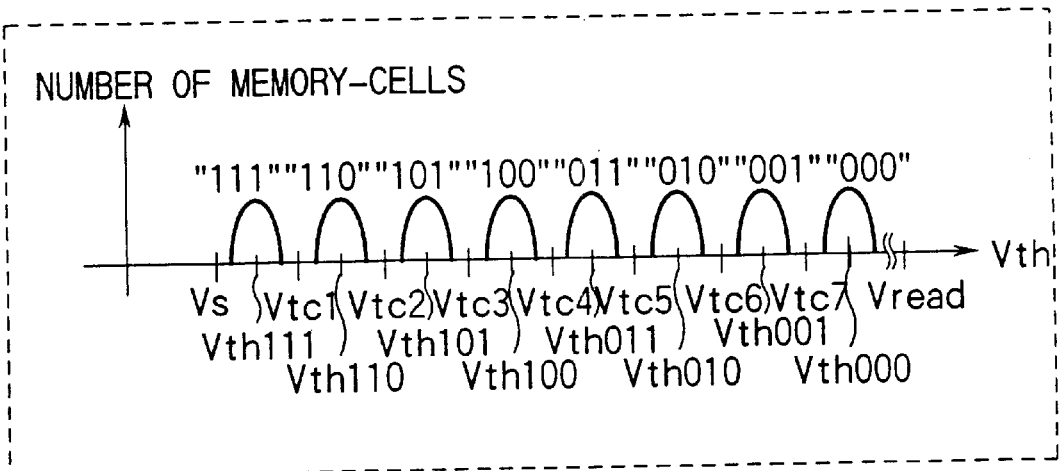
FIG. 18B is a graph showing the distribution of threshold voltages of memory cells having the data level number of "8"

FIG. 17 is a block diagram showing the configuration of a four-level data storage NAND type EEPROM (NAND flash memory) in the first or second embodiment stated above.

A bit line control circuit 2 for controlling bit lines and a word line control circuit 6 are provided for a memory cell array 1 on which memory cells each including a plurality of bit lines, a plurality of word lines and a common source line, and capable of electrically rewriting data are arranged in a matrix.

The bit line control circuit 2 reads the data of a memory cell on the memory cell array 1 through a bit line, detects the state of a memory cell on the memory cell array 1 through a bit line and applies a write control voltage to a memory cell on the memory cell array 1 through a bit line to thereby write data to the memory cell.

The bit line control circuit 2 includes a plurality of data storage circuits for dividing four-level data (see Japanese Patent Application No. 10-104652). The data of a memory cell selected by a column decoder 3 and read from the data storage circuit is output outside through a data input/output buffer 4 from a data input/output terminal 5. The write data input to the output terminal 5 from outside is input, as initial control data, to the data storage circuit selected by the column decoder 3 through the data input/output buffer 4.

The word line control circuit 6 selects a word line on the memory cell array 1 and applies a voltage thereto necessary for data read, write or erase.

The memory cell array 1, the bit line control circuit 2, the column decoder 3, the data input/output buffer 4 and the word line control circuit 6 are controlled by a control signal and Control voltage generation circuit 7. The control signal and control voltage generation circuit 7 are controlled by a control signal input to a control signal input terminal 8 from outside.

The control signal and control voltage generation circuit 7 generates a voltage used in an algorithm shown in the flowchart of either FIG. 6 or 12 of the present invention. That is, to realize an erase state in which the distribution of threshold voltages of memory cells is very narrow, a write system voltage Vpp (variable) for block write, normal write or soft write after soft erase, a well voltage Vpwell (variable) for the soft erase to realize an erase state in which the distribution of threshold voltages of the memory cells is very narrow, a read voltage Vread (variable) and the like are boosted, controlled and then generated by a power supply voltage of Vss (0V) to Vcc (e.g., 3V).

According to the first and second embodiments stated above, it is possible to set the erase threshold voltage distribution to be put at higher side (to thereby eliminate over-erase) and to make the distribution sufficiently narrow within the range in which the erase states of the EEPROM cells can be read.

As a result, in data write by means of the LSB technique, it is possible to operate the EEPROM at smaller voltage Vpass and to greatly reduce chances of memory cell writing errors or the variation of threshold voltages. Hence, the reliability of data write considerably enhances compared with the conventional data write.

Further, according to the present invention, it is possible to expect the realization of a nonvolatile semiconductor memory having excellent reliability capable of dealing with binary and multilevel memories particularly miniaturized to not more than a 0.25 μm rule.

It is noted that the technique of the present invention for introducing the block write to the soft erase is effective not only for the LSB technique but also for various types of EEPROM's employing the self boost write technique.

Furthermore, the above-stated technique of the present invention exerts its advantage without depending on memory cell structure, element isolation structure (LOCOS, trench), the number of select gate transistors, the types of data which can be stored in memory cells (multilevel data memory), production method and the like.

Additionally, the technique of the present invention for converging a reference threshold voltage (threshold voltage after erase operation) is equally effective for a case where the distribution of the threshold voltages of all data is at negative side or a case where one data is stored among multilevel data greater than four-level data.

(Third Embodiment)

Conventionally, the number n of data levels stored in one memory cell has been "n=2". In recent years, attention is paid to a multilevel memory in which the number of data levels is set at "n≧3" as a technique for increasing a storage capacity.

If the number of data levels is assumed as, for example, "n=4", two-bit data "00", "01", "10" and "11" can be stored in one memory. In a conventional memory having the number of data levels of "n=2", two memory cells are required to store two-bit data.

In such a multilevel memory having the number of data levels of "n=4", even if the accumulation number of memory cells is the same as that having the number of data levels of "n=2", the storage capacity is twice as large as that of the latter memory. In this way, the multilevel memory is a useful technique for increasing a storage capacity.

The theory for setting the number of data levels at "n≧3" is as follows.

In memory cells of, for example, an EEPROM, the number of types of the possible threshold voltages of the memory cells may be three or more so as to set the number of data levels at "n≧3".

To set the number of data levels at, for example, "n≧4", the number of types of the possible threshold voltages of memory cells may be four, i.e., "Vth00" "Vth01", "Vth10" and "Vth11". To provide four types of threshold voltages Vth, it suffices to divide the amount of charges stored in the floating gate of a memory cell into four stages.

Likewise, to set the number of data levels at "n≧8", the number of types of the possible threshold voltages of memory cells may be eight, i.e., "Vth00", "Vth001", "Vth010", "Vth011", "Vth100", "Vth101", "Vth110" and "Vth111".

The multilevel EEPROM is required to repeat data read "data level number n−1" times so as to determine a plurality of or not more than three threshold voltages and to convert them into multi-bit data.

Figures 19A, 19B:
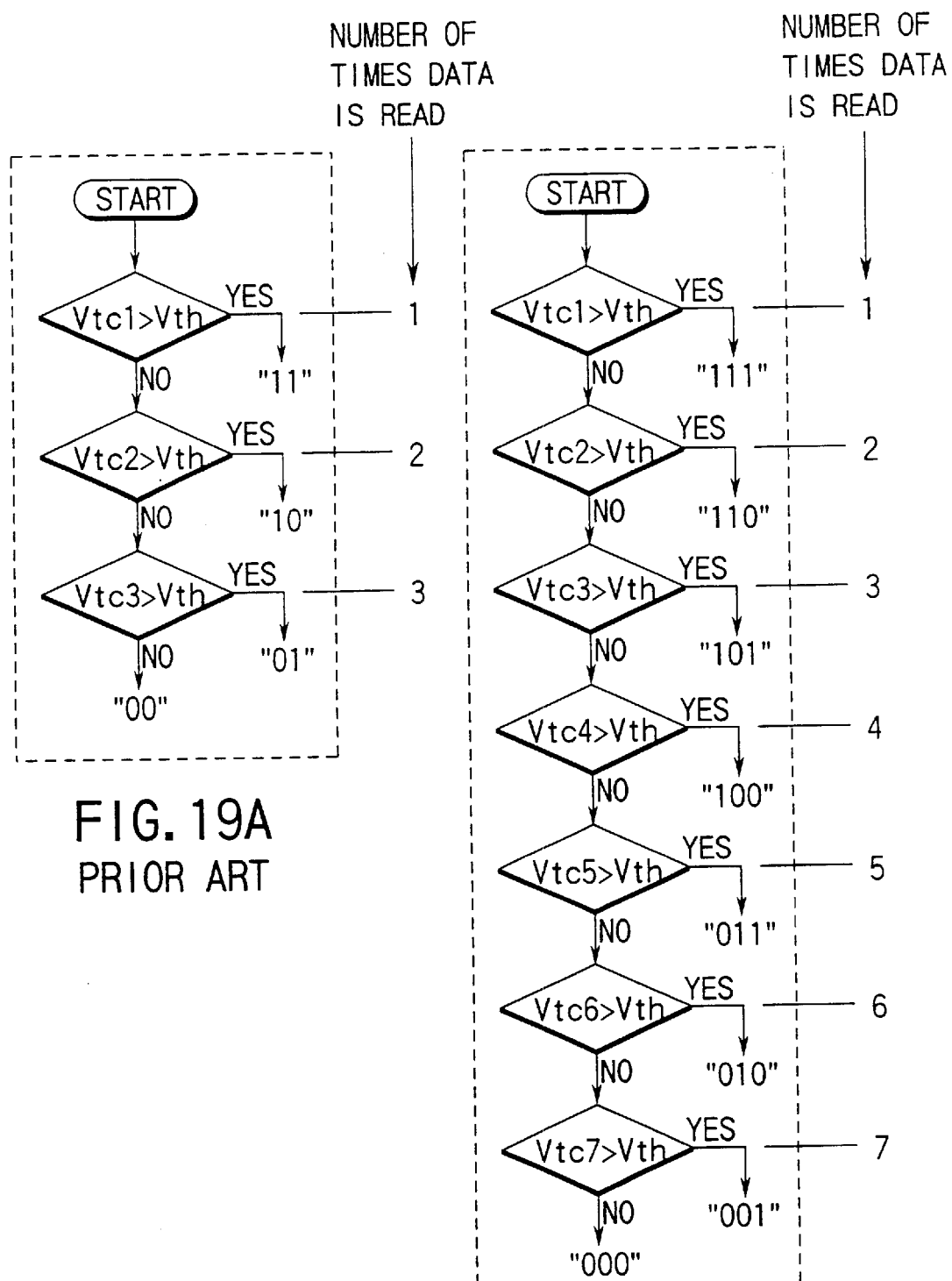
FIG. 19A is a flowchart showing an ordinary four-level data reading method while the number of data levels is "4"
FIG. 19B is a flowchart showing an ordinary eight-level data reading method while the number of data levels is "8"

To determine, for example, four types of threshold voltages, i.e., "Vth00", "Vth01", "Vth10" and "Vth11" and to convert them into two-bit data, i.e., "00", "01", "10" and "11", respectively, it is necessary to carry out the following data read three times as shown in FIG. 19A.

First read:
  Data read is carried out while setting the source potential of a memory cell at 0V and the gate potential thereof at a read voltage between "Vth11" and "Vth10". If the memory cell is turned "on" (Vtc1>Vth), data "11" is determined. If the memory cell is turned "off", one of the data "10", "01" and "00" is determined.

Second read:
  Data read is carried while setting the source potential of the memory cell at 0V and the gate potential thereof at a read voltage Vtc2 between "Vth10" and "Vth01". If the memory cell is turned "on" (Vtc2>Vth), data "10" is determined. If the memory cell is turned "off", either data "01" or "00" is determined.

Third read:
  Data read is carried out while setting the source potential of the memory cell at 0V and the gate potential thereof at a voltage Vtc3 between "Vth01" and "Vth00". If the memory cell is turned "on" (Vtc3>Vth), data "01" is determined. If the memory cell is turned "off", data "00" is determined.

Likewise, to convert the eight types of the threshold voltages "Vth000", . . . , "Vth111" into three-bit data of "000", . . . , "111", respectively, it is necessary to carry out data read seven times as shown in FIG. 19B.

As can be seen from the above, the multilevel EEPROM advantageously facilitates increasing storage capacity compared with the conventional EEPROM. However, it disadvantageously increase time required for data read.

Taking the above disadvantage into consideration, the third embodiment is designed to reduce time required for data read of a nonvolatile semiconductor memory comprising memory cells each storing n-value data (where n is an integer not less than 4).

Now, the third embodiment of the present invention will be described with reference to the drawings.

Figures 21A, 21B:
FIG. 21A shows two-bit data.
FIG. 21B shows three-bit data.

Before starting the description of the third embodiment, it is defined herein that data of two bits or more are bit data 1, bit data 2, . . . , in the order of starting at data of the most significant bit. To be specific, as for two-bit data, it is defined that data of the most significant bit is bit data 1, data of the least significant bit is bit data 2 (see FIG. 21A). Likewise, it is defined that data of three bits are bit data 1 which is the most significant bit data, bit data 2 and bit data 3 which is the least significant bit data (see FIG. 21B).

FIG. 20A is a flowchart showing a four-level data reading method in the third embodiment according to the present invention. FIG. 20B is a flowchart showing an ordinary four-level data reading method. FIG. 20C is a distribution view showing the distribution of threshold voltages of memory cells storing four-level data.

First, description will be given to the distribution of threshold voltages Vth of memory cells storing four-level data.

As shown in FIG. 20C, the distribution of threshold voltages Vth of memory cells storing four-level data is divided into four stages, which will be described in the ascending order as follows:

First stage: distribution at the peak of a threshold voltage Vth11;
  Second stage: distribution at the peak of a threshold voltage Vth10;
  Third stage: distribution at the peak of a threshold voltage Vth01; and
  Fourth stage: distribution at the peak of a threshold voltage Vth00.

These four stages of the distribution of threshold voltages Vth correspond to two-bit data "11", "10", "01" and "00", respectively.

The first stage is the distribution having the lowest threshold voltage Vth and corresponds to a data erase state (in which the amount of electrons at floating gates is smallest) of an ordinary flash memory. The second to fourth stages correspond to data write states and the amount of electrons injected to the floating gates increases in this order.

Conventionally, memory cell data having four stages of a threshold voltage distribution are converted into two-bit data by reading data "three" times as indicated in FIG. 20B. As for FIG. 20B, reference is made to the description given with reference to FIG. 19A.

In the four-level data reading method in the third embodiment, by contrast, memory cell data having four stages of a threshold voltage distribution can be converted into two-bit data by reading data "twice" as indicated in FIG. 20A. Description will be given hereinafter with reference to FIG. 20A.

First read:
  Data read is carried out while setting the source potential Vs of a memory cell at 0V and the gate potential thereof at a voltage Vtc2 between "Vth10" and "Vth01". If the memory cell is turned "on" (Vtc2>Vth), data is either data "11" or "10". That is, it is determined that one of the two-bit data or bit data 1 in the third embodiment is "1". If the memory cell is turned "off", the data is either data "01" or "00". That is, it is determined that bit data 1 is "0".

Second read:
  Prior to carrying out the second read, the source potential Vs of the memory cell is changed based on the result of the first read. That is, if the bit data 1 is "1", the source potential is changed from "0V" to a positive potential Vm. The level of the positive potential Vm is set at the following value so as to realize data read according to the present invention.

Figure 22A:
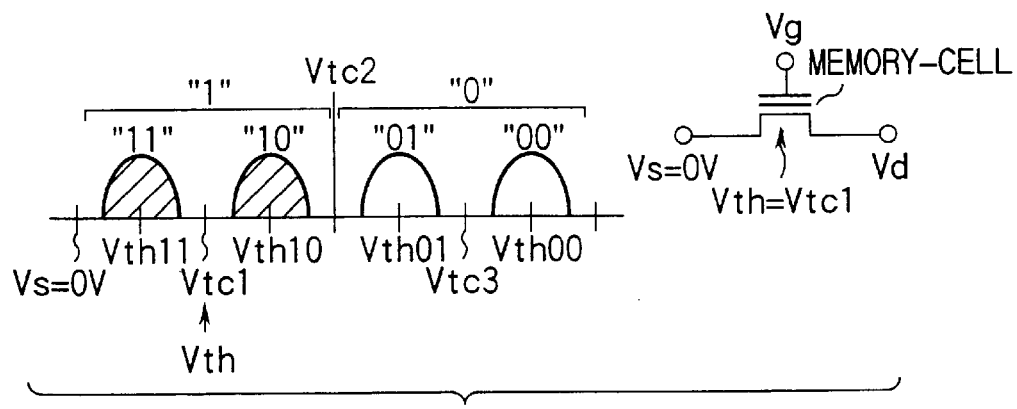
FIGS. 22A and 22B are explanatory views for set values of a positive potential Vm, respectively.
Figure 22B:
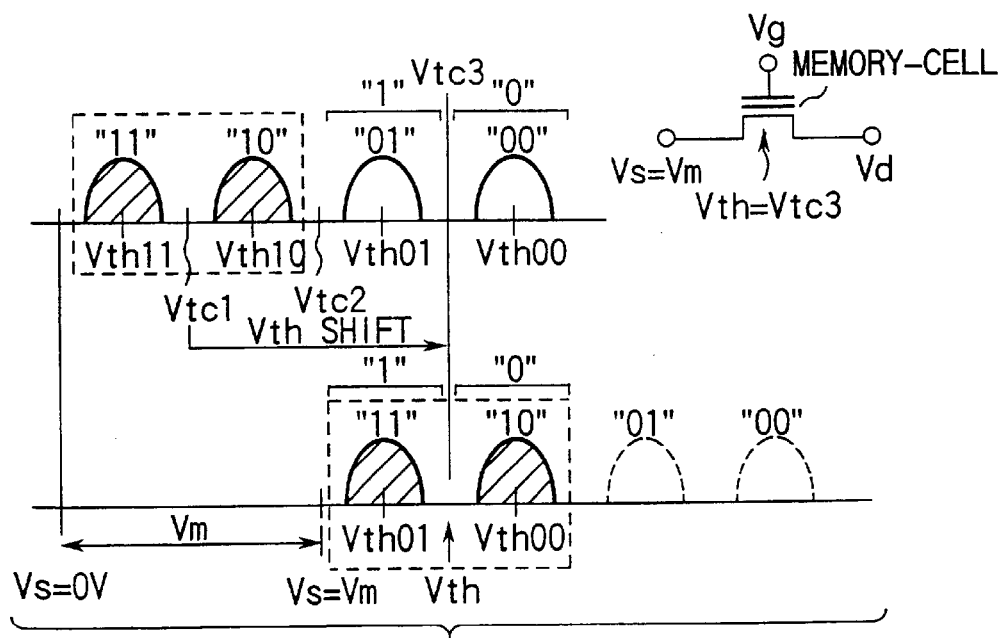

FIGS. 22A and 22B are explanatory views for the setting of the positive potential Vm.

As shown in FIG. 22A, if the source potential Vs of the memory cell is set at "0V", the memory cell having a threshold voltage Vth of "Vtc1" is considered. The memory cell is basically MOSFET. Due to this, if the source potential Vs is a positive potential higher than "0V", the threshold voltage Vth is shifted in positive direction by the substrate bias effect as in the case of an ordinary MOSFET.

Utilizing this phenomenon, the positive potential Vm is set so that the threshold voltage Vth is shifted from "Vtc1" at which the source potential is "0V", to "Vtc3", as shown in FIG. 22B.

In this way, the value of the positive potential Vm is determined and the source potential Vs is individually set for each memory cell.

It is noted that if the bit data 1 is "0", the source potential of the-memory cell substantially remains "0V".

While the source potential Vs of the memory cell is set individually and the gate potential thereof is set at a read voltage Vtc3 between "Vth01" and "Vth00", data read is carried out. If the memory cell is turned "on" (Vtc3>Vth), the data is either "01" or "11". That is, it is determined that the other one of the. two-bit data or bit data 2 in the third embodiment is "1". If the memory cell is turned "off", the data is either "00" or "10". That is, it is determined that bit data 2 is "0".

According to the above-stated third embodiment, the bit data 1 is determined in the first read and, if the bit data 1 is "1", the source potential Vs is changed from "0V" to "Vm". It is thereby possible to shift the threshold voltage which has been "Vth11" when the source potential is "0V", to "Vth01". At the same time, it is possible to shift the threshold voltage which has been "Vth10" when the source potential is "0V", to "Vth00".

Thus, it is possible to determine the bit data 2 by carrying out the second read operation in which the gate potential is set at Vtc3 for both a group of data "01" and "00" and a group of data "11" and "10".

Consequently, by carrying out data read twice, the four-level data stored in one memory cell can be converted to two-bit data. Compared with the conventional method which requires carrying out read operation three times when determining the four-level data, the present invention can determine four-level data only by carrying out data read twice.

If the above-stated items are described algebraically, "in the determination of n-level data, the n-level data can be determined by carrying out data read not less than m times (where m is the lowest integer satisfying $\log_2 n \leq m$) and less than (n−1) times" in the first embodiment.

As can be seen from the above, according to the four-level data reading method in the third embodiment, the number of times of data read can be reduced and time required for data read can be, therefore, shortened.

Figure 23:
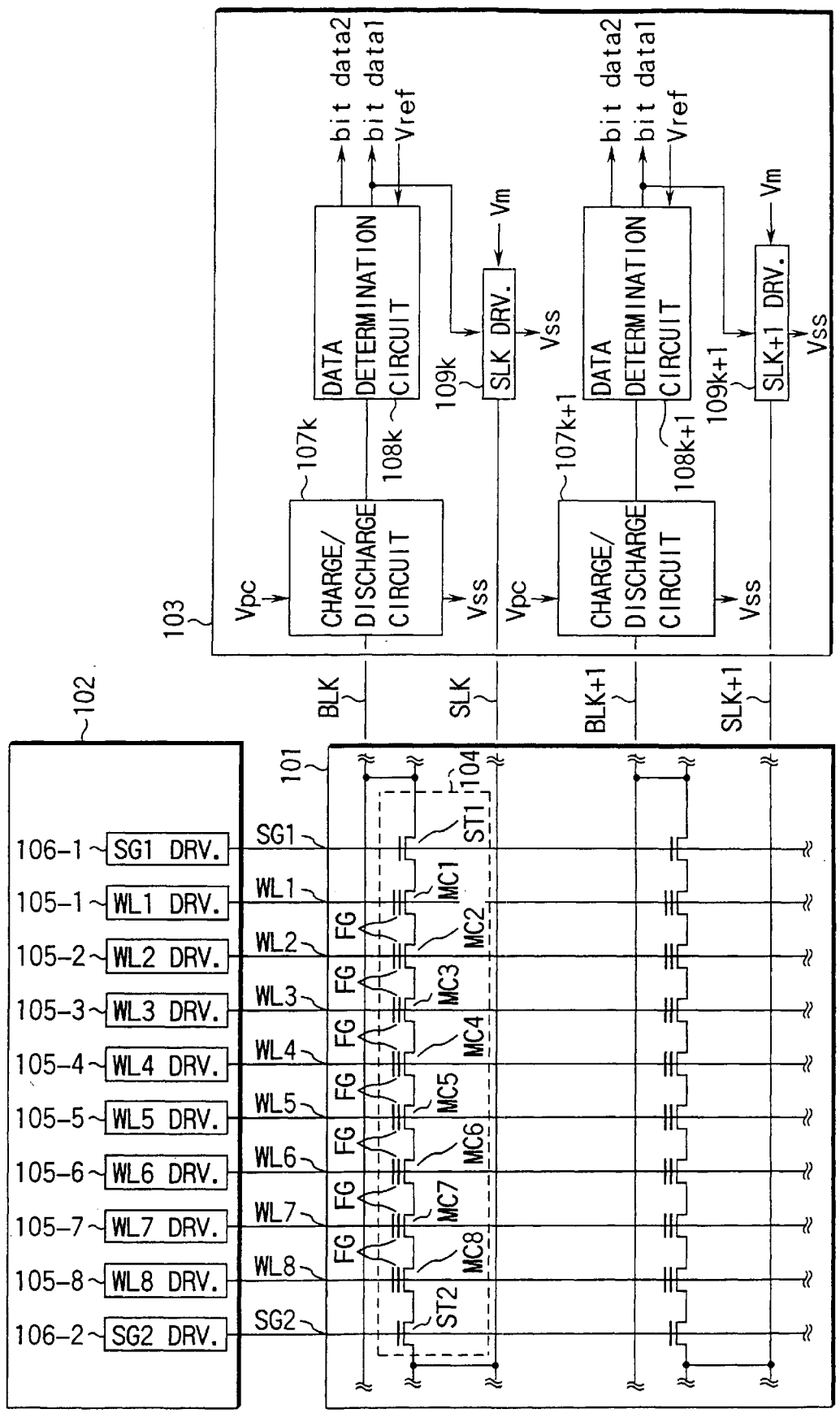
FIG. 23 is a block diagram showing an NAND type EEPROM to which a four-level data reading method in the third embodiment according to the present invention is applied.

FIG. 23 is a block diagram showing an example of the configuration of an NAND type EEPROM to which the four-level data reading method in the third embodiment is applied.

As shown in FIG. 23, the NAND type EEPROM has a memory cell array 101, a row select circuit 102 selecting the row of the memory cell array 101 and a data line circuit 103 reading data from the memory cell array 101 and writing data to the memory cell array 101.

NAND cells 104 are formed on the memory cell array 101. Each of the NAND cells 104 includes memory cells MC1 to MC8 mutually connected in series, a select transistor ST1 connected in series between the memory cell MC1 and a bit line BL (BLk, BLk+1) and a select transistor ST2 connected in series between the memory cell MC8 and a source line SL (SLk, SLk+1).

The memory cells MC1 to MC8 are variable threshold voltage type MOSFET's each having a floating gate FG for storing charge between the gate of the memory cell and the substrate thereof. The gates are connected to word lines WL1 to WL8, respectively. The word lines WL1 to WL8 are connected to word line driving circuits 105-1 to 105-8 of the row select circuit 102, respectively. Each of the word line driving circuits 105-1 to 105-8 selects one word line WL for data read/write from among the word lines WL1 to WL8 according to a row address signal which is not shown in FIG. 23.

The select transistors ST1 and ST2 are ordinary MOSFET's and the gates of the transistors ST1 and ST2 are connected to select gate lines SG1 and SG2, respectively. The select gate lines SG1 and SG2 are connected to the select gate line driving circuits 106-1 and 106-2 of the row select circuit 102, respectively. Each of the select gate line driving circuits 106-1 and 106-2 selects one block (in FIG. 23, only one block is shown) for data read/write from the blocks put between the select gate lines SG1 and SG2 according to a row address signal which is not shown in FIG. 23.

The data line circuit 103 includes charge/discharge circuits 107 (107k, 107k+1), data determination circuits 108 (108k, 108k+1) for determining data to be read on the bit lines BL (BLk, BLk+1) and source line driving circuits 109 (109k, 109k+1) for driving source lines SL (SLk, SLK+1).

Figure 24:
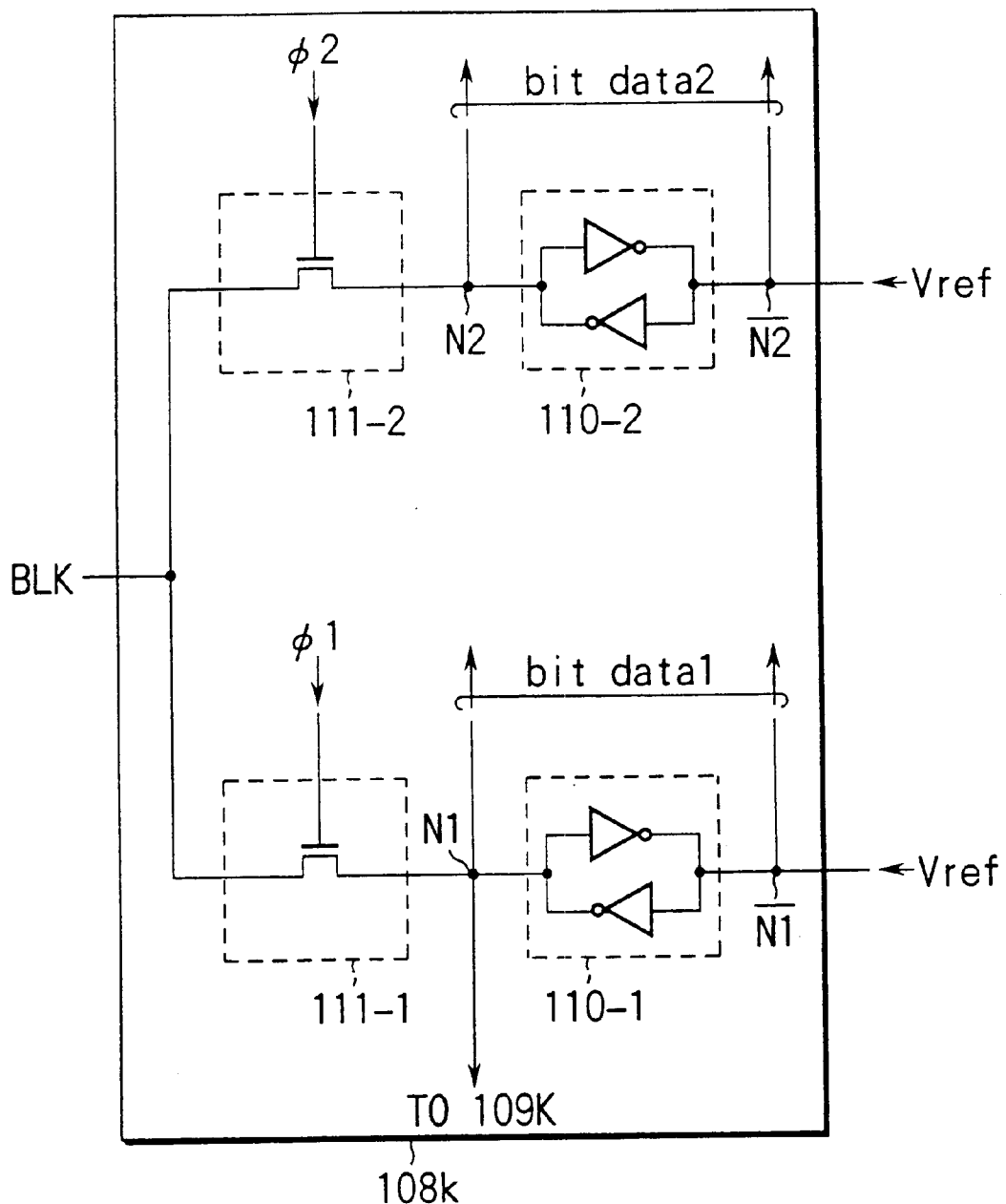
FIG. 24 is a circuit diagram for a data determination circuit shown in FIG. 23.

FIG. 24 is a circuit diagram for the data determination circuit 108k. While FIG. 24 shows the data determination circuit 108k, the data determination circuit 108k+1 is similar to the circuit 108k.

As shown in FIG. 24, the data determination circuit 108k has a sense amplifier/data latch circuit 101-1 for determining bit data 1 and latching the determined bit data 1, a sense amplifier/data latch circuit 110-2 for determining bit data 2 and latching the determined bit data 2, a connect/disconnect circuit 111-1 for connecting/disconnecting the bit line BLk and the sense amplifier/data latch circuit 110-1 in response to a connect/disconnect signal ø1, and a connect/disconnect circuit 111-2 for connecting/disconnecting the bit line BLk and the sense amplifier/data latch circuit 110-2 in response to ab connect/disconnect signal ø2.

The sense amplifier/data latch circuit 110-1 has a positive-phase node N1 and an anti-phase node /N1. The potential of the bit line BLk is transmitted to the positive-phase node N1 through the connect/disconnect circuit 110-1. A reference potential Vref is transmitted to the anti-phase node /N1. The sense amplifier/data latch circuit 110-1 compares and amplifies/latches the potential of the positive-phase node N1 and that of the anti-phase node /N1. The potentials of the positive-phase node N1 and the anti-phase node /N1 thus amplified/latched are complementary signals indicating the bit data 1.

Likewise, the sense amplifier/data latch circuit 110-2 has a positive-phase node N2 and an anti-phase node /N2. The potential of the bit line BLk is transmitted to the positive-phase node N2 through the connect/disconnect circuit 110-2. The above-stated reference potential Vref is transmitted to the anti-phase node /N2. The sense amplifier/data latch circuit 110-2 compares and amplifies/latches the potential of the positive-phase node N2 and that of the anti-phase node /N2. The potentials of the positive-phase node N2 and the anti-phase node /N2 thus amplified/latched are complementary signals indicating the bit data 2.

In this embodiment, after the bit data 1 is determined while the source line SL (SLk, SLk+1) is set at 0V (Vss), the source line SL (SLk, SLk+1) is set at either 0V (Vss) or a positive potential Vm according to the determination result of the bit data 1 and the bit data 2 is then determined. In the determination of the bit data 2, whether or not the potential of the source line SL (SLk, SLk+1) is switched is determined based on the potential of the positive-phase node N1 (or anti-phase node /N1) of the sense amplifier/data latch circuit 110-1.

Next, the operation of the sense amplifier/data latch circuit will be described. It is noted that the following description is given while paying attention to the bit line BLk and assuming that the word line WL3 is selected.

Figure 25:
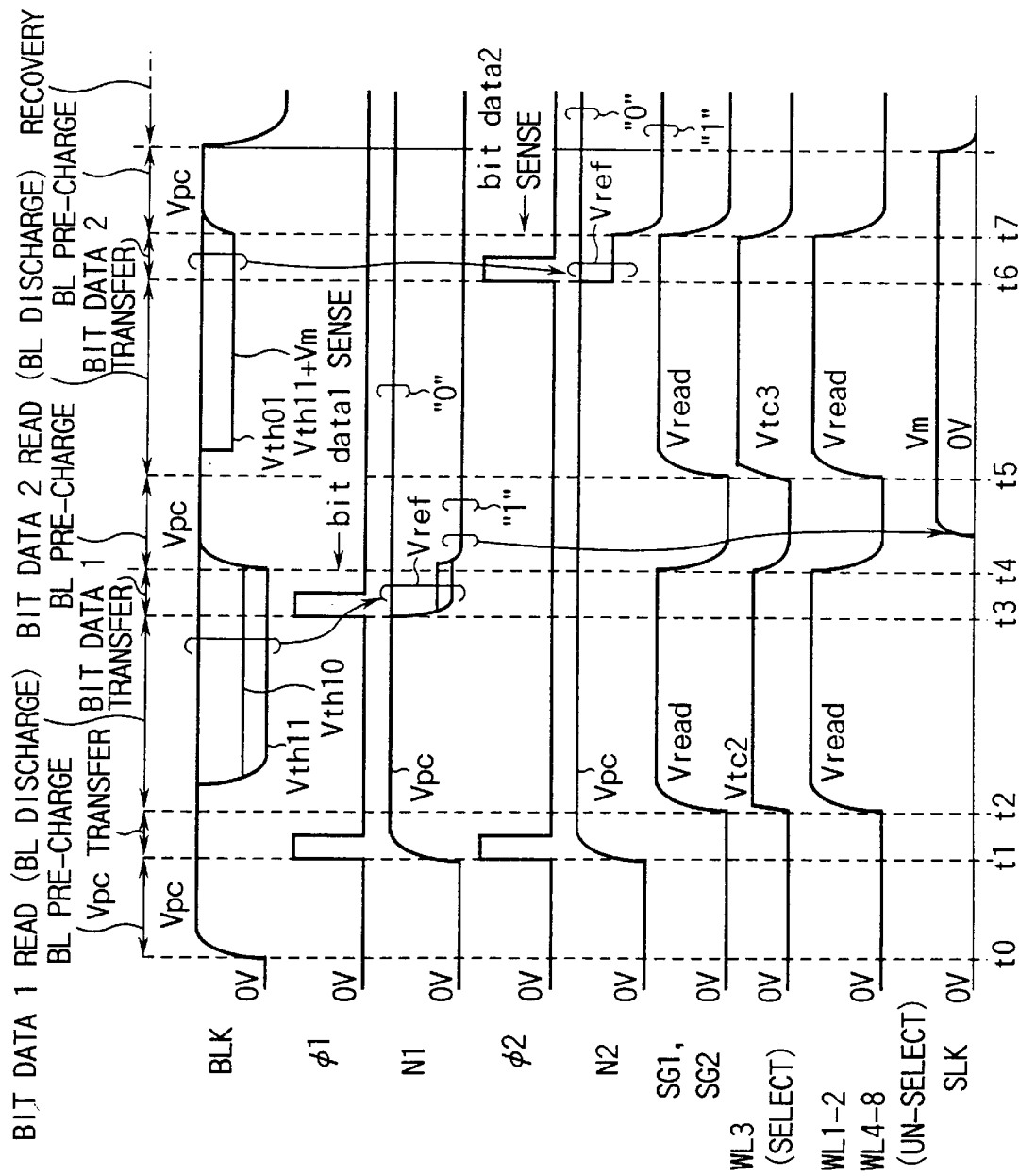
FIG. 25 is a waveform view showing the operation of the NAND type EEPROM shown in FIG. 23.
Figure 26A:
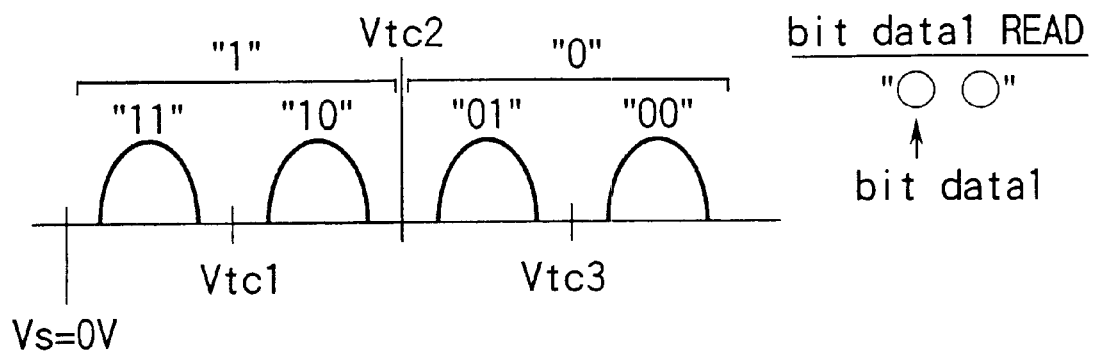
FIG. 26A shows the state of threshold voltages at the time of reading bit data 1.
Figure 26B:
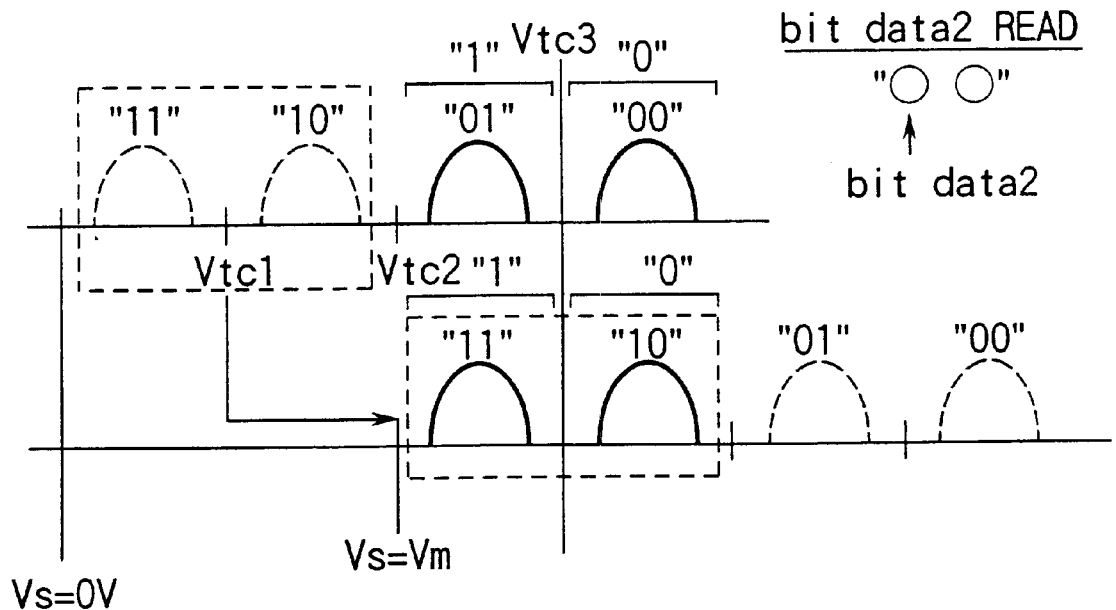
FIG. 26B shows the state of threshold voltages at the time of reading bit data 2.

FIG. 25 is a waveform view showing the operation of the NAND type EEPROM shown in FIG. 23. FIG. 26A shows the state of threshold voltages at the time of reading bit data 1 and FIG. 26B shows the state of threshold voltages at the time of reading data bit 2.

As shown in FIG. 25, the bit line BLk is pre-charged with a potential Vpc at a time to.

Next, at a time t1, signals ø1 and ø2 are temporarily set at "H" level and the positive-phase nodes N1 and N2 are pre-charged with the potential Vpc.

At a time t2, while the potential of the source line SLK is set at 0V, the potentials of the select gate lines SG1 and SG2 are set at a potential Vread, that of the select word line WL3 is set at a potential Vtc2 and those of the non-select word lines WL1, WL2 and WL4 to WL8 at the potential Vread. By doing so, the potential of the bit line BLk is changed according to the threshold voltage of the memory cell MC3.

Namely, as shown in FIG. 26A, if the threshold voltage of the memory cell MC3 is higher than the potential Vtc2, the memory cell MC3 is turned off and the potential of the bit line BLk substantially remains the potential Vpc. Also, if the threshold voltage of the memory cell MC3 is lower than the potential Vtc2, the memory cell MC3 is turned on and the potential of the bit line BLk is lowered from the potential Vpc.

At a time t3, the signal ø1 is temporarily set at "H" level and the potential of the bit line BLk is transferred to the positive-phase node N1.

At a time t4, the potential of the positive-phase node N1 and the potential Vref of the anti-phase node /N1 are compared/amplified. If the potential of the positive-phase node N1 is higher than the potential Vref of the anti-phase node /N1, it is determined that the bit data 1 is "0". If the potential of the positive-phase node N1 is lower, it is determined that the bit data 1 is "1". In response to the determination of the bit data 1 as "0" or "1", the potential of the source line SLk is changed. That is, when the bit data 1 is "0", the potential of the source line SLk remains 0V. When the bit data 1 is "1" the potential of the source line SLk is set at the positive potential Vm.

In this embodiment, after the signal ø1 is changed from "H" level to "L" level, all the potentials of the select gate lines SG1 and SG2, the select word line WL3 and the non-select word lines WL1, WL2 and WL4 to WL8 are set at 0V.

Next, at a time t5, while the potential of the source line SLk is set at either 0V or the positive potential Vm, the potentials of the select gate lines SG1 and SG2 are set at the potential Vread, that of the select word line WL3 is set at the potential Vtc3, those of the non-select word lines WL1, WL2 and WL4 to WL8 are set at the potential Vread. By doing so, the potential of the bit line BLk is changed according to the threshold voltage of the memory cell MC3.

Namely, as shown in FIG. 26B, if the threshold voltage of the memory cell MC3 is higher than the potential Vtc3, the memory cell MC3 is turned off and the potential of the bit line BLk substantially remains the potential Vpc. If the threshold voltage of the memory cell MC3 is lower than the potential Vtc, the memory cell MC3 is turned on and the potential of the bit line BLk is lowered from the potential Vpc.

At a time t6, the signal ø2 is temporarily set at "H" level and the potential of the bit line BLk is transferred to the positive-phase node N2.

At a time t7, the potential of the positive-phase node N2 and the potential Vref of the anti-phase node /N2 are compared/amplified. If the potential of the positive-phase node N2 is higher than the potential Vref of the anti-phase node /N2, it is determined that bit data 2 is "0". If the potential of the positive-phase node N1 is lower than the potential Vref, it is determined that the bit data 2 is "1".

As can be understood from the above, with the NAND type EEPROM shown in FIG. 23, the four-level data stored in one memory cell can be converted to two-bit data.

(Fourth Embodiment)

Next, an example of applying the present invention to an eight-level EEPROM will be described as the fourth embodiment.

Figures 27A, 27B, 27C:
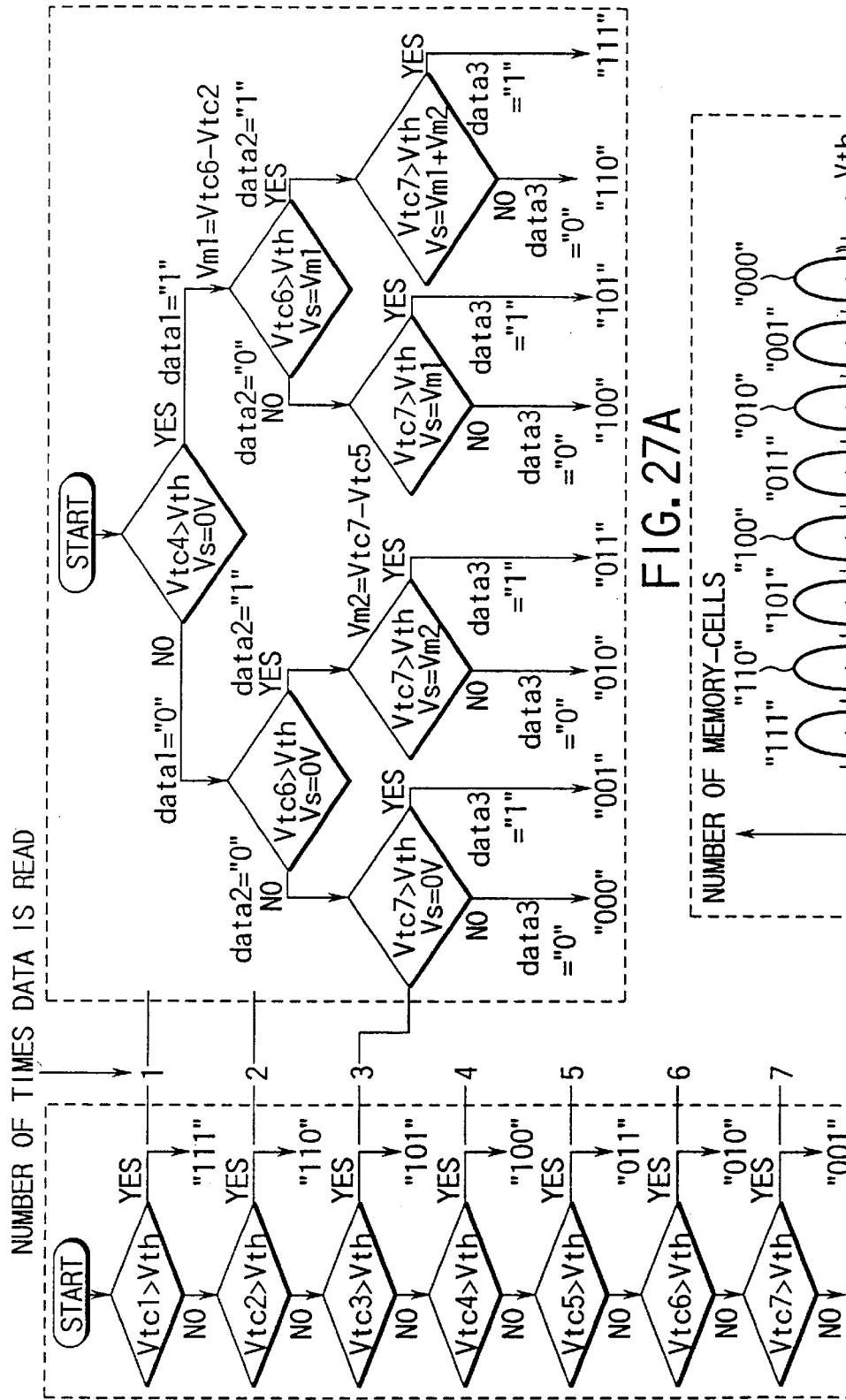
FIG. 27A is a flowchart showing an eight-level data reading method in the fourth embodiment according to the present invention.
FIG. 27B is a flowchart showing an ordinary eight-level data reading method.
FIG. 27C is a graph showing the distribution of threshold voltages.

FIG. 27A is a flowchart showing an eight-level data reading method in the fourth embodiment according to the present invention. FIG. 27B is a flowchart showing a conventional eight-level data reading method. FIG. 27C is a graph showing the distribution of threshold voltages of memory cells storing the eight-level data.

As shown in FIG. 27C, in the memory cell storing eight-level data, the distribution of threshold voltages Vth is divided into eight stages, which will be described in the ascending order as follows:

First stage: distribution at the peak of a threshold voltage Vth111;

Second stage: distribution at the peak of a threshold voltage Vth110;

Third stage: distribution at the peak of a threshold voltage Vth101;

Fourth stage: distribution at the peak of a threshold voltage Vth100;

Fifth stage: distribution at the peak of a threshold voltage Vth011;

Sixth stage: distribution at the peak of a threshold voltage Vth010;

Seventh stage: distribution at the peak of a threshold voltage Vth001; and

Eighth stage: distribution at the peak of a threshold voltage Vth000.

The eight stages of the distribution of threshold voltages Vth correspond to three-bit data "111", "110", "101", "100", "011", "010", "001" and "000", respectively.

The first stage is the distribution in which the threshold voltage becomes the lowest and corresponds to a data erase state (in which state the amount of electrons at the floating gate is smallest) in an ordinary flash memory. The second to eighth stages correspond to data write states, respectively and the amount of electrons injected to the floating gate increases in this order.

Conventionally, the data of a memory cell having eight stages of the threshold voltage distribution is converted to three-bit data by carrying out data read seven times as shown in FIG. 27B.

In the data reading method in the fourth embodiment, by contrast, the data of a memory cell having eight stages of the threshold voltage distribution can be converted to three-bit data by carrying out data read three times as shown in FIG. 27A, which will be described hereinafter.

First read:

While source potential Vs of the memory cell is set at 0V and the gate potential thereof is set at a read voltage Vtc4 between "Vth100" and "Vth011", data read is carried out. If the memory cell is turned "on" (Vtc4>Vth), data is one of "111", "110", "101" and "100". That is, it is determined that one of the three-bit data or bit data 1 in the fourth embodiment is "1". If the memory cell is turned "off", the data is one of "011", "010", "001" and "000". That is, it is determined that the bit data 1 is "0".

Second read:

Prior to carrying out the second read, the source potential Vs of the memory cell is changed based on the result of the first read. That is, if the bit data 1 is "1", the source potential is changed from "0V" to a positive potential Vm1. The level of the positive potential Vm1 is set at the following value.

Figure 28A:
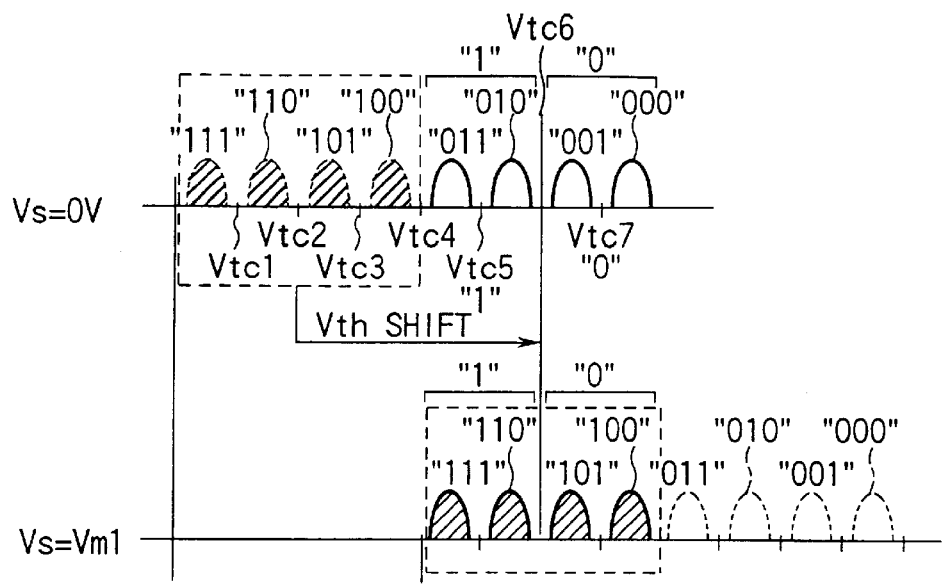
FIG. 28A is an explanatory view for the set values of a positive potential Vm1.

FIG. 28A is an explanatory view for the setting of the value of the positive potential Vm1.

As shown in FIG. 28A, a memory cell having the threshold voltage Vth of "Vtc2" when the source potential Vs is "0V", is considered. The positive potential Vm1 is set so that the threshold voltage Vth of the memory cell is shifted from "Vtc2" to "Vtc6".

The value of the positive potential Vm1 is determined as stated above and the source potential. Vs is individually set for each memory cell.

It is noted that if the bit data 1 is "0", the source potential remains "0V".

While the source potential Vs is individually set and the gate potential is set at a read voltage Vtc6, data read is carried out. If the memory cell is turned "on" (Vtc6>Vth), data is one of "011", "010", "111" and "110". That is, it is determined that the second data of the three-bit data or bit data 2 in the fourth embodiment is "1". If the memory cell is turned "off", the data is one of "000", "001", "100" and "101". That is, it is determined that the bit data 2 is "0".

Third read:

Prior to carrying out the third read, the source potential Vs of the memory cell is changed based on the result of the second read. That is, if the bit data 2 is "1", a positive potential Vm2 is added to the source potential Vs at the first read. The level of the positive potential Vm2 is set at the following value.

Figure 28B:
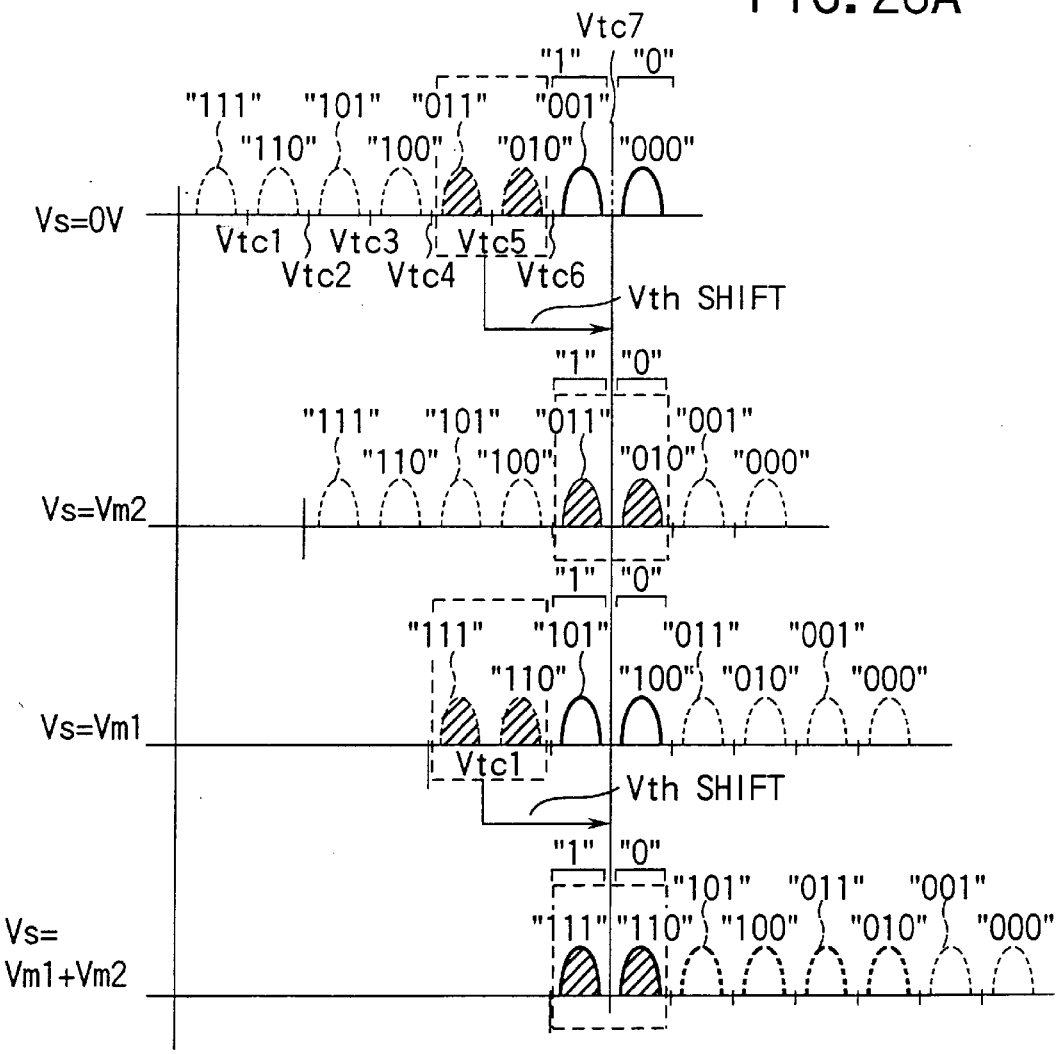
FIG. 28B is an explanatory view for the set values of a positive potential Vm2.

FIG. 28B is an explanatory view for the setting of the value of the positive potential Vm2.

As shown in FIG. 28B, a memory cell having the threshold voltage Vth of "Vtc5" when the source potential Vs is "0V" and "Vm", is considered. The positive potential Vm2 is set so that the threshold voltage Vth of the memory cell is shifted from "Vtc5" to "Vtc7".

The value of the positive potential Vm2 is determined as stated above and the source potential Vs is individually set for each memory cell according to the bit data 2.

It is noted that if the bit data 2 is "0", the source potential remains "0V" or "Vm".

While the source potential Vs is individually set and the gate potential is set at a read potential Vtc7, data read is carried out. If the memory cell is turned "on" (Vtc7>Vth), data is one of "001", "011", "101" and "111". That is, it is determined that the third data of the three-bit data or bit data 3 in the fourth embodiment is "1". If the memory cell is turned "off", the data is one of "000", "010", "100" and "110". That is, it is determined that the bit data 3 is "0".

Consequently, by carrying out data read three times, the eight-level data stored in one memory cell can be converted to three-bit data. Compared with the conventional method which requires carrying out data read seven times for determining eight-level data, therefore, the method in this embodiment can determine the eight-level data by carrying out data read three times.

Figure 29:
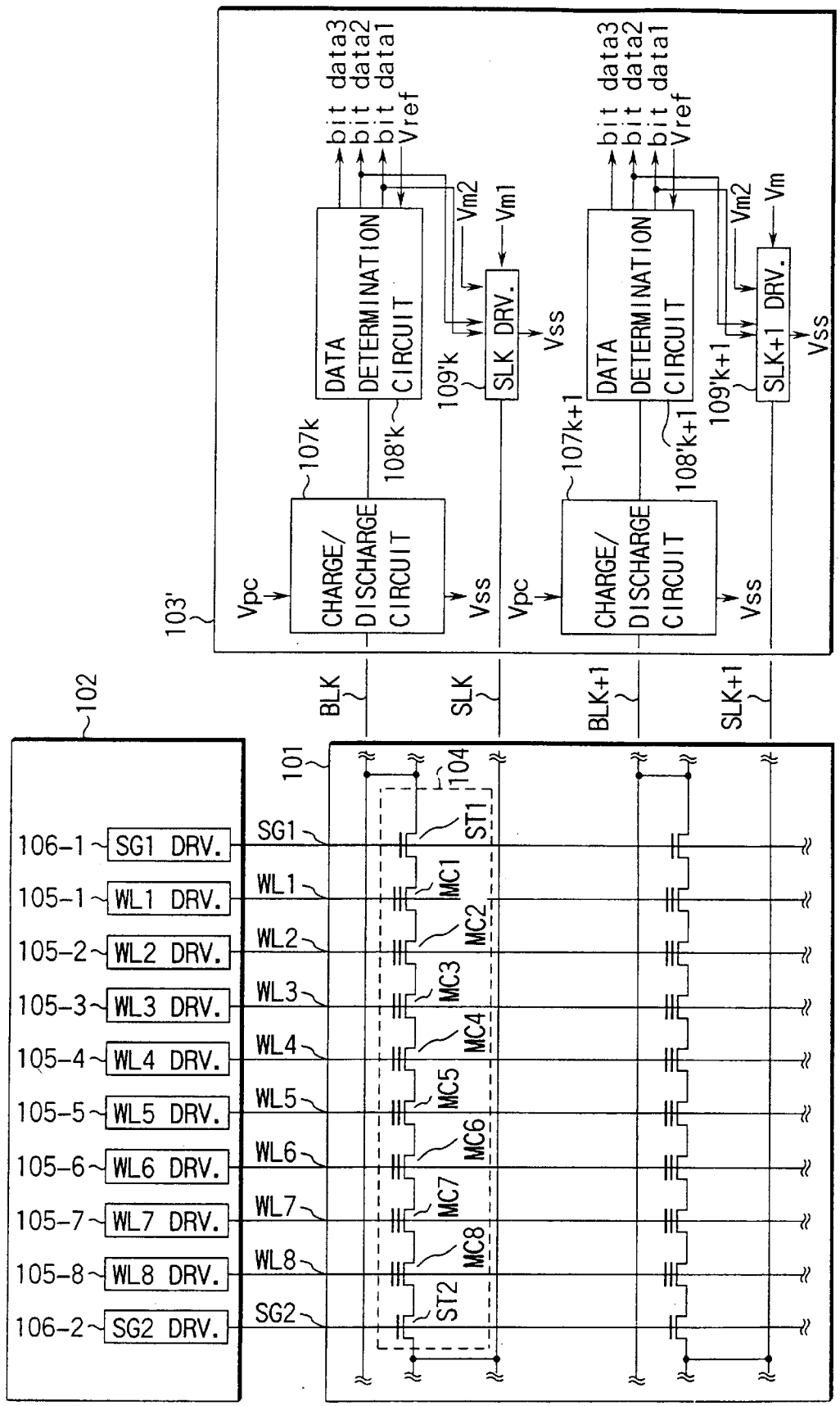
FIG. 29 is a block diagram showing an NAND type EEPROM to which an eight-level data reading method in the fourth embodiment according to the present invention is applied.

FIG. 29 is a block diagram showing an example of the configuration of an NAND type EEPROM to which the eight-level data reading method in the fourth embodiment according to the present invention is applied. The EEPROM shown in FIG. 29 differs from that shown in FIG. 23 in the configuration of a data line circuit 103'. To be specific, source line driving circuits 109' (109'k, 109'k+1) switch a source potential Vs to either 0V (Vss) or a positive potential Vm1 according to the bit data 1 and add a positive potential Vm2 to the source potential Vs according to the bit data 2.

Figure 30:
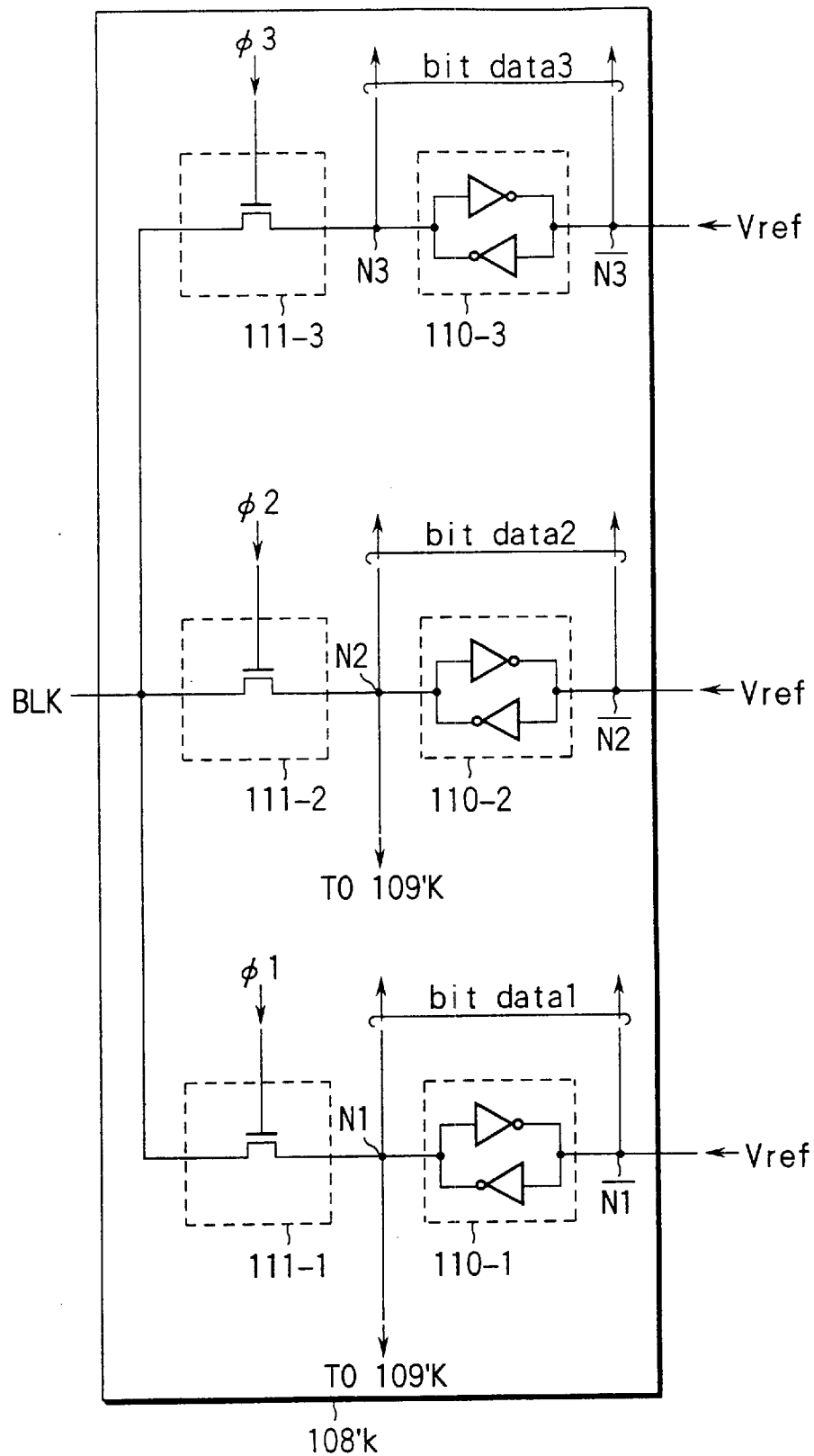
FIG. 30 is a circuit diagram for a data determination circuit shown in FIG. 29.

FIG. 30 is a circuit diagram for a data determination circuit 108'k. While the data determination circuit 108'k is shown in FIG. 30, a data determination circuit 108'k+1 is similar to the circuit 108'k.

As shown in FIG. 30, the data determination circuit 108'k has sense amplifier/data latch circuits 110-1 to 110-3 and connect/disconnect circuits 111-1 to 111-1. The connect/disconnect circuits 111-1 to 111-3 connect/disconnect a bit line BLk and the sense amplifiers/data latch circuits 110-1 to 110-3 in response to connect/disconnect signals ø1, ø2 and ø3, respectively.

The sense amplifier/data latch circuit 110-1 has a positive-phase node N1 and an anti-phase node /N1. The potential of the bit line BLk is transmitted to the positive-phase node N1 through the connect/disconnect circuit 111-1. A reference potential Vref is transmitted to the anti-phase node /N1. The sense amplifier/data latch circuit 110-1 compares and amplifies/latches the potential of the positive-phase node N1 and that of the anti-phase node /N1. The potentials of the positive-phase node N1 and the anti-phase node /N1 thus amplified/latched are complementary signals indicating bit data 1.

Likewise, the sense amplifier/data latch circuit 110-2 has a positive-phase node N2 and an anti-phase node /N2. The potential of the bit line BLk is transmitted to the positive-phase node N2 through the connect/disconnect circuit 111-2. The above-stated reference potential Vref is transmitted to the anti-phase node /N2. The sense amplifier/data latch circuit 110-2 compares and amplifies/latches the potential of the positive-phase node N2 and that of the anti-phase node /N2. The potentials of the positive-phase node N2 and the anti-phase node /N2 thus amplified/latched are complementary signals indicating bit data 2.

Likewise, the sense amplifier/data latch circuit 110-3 has a positive-phase node N3 and an anti-phase node /N3. The potential of the bit line BLk is transmitted to the positive-phase node N3 through the connect/disconnect circuit 111-3. The above-stated reference potential Vref is transmitted to the anti-phase node /N3. The sense amplifier/data latch circuit 110-3 compares and amplifies/latches the potential of the positive-phase node N3 and that of the anti-phase node /N3. The potentials of the positive-phase node N3 and the anti-phase node /N3 thus amplified/latched are complementary signals indicating bit data 3.

In this embodiment, while setting the source line SL (SLk, SLk+1) at 0V (Vss), the bit data 1 is determined and then the bit data 2 is determined by setting the source line SL (SLk, SLk+1) at either 0V (Vss) or the positive potential Vm1 according to the determination result of the bit data 1. Further, while setting the source line SL (SLk, SLk+1) at either 0V or the positive potential Vm1, the bit data 2 is determined and then the bit data 3 is determined by adding the positive potential Vm2 to the potential of the source line SL (SLk, SLk+1) based on the determination result of the bit data 2.

In the determination of the bit data 2, whether or not the potential of the source line SL (SLk, SLk+1) is switched is determined based on the potential of the positive-phase node N1 (or anti-phase node /N1) of the sense amplifier/data latch circuit 110-1.

In the determination of the bit data 3, whether or not the positive potential Vm2 is added to the potential of the source line SL (SLk, SLk+1) is determined based on the potential of the positive-phase node N2 (or anti-phase node /N2) of the sense amplifier/data latch circuit 110-2.

Next, the operation of the sense amplifier/data latch circuit in this embodiment will be described. It is noted that the following description of the operation is given while paying attention to the bit line BLk and assuming that the word line WL3 is selected.

Figure 31:
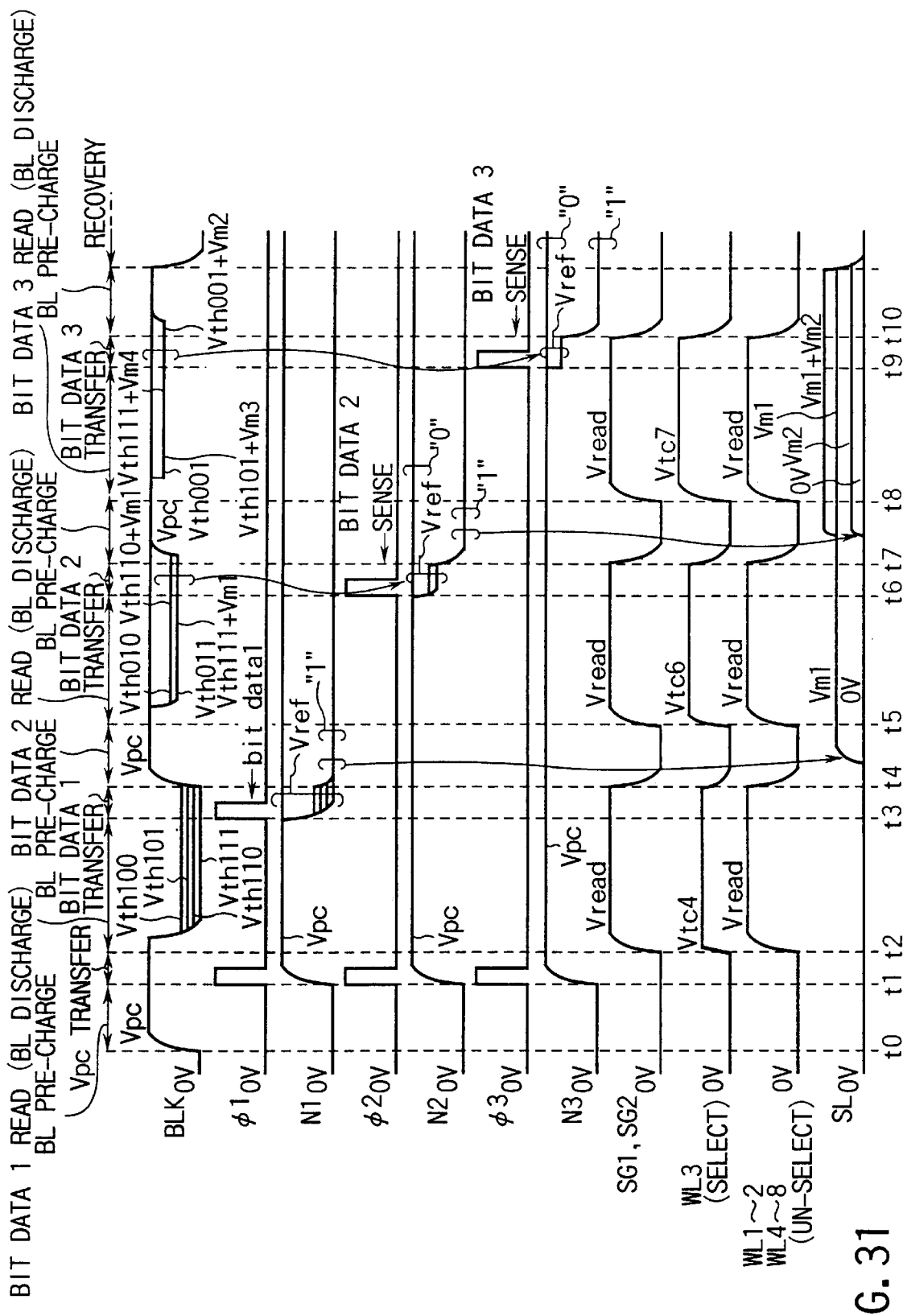
FIG. 31 is a waveform view showing the operation of the NAND type EEPROM shown in FIG. 29.
Figure 32A:
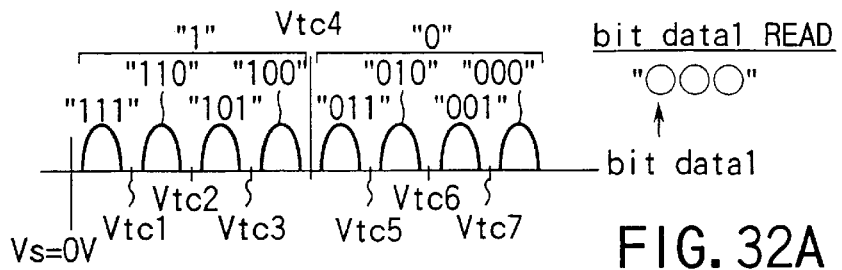
FIG. 32A shows the state of threshold voltages at the time of reading bit data 1.
Figure 32B:
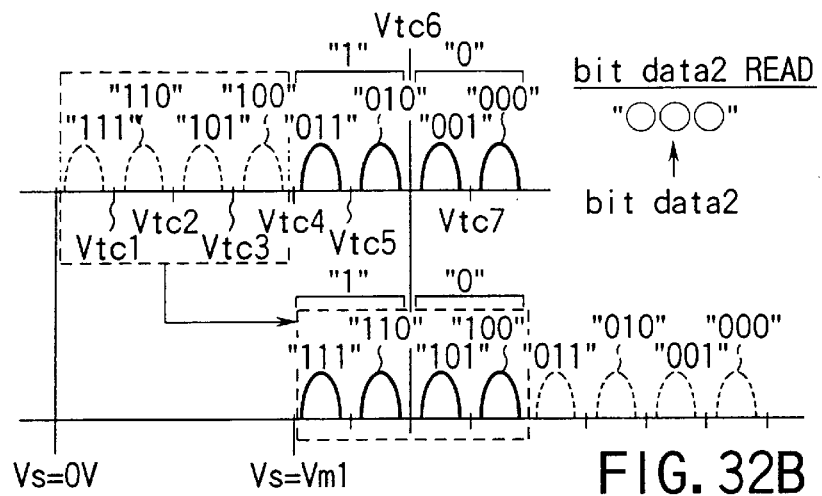
FIG. 32B shows the state of threshold voltages at the time of reading bit data 2.
Figure 32C:
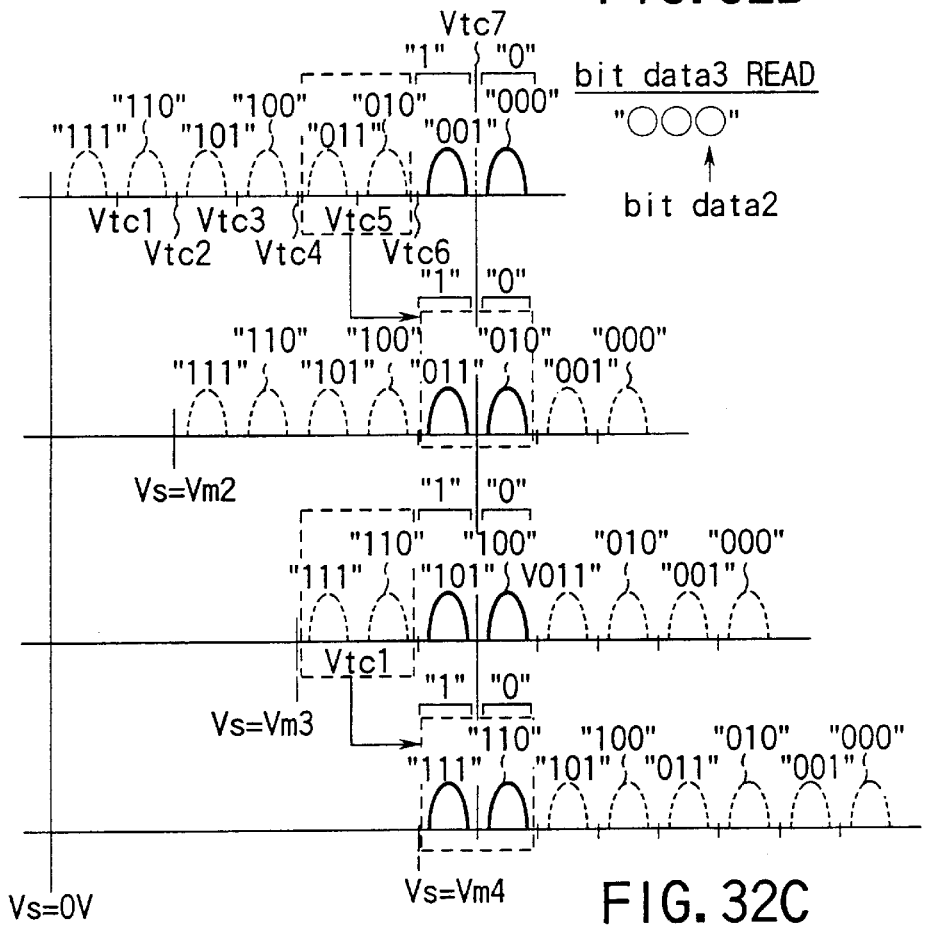
FIG. 32C shows the state of threshold voltages at the time of reading bit data 3.

FIG. 31 is a waveform view showing the operation of the NAND type EEPROM shown in FIG. 29. FIGS. 32A, 32B and 32C show threshold voltage states at the time of reading bit data 1, bit data 2 and bit data 3, respectively.

As shown in FIG. 31, at a time t0, the bit line BLk is pre-charged with a potential Vpc.

At a time t1, the signals ø1, ø2 and ø3 are temporarily set at "H level" and the positive-phase nodes N1, N2 and N3 are pre-charged with the potential Vpc.

At a time t2, while setting the potential of the source SLk at 0V, the potentials of the select gate lines SG1 and SG2 are set at a potential Vread, that of a select word line WL3 is set at a potential Vtc4 and those of non-select word lines WL1, WL2 and WL4 to WL8 are set at the potential Vread. By doing so, the potential of the bit line BLk is changed according to the threshold voltage of the memory cell MC3.

That is, as shown in FIG. 32A, if the threshold voltage of the memory cell MC3 is higher than the potential Vtc4, the memory cell MC3 is turned off and the potential of the bit line BLk substantially remains the potential Vpc. If the threshold voltage of the memory cell MC3 is lower than the potential Vtc4, the memory cell MC3 is turned on and the potential of the bit line BLk is lowered than the potential Vpc.

At a time t3, the signal ø1 is temporarily set at "H level" and the potential of the bit line BLk is transferred to the positive-phase node N1.

At a time t4, the potential of the positive-phase node N1 and the potential Vref of the anti-phase node /N1 are compared/amplified. If the potential of the positive-phase node N1 is higher than the potential Vref of the anti-phase node /N1, it is determined that the bit data 1 is "0". If the potential of the positive-phase node N1 is lower, it is determined that the bit data 1 is "1". In response to the determination of the bit data 1 as "0" or "1", the potential of the source line SLk is changed. That is, when the bit data 1 is "0", the potential of the source line SLk remains 0V. When the bit data 1 is "1", the potential of the source line SLk is set at the positive potential Vm1.

Also, in this embodiment, after the signal ø1 is changed from "H" level to "L" level, all the potentials of the select gate lines SG1 and SG2, the select word line WL3 and the non-select word lines WL1, WL2 and WL4 to WL8 are set at 0V.

At a time t5, while setting the potential of the source line SLk at 0V or Vm1, the potentials of the select gate line SG1 and SG2 are set at the potential Vread, that of the select word line WL3 are set at a potential Vtc6 and those of the non-select word lines WL1, WL2 and WL4 to WL8 are set at the potential Vread. By doing so, the potential of the bit line BLk is changed according to the threshold voltage of the memory cell MC3.

That is, as shown in FIG. 32B, if the threshold voltage of the memory cell MC3 is higher than a potential Vtc6, the memory cell MC3 is turned off and the potential of the bit line BLk substantially remains the potential Vpc. If the threshold voltage of the memory cell MC3 is lower than the potential Vtc6, the memory cell MC3 is turned on and the potential of the bit line BLk is lowered from the potential Vpc.

At a time t6, the signal ø2 is temporarily set at "H" level and the potential of the bit line BLk is transferred to the positive-phase node N2.

At a time t7, the potential of the positive-phase node N2 and the potential Vref of the anti-phase node /N2 are compared/amplified. If the potential of the positive-phase node N2 is higher than the potential Vref of the anti-phase node /N2, it is determined that the bit data 2 is "0". If the potential of the positive-phase node N2 is lower than the potential Vref, it is determined that the bit data 2 is "1". In response to the determination of the bit data 2 as "0" or "1", the potential of the source line SLk is changed. That is, when the bit data 2 is "0", the potential of the source line SLk remains 0V or Vm1. When the bit data 2 is "1", a positive potential Vm2 is further added to the potential of the source line SLk.

Further, in this embodiment, after the signal ø2 is turned from "H" level to "L" level, all the potentials of the select gate lines SG1 and SG2, the select word line WL3 and the non-select word lines WL1, WL2 and WL4 to WL8 are set at 0V.

At a time t8, while setting the potential of the source line SLk at 0V, Vm1, Vm2 or Vm1+Vm2, the potentials of the select gate lines SG1 and SG2 are set at the potential Vread, that of the select word line WL3 is set at a potential Vtc7 and those of the non-select word lines WL1, WL2 and WL4 to WL8 are set at the potential Vread. By doing so, the potential of the bit line BLk is changed according to the threshold voltage of the memory cell MC3.

That is, as shown in FIG. 32C, if the threshold voltage of the memory cell MC3 is higher than a potential Vtc7, the memory cell MC3 is turned off and the potential of the bit line BLk substantially remains the potential Vpc. If the threshold voltage of the memory cell MC3 is lower than the potential Vtc7, the memory cell is turned on and the potential of the bit line BLk is lowered from the potential Vpc.

At a time t9, the signal ø3 is temporarily set at "H" level and the potential of the bit line BLk is transferred to the positive-phase node N3.

At a time t10, the potential of the positive-phase node N3 and the potential Vref of the anti-phase node /N3 are compared/amplified. If the potential of the positive-phase node N3 is higher than the potential Vref of the anti-phase node /N2, it is determined that the bit data 3 is "0". If the potential of the positive-phase node N3 is lower than the potential Vref, it is determined that the bit data 3 is "1".

In this way, with the NAND type EEPROM shown in FIG. 29, the eight-level data stored in one memory cell can be converted to three-bit data by carrying out data read three times.

(Fifth Embodiment)

There are two basic multilevel data reading techniques.

In the first technique, a bit line BL is pre-charged with "H" level and it is detected whether or not the pre-charged bit line BL is discharged depending on whether the memory cell MC is turned on or off (which technique will be referred to as "bit line discharge technique" hereinafter).

In the second technique, the memory cell is turned on while setting a common line CL at "H" level and changing the bit line BL from "L" level to a floating state. Then, utilizing the variation of the charge level of the bit line BL according to the threshold voltage of the memory cell MC, the reference potential is switched (n−1) times to thereby detect to which potential level the bit line BL is charged (which technique will be referred to as "threshold voltage detection technique" hereinafter).

The shift of the threshold voltage due to the substrate bias effect employed in the third and fourth embodiments occurs by changing the potential of the terminal at a low potential of either the source or drain of the MOSFET. The source potential of the memory cell is individually set in the third and fourth embodiments, whereas the potential of the bit line corresponding to the drain potential of the memory cell is individually set in this fifth embodiment.

Figure 33:
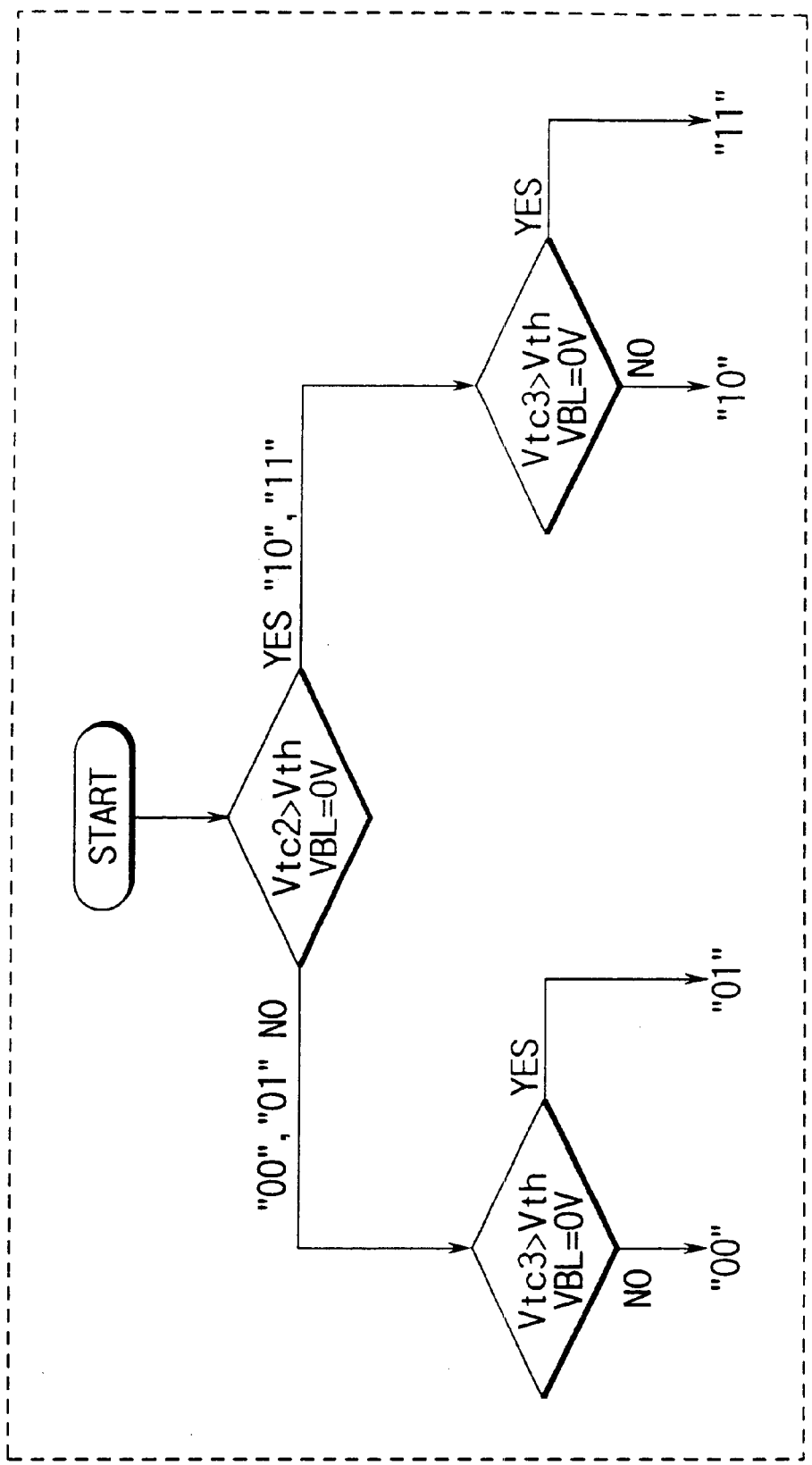
FIG. 33 is a flowchart showing a four-level data reading method in the fifth embodiment according to the present invention.

FIG. 33 is a flowchart showing a four-level data reading method in the fifth embodiment according to the present invention. As shown in FIG. 33, data read is carried out twice as follows:

First read:

While changing a bit line potential VBL from 0V to a floating state and setting the gate potential of a memory cell at a voltage Vtc2 between "Vth10" and "Vth01", data read is carried out. If the memory cell is turned "on" (Vtc2>Vth), data is either "11" or "10". That is, it is determined that one of the two-bit data or bit data 1 in the fifth embodiment is "1". If the memory cell is turned "off", the data is either "01" or "00". That is, it is determined that the bit data 1 is "0".

Second read:

Before carrying out the second read, the bit line potential VBL is changed based on the result of the first read. That is, if the bit data 1 is "1", the bit line potential VBL is changed from the positive potential Vm to a floating state. If the bit data 1 is "0", the bit line potential VBL is changed from 0V to a floating state as in the case of the first read.

If the potential VBL of the bit line BL is changed from the positive potential Vm to the floating state, a positive potential Vm is added to the reference potential Vref.

While the bit line potential VBL is set individually as stated above and the gate potential is set at a read voltage Vtc3 between "Vth01" and "Vth00", data read is carried out. If the memory cell is turned "on" (Vtc3>Vth), data is either "01" or "11". That is, it is determined that the other data of the two-bit data or bit data 2 in the fifth embodiment is "1". If the memory cell is turned "off", the data is either "00" or "01". That is, it is determined that the bit data 2 is "0".

According to the fifth embodiment as in the case of the third embodiment, the bit data 1 is determined in the first read and if the bit data 1 is "1", the bit line potential VBL is changed from the positive potential Vm to a floating state. Besides, the positive potential Vm is added to the reference potential Vref. This makes it possible to determine the bit data 2 in the second read in which the gate potential is fixed to Vtc3.

As a result, according to the fifth embodiment as in the case of the third embodiment, the four-level data stored in one memory cell can be converted to two-bit data by carrying out data read twice.

According to the above-stated fifth embodiment, compared with the conventional threshold voltage detection technique in which the reference potential is switched (n−1) times and comparison/amplification is carried out (n−1) times, it is possible to reduce the number of comparison/amplification operations to not less than m (where m is the lowest integer satisfying $\log_2 n \leq m$) and less than (n−1). It is, therefore, possible to obtain the advantage of easily shortening time required from data read to data determination.

Figure 34:
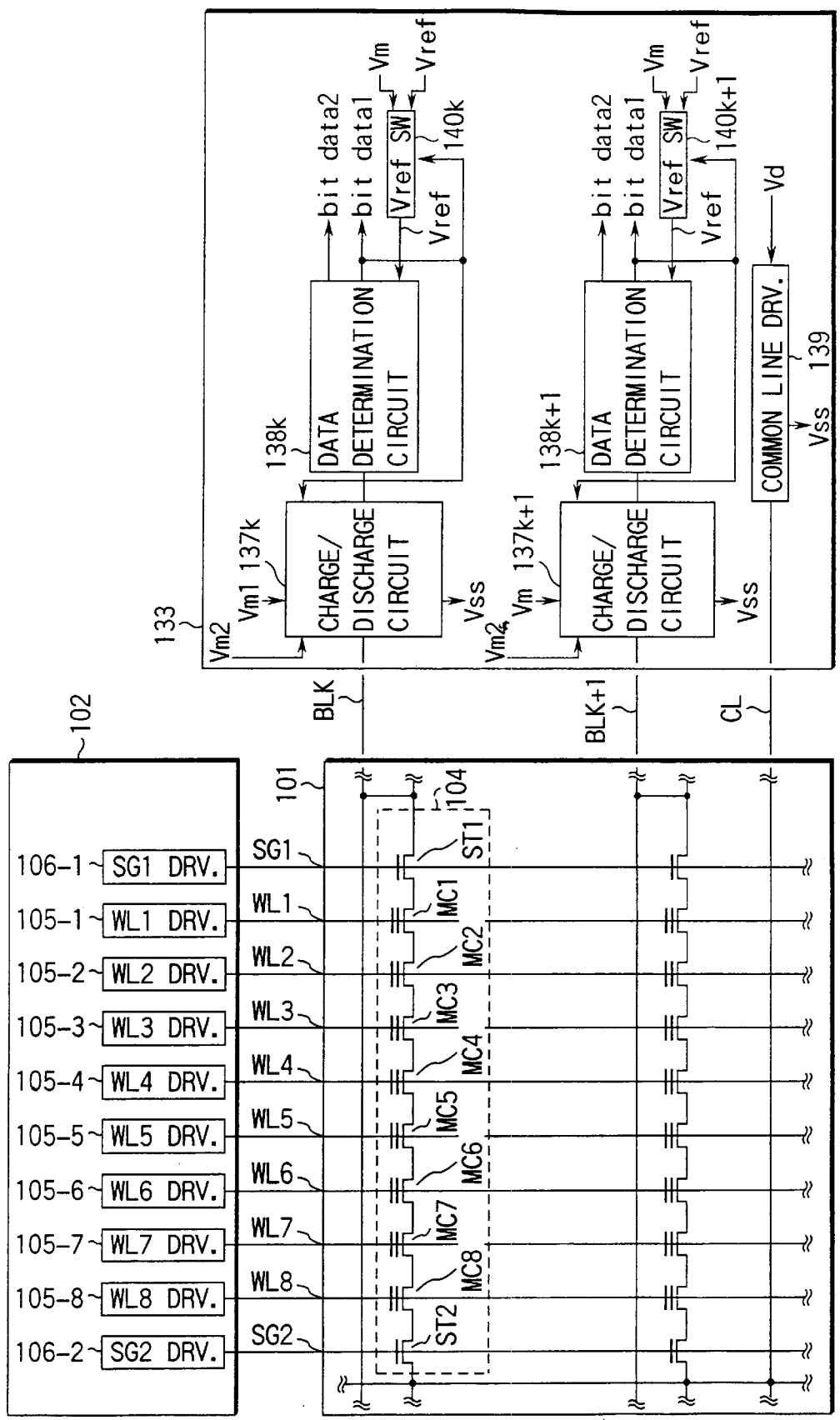
FIG. 34 is a block diagram showing an NAND type EEPROM to which a four-level data reading method in the fifth embodiment according to the present invention is applied.

FIG. 34 is a block diagram showing an example of the configuration of an NAND type EEPROM to which the four-level data reading method in the fifth embodiment according to the present invention is applied.

As shown in FIG. 34, the data line circuit 133 of the NAND type EEPROM to which the four-level data reading method in the fifth embodiment according to the present invention is applied, includes charge/discharge circuits 137 (137k, 137k+1), data determination circuits 138 (138k, 138k+1) for determining data to be read on bit lines BL (BLk, BLk+1), a common line driving circuit 39 for driving a common line CL shared among NAND cells 4 and reference potential switches 140 (140k, 140k+1).

Figure 35:
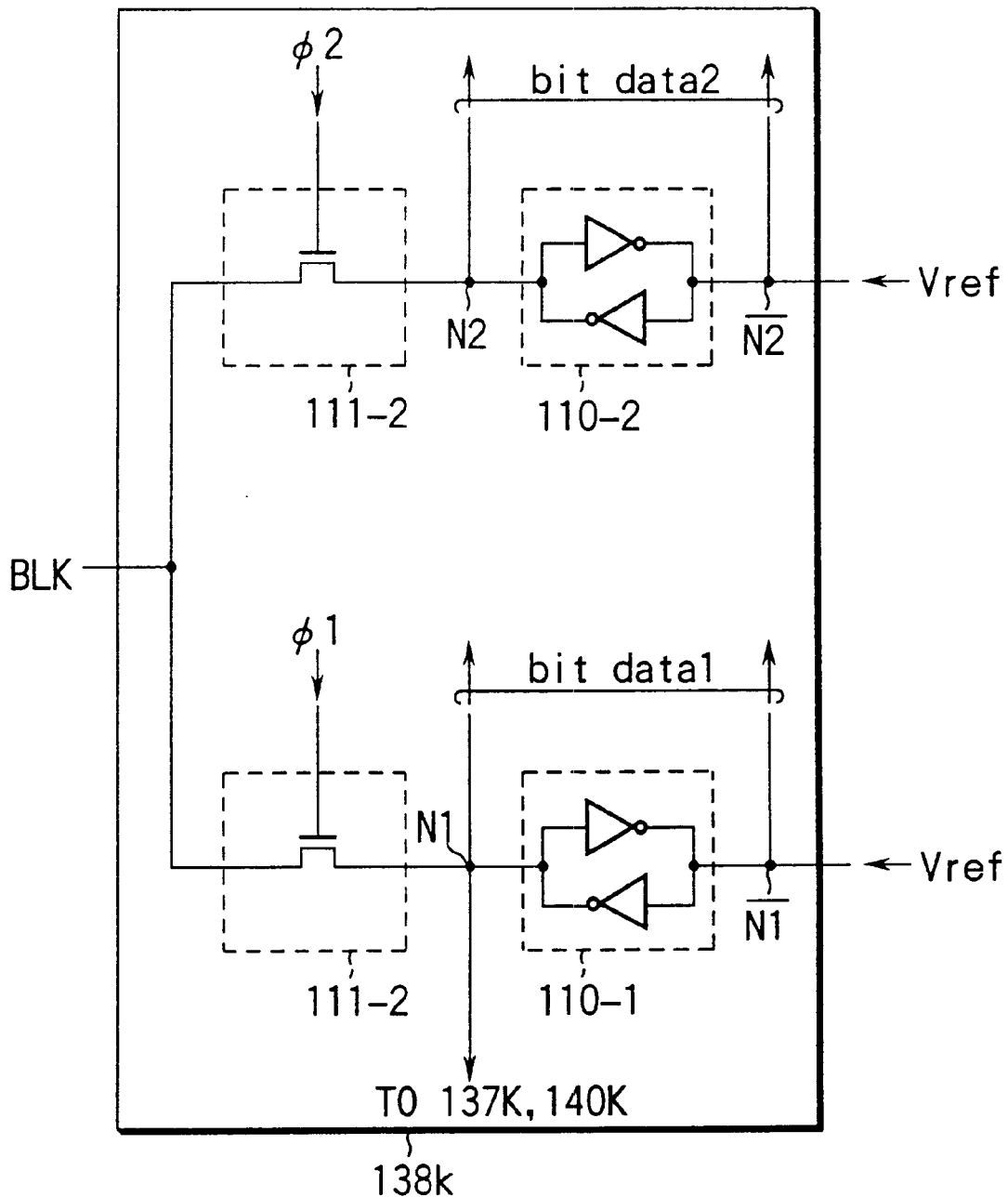
FIG. 35 is a circuit diagram showing a data determination circuit shown in FIG. 34.

FIG. 35 is a circuit diagram for the data determination circuit 138k. While the data determination circuit 138k is shown in FIG. 35, the data determination circuit 138k+1 is similar to the circuit 138k.

As shown in FIG. 35, the data determination circuit 138k has almost the same configuration as that of the data determination circuit 108k in the third embodiment. The data determination circuit 138 differs from the circuit 108k in that after bit data 1 is determined while changing the potential of the bit line BL (BLk, BLk+1) from 0V to a floating state, bit data 2 is determined while changing the potential of the bit line BL (BLk, BLk+1) from 0V to a floating state or from a positive potential Vm to a floating state according to the determination result of the bit data 1 and in that a positive potential Vm is added to a reference potential Vref.

In the determination of the bit data 2, whether or not the reference potential and the potential of the bit lines BL (BLk, BLk+1) are switched is determined based on the potential of the positive-phase node N1 (or anti-phase node /N1) of the sense amplifier/data latch circuit 110-1.

Next, the operation of the sense amplifier/data latch circuit will be described. The following description of the operation is given while paying attention to the bit line BLk and assuming that a word line WL3 is selected.

Figure 36:
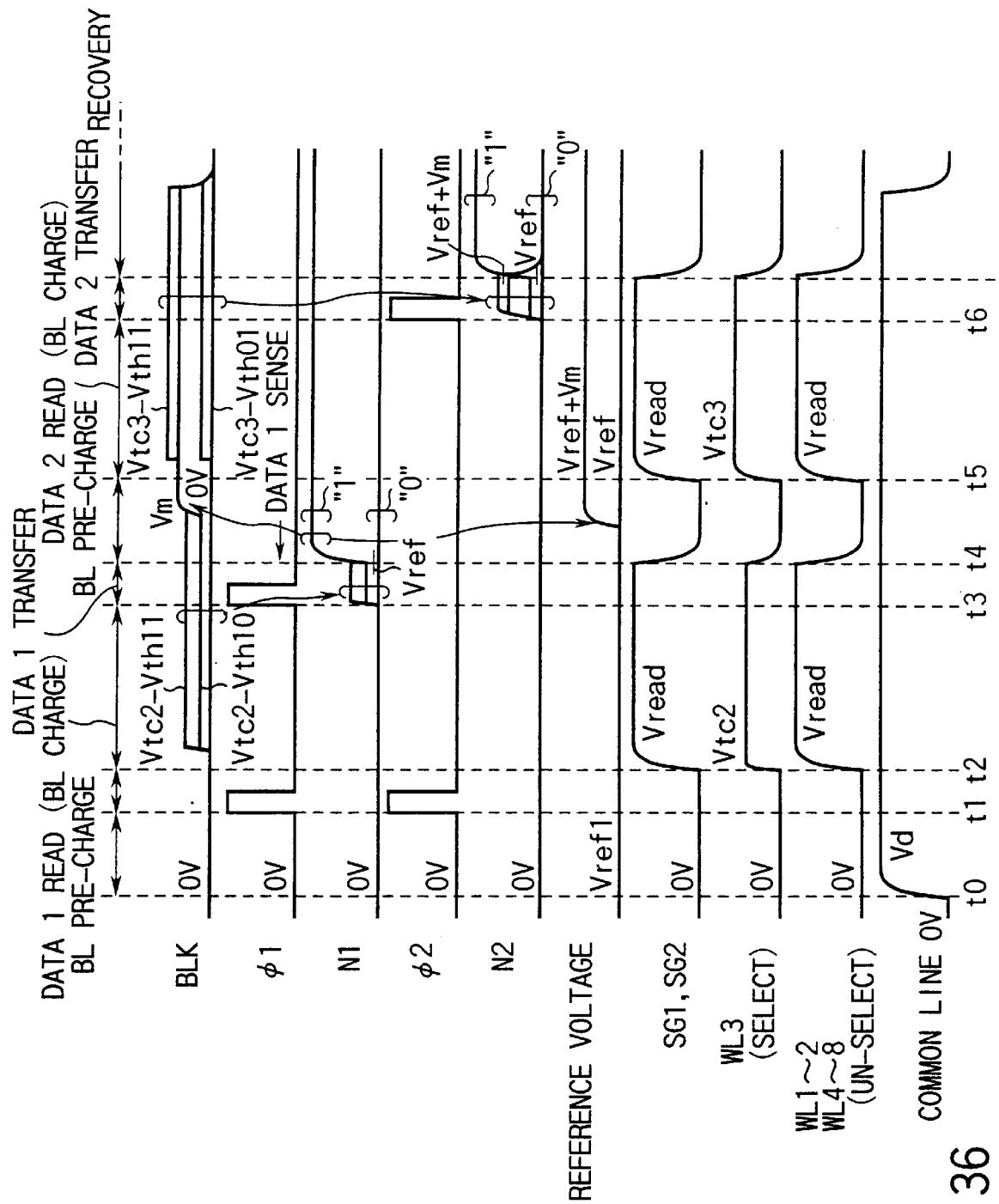
FIG. 36 is a waveform view showing the operation of the NAND type EEPROM shown in FIG. 34.

FIG. 36 is a waveform view showing the operation of the NAND type EEPROM shown in FIG. 34.

As shown in FIG. 36, at a time t0, the bit line BLk is pre-charged with 0V.

At a time t1, signals ø1 and ø2 are temporarily set at "H" level and positive-phase nodes N1 and N2 are pre-charged with 0V.

At a time t2, while the potential of the bit line BLk is changed from 0V to a floating state and that of the common line CL is set at Vd, the potentials of select gate lines SG1 and SG2 are set at a potential Vread, that of the select word line WL3 is set at a potential Vtc2 and those of non-select word lines WL1, WL2 and WL4 to WL8 are set at a potential Vread. By doing so, the potential of the bit line BLk is changed according to the threshold voltage of the memory cell MC3. That is, if the threshold voltage of the memory cell MC3 is higher than the potential Vtc2, the memory cell MC3 is turned off and the potential of the bit line BLk substantially remains 0V. If the threshold voltage of the memory cell MC3 is lower than the potential Vtc2, the memory cell MC3 is turned on and the potential of the bit line BLk is increased from 0V to either "Vtc2−Vth10" or "Vtc2−Vth11" according to the threshold voltage of the memory cell.

At a time t3, the signal ø1 is temporarily set at "H" level and the potential of the bit line BLk is transferred to the positive-phase node N1.

At a time t4, the potential of the positive-phase node N1 and the potential Vref of the anti-phase node /N1 are compared/amplified. If the potential of the positive-phase node N1 is higher than the potential Vref of the anti-phase node /N1, it is determined that the bit data 1 is "1". If the potential of the positive-phase node N1 is lower, it is determined that the bit data 1 is "0"s. In response to the determination of the bit data 1 as either "0" or "1", the potential of the bit line BLk and the reference potential Vref are changed. That is, if the bit data 1 is "0", the potential of the bit line BLk is changed to 0V. If the bit data 1 is "1", the potential of the bit line BLk is changed to a positive potential Vm and the positive potential Vm is added to the reference potential Vref.

In this embodiment, after the signal ø1 is changed from "H" level to "L" level, all the potentials of the select gate lines SG1 and SG2, the select word line WL3 and the non-select word lines WL1, WL2 and WL4 to WL8 are set at 0V.

At a time t5, while the potential of the bit line BLk is changed from 0V to a floating state or from the positive potential Vm to a floating state and that of the common line CL is set at Vd, the potentials of the select gate lines SG1 and SG2 are set at the potential Vread, that of the select word line WL3 is set at the potential Vtc3 and those of the non-select word lines WL1, WL2 and WL4 to WL8 are set at the potential Vread. By doing so, the potential of the bit line BLk is changed according to the threshold voltage of the memory cell MC3. That is, if the threshold voltage of the memory cell MC3 is higher than the potential Vtc3, the memory cell MC3 is turned off and the potential of the bit line BLk substantially remains 0V or the positive potential Vm. If the threshold voltage of the memory cell MC3 is lower than the potential Vtc3, the memory cell MC3 is turned on and the potential of the bit line BLk is increased by "Vtc3–Vth01".

At a time t6, the signal ø2 is temporarily set at "H" level and the potential of the bit line BLk is transferred to the positive-phase node N2.

At a time t7, the potential of the positive-phase node N2 and the potential Vref or Vref+Vm of the anti-phase node /N2 are compared/amplified. If the potential of the positive-phase node N2 is higher than the potential Vref or Vref+Vm of the anti-phase node /N2, it is determined that the bit data 2 is "1". If the potential of the positive-phase node N1 is lower than the potential Vref or Vref+Vm, it is determined that the bit data 2 is "0".

As can be seen from the above, in the NAND type EEPROM shown in FIG. 34, the four-level data stored in one memory cell can be converted to two-bit data by carrying out data read twice and comparison/amplification twice.

(Sixth Embodiment)

Figure 37:
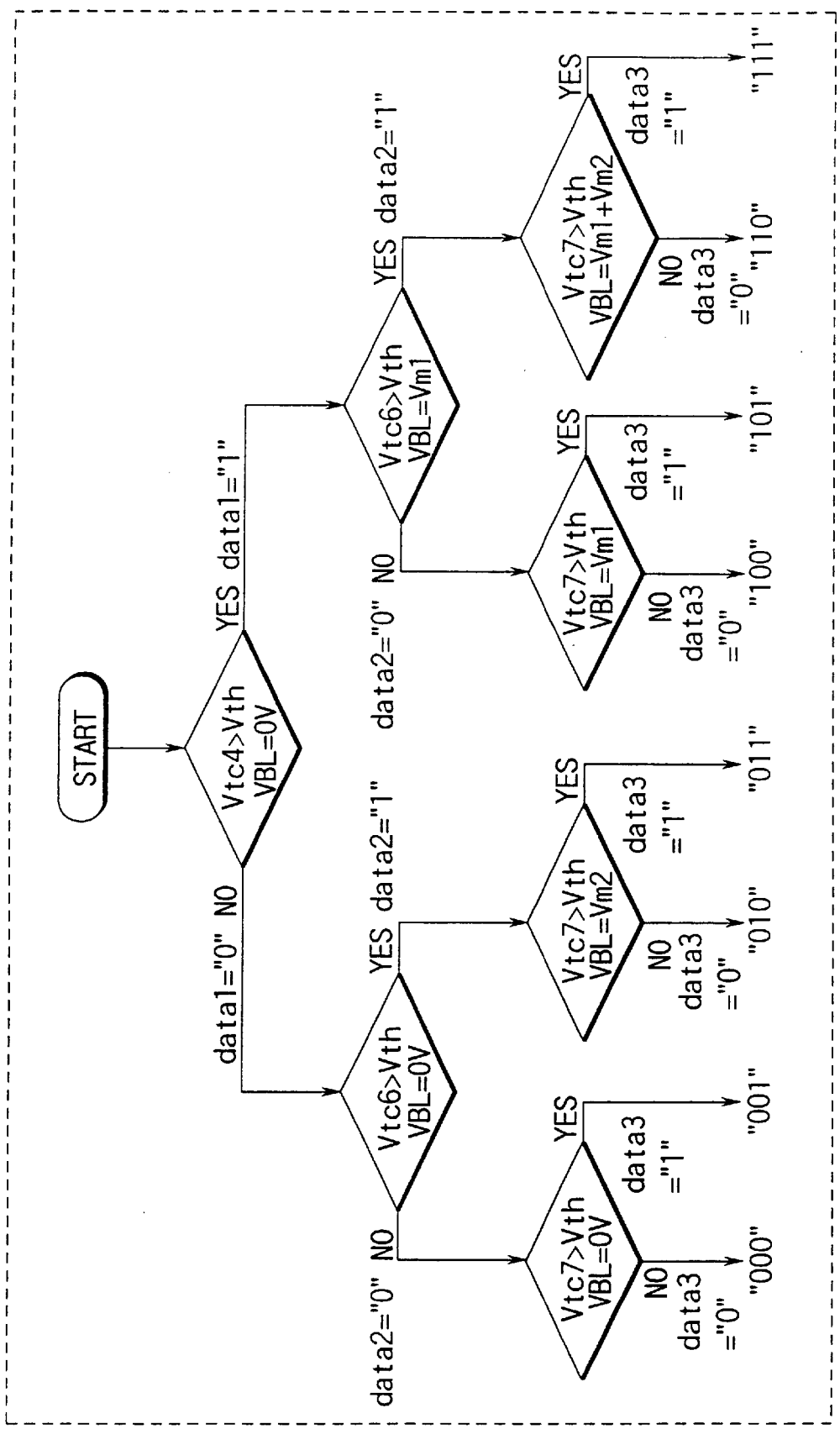
FIG. 37 is a flowchart showing an eight-level data reading method in the sixth embodiment according to the present invention.

FIG. 37 is a flowchart showing an eight-level data reading method in the sixth embodiment according to the present invention.

As shown in FIG. 37, data read is carried out three times as follows.

First read:

While changing a bit line potential VBL from 0V to a floating state and setting the gate potential of a memory cell at a read voltage Vtc4 between "Vth011" and "Vth100", data read is carried out. If the memory cell is turned "on" (Vtc4>Vth), data is one of data "100", "101", "110" and "111". That is, it is determined that one of the three-bit data or bit data 1 in the sixth embodiment is "1". If the memory cell is turned "off", the data is one of data "000", "001", "010" and "011". That is, it is determined that the bit data 1 is "0".

Second read:

Prior to carrying out the second read, the bit line potential VBL is changed based on the result of the first read. That is, if the bit data 1 is "1", the bit line potential VBL is changed from a positive potential Vm1 to a floating state. If the bit data 1 is "0", the bit line potential VBL is changed from 0V to a floating state as in the case of the first read. If the bit data 1 is "1", the positive potential Vm1 is added to a reference potential Vref.

While the bit line potential VBL and the reference potential Vref are individually set based on the result of the first read as stated above and the gate potential is set at a voltage Vtc6 between "Vth010" and "Vth001", data read is carried out. If the memory cell is turned "on" (Vtc6>Vth), data is one of data "010", "011", "110" and "111". That is, it is determined that the second data of the three-bit data or bit data 2 in the sixth embodiment is "1". If the memory cell is turned "off", the data is one of data "000", "001", "100" and "101". That is, it is determined that the bit data 2 is "0".

Third read:

Prior to carrying out the third read, the bit line potential VBL is changed based on the result of the second read. That is, if the bit data 2 is "1", the positive potential Vm2 is added to the bit line potential VBL and the potential VBL is changed to a floating state. If the bit data 2 is "0", the bit line potential VBL is changed from 0V or the positive potential Vm to a floating state as in the case of the second read. If the bit data 2 is "1", a positive potential Vm2 is added to the reference potential Vref or Vref+Vm1.

While the bit line potential VBL and the reference potential Vref are individually set as stated above and the gate potential is set at a voltage Vtc7 between "Vth001" and "Vth000", data read is carried out. If the memory cell is turned "on" (Vtc7>Vth), data is one of data "001", "011", "101" and "111". That is, it is determined that the third data of the three-bit data or bit data 3 in the sixth embodiment is "1". If the memory cell is turned "off", the data is one of data "000", "010", "100" and "110". That is, it is determined that the bit data 3 is "0".

According to the above-stated sixth embodiment as in the case of the fourth embodiment, the bit data 1 is determined in the first read and if the bit data 1 thus determined is "1", the bit line potential VBL is changed from the positive potential Vm1 to a floating state. Besides, the positive potential Vm1 is added to the reference potential Vref. This makes it possible to determine the bit data 2 in the second read while the gate potential is fixed to Vtc6. If the bit data 2 is determined as "1" in the second read, the bit line potential VBL is changed from a potential to which the positive potential Vm2 is added to a floating state. Further, the positive potential Vm2 is added to the reference potential Vref or Vref+Vm1. This makes it possible to determine the bit data 3 in the third read in which the gate potential is fixed to Vtc7.

As a result, as in the case of the fourth embodiment, the eight-level data stored in one memory cell can be converted to three-bit data by carrying out data read three times and comparison/amplification three times in the sixth embodiment.

Furthermore, according to the sixth embodiment as in the case of the fifth embodiment, compare with the conventional threshold voltage detection technique for switching the reference potential (n−1) times and conducting comparison/amplification (n−1) times, the number of comparison/amplification operations can be reduced to not less than m (where m is the lowest integer satisfying $\log_2 n \leq m$) and less than (n−1). Thus, compared with the multilevel data reading method including switching the reference potential (n−1) times, the method in this embodiment can obtain the advantage of easily shortening time required for carrying out data read to data determination.

Figure 38:
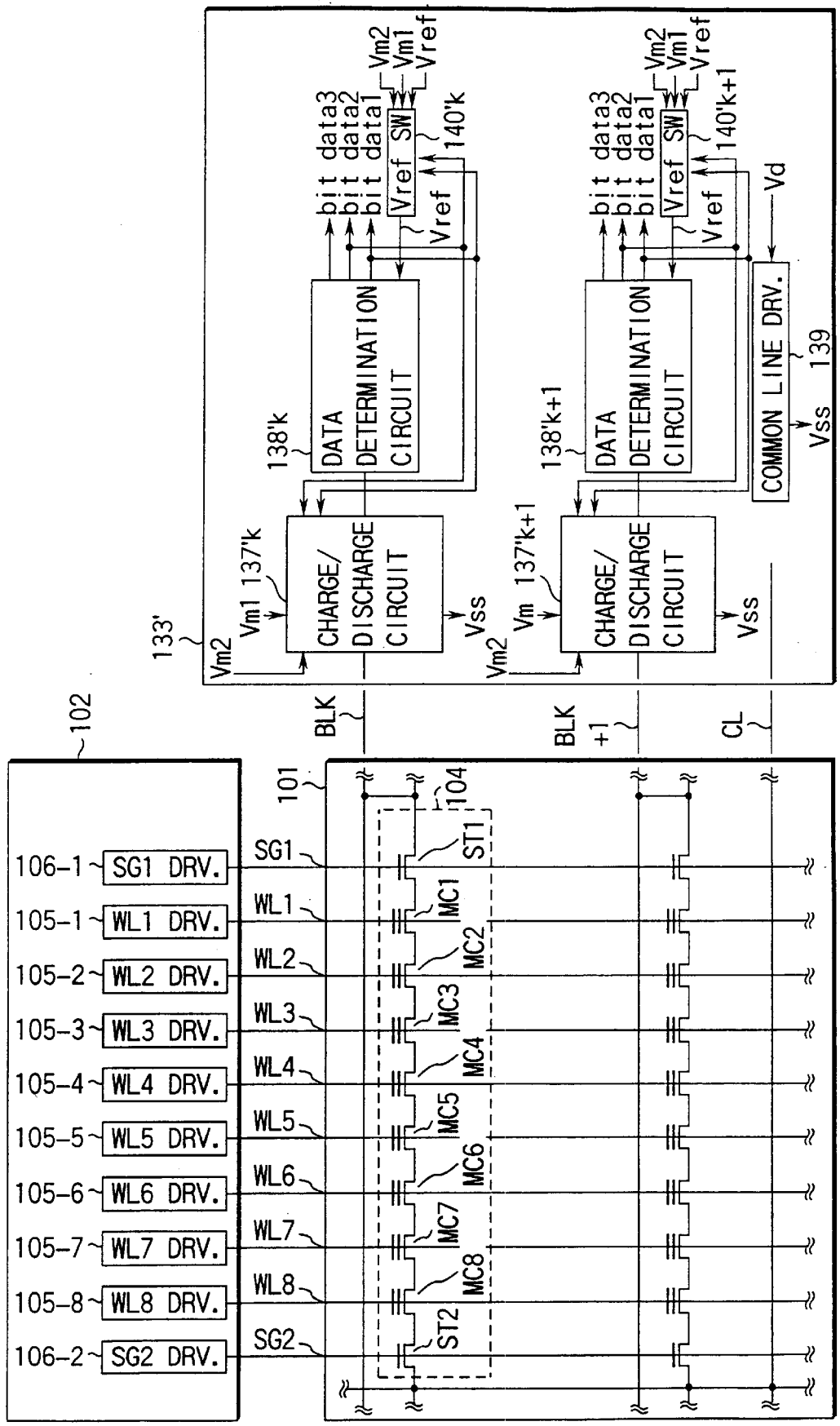
FIG. 38 is a block diagram showing an NAND type EEPROM to which an eight-level data reading method in the sixth embodiment according to the present invention is applied.

FIG. 38 is a block diagram showing an example of the configuration of the NAND type EEPROM to which the eight-level data reading method in the sixth embodiment according to the present invention is applied.

As shown in FIG. 38, the EEPROM to which the sixth embodiment is applied, differs from the EEPROM shown in FIG. 34 in the configuration of a data line circuit 133'. To be specific, bit line charge/discharge circuits 137+ (137'k, 137'k+1) switch the bit line potentials VBL to either 0V or the positive potential Vm1 according to the bit data 1. According to the bit data 2, the positive potential Vm2 is further added to the bit line potentials VBL. The connection of a reference potential switch 140'k is controllable according to the bit data 1 and bit data 2.

Figure 39:
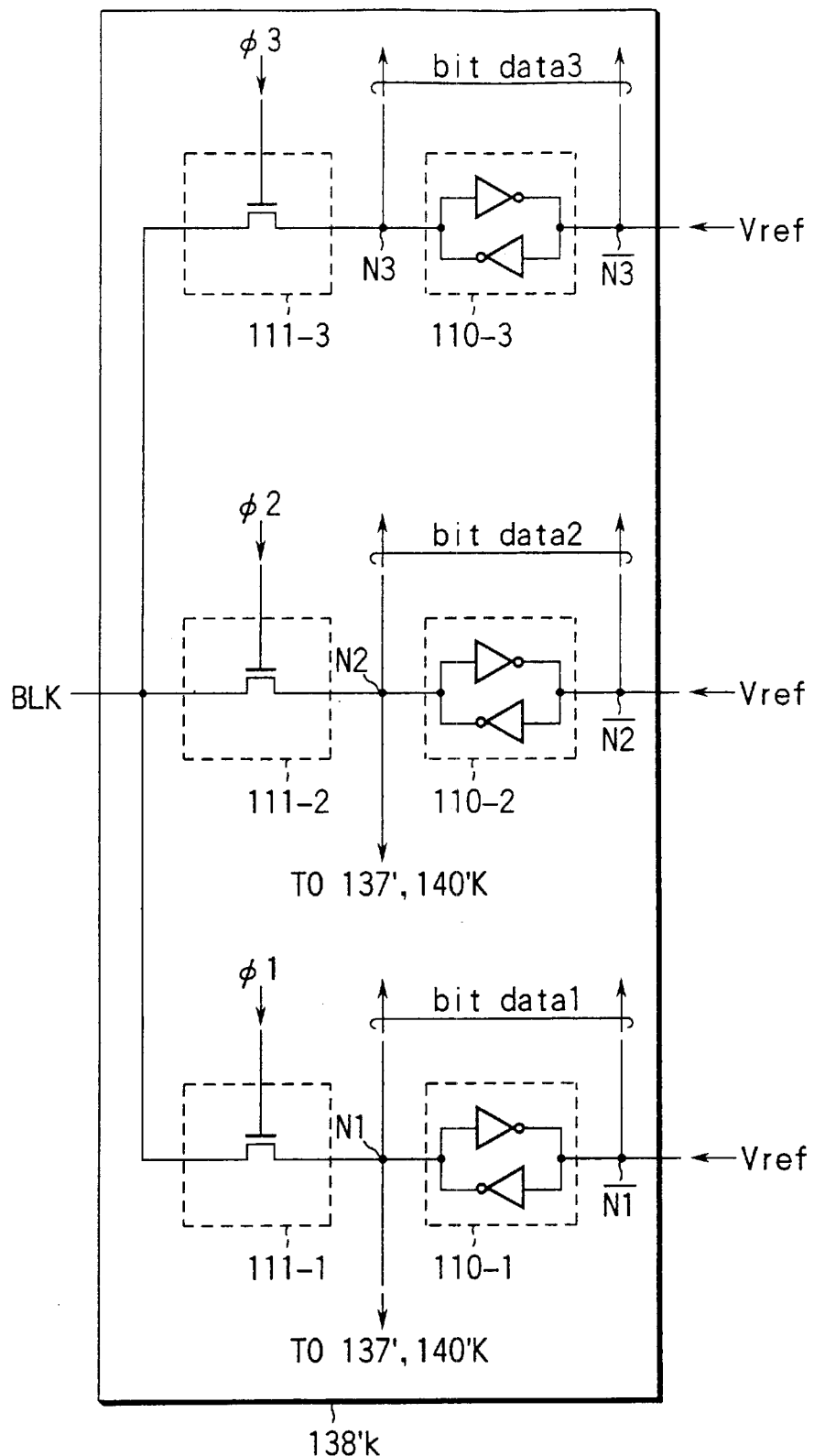
FIG. 39 is a circuit diagram showing a data determination circuit shown in FIG. 38.

FIG. 39 is a circuit diagram for a data determination circuit 138'k shown in FIG. 38. While the data determination circuit 138'k is shown in FIG. 39, a data determination circuit 138'k+1 is similar to the circuit 138'k.

As shown in FIG. 39, the data determination circuit 138'k has almost the same configuration as that of the data determination circuit 8'k in the fourth embodiment. The differences of the circuit 138'k from the circuit 8'k are as follows. After the bit data 1 is determined while changing the potential of the bit line BL (BLk, BLk+1) from 0V to a floating state, the bit data 2 is determined while changing the potential of the bit line BL (BLk, BLk+1) from 0V to a floating state or from the positive potential Vm1 to a floating state according to the determination result of the bit data 1. Also, the positive potential Vm1 is added to the reference potential Vref.

Further, according to the determination result of the bit data 2, the potential of the bit line BL (BLk, BLk+1) is changed from 0V to a floating state, from the positive potential Vm1 to a floating state, from the positive potential Vm2 to a floating state or from the positive potential Vm1+Vm2 to a floating state, and then the bit data 2 is determined. Also, the positive potential Vm2 is added to the reference potential Vref or Vref+Vm1 to thereby set the reference potential at one of Vref, Vref+Vm2, Vref+Vm1, Vref+Vm1+Vm2.

In the determination of the bit data 2, whether or not the potential of the bit line BL (BLk, BLk+1) is switched and whether or not the reference potential Vref or Vref+Vm1 is switched are determined based on the potential of the positive-phase node N1 (or anti-phase node /N1) of a sense amplifier/data latch circuit 110-1.

Also, in the determination of the bit data 3, whether or not the potential of the bit line BL (BLk, BLk+1) is switched and whether or not the reference potential Vref is switched are based on the potential of the positive-phase node N2 (or anti-phase node /N2) of a sense amplifier/data latch circuit 110-2.

Next, the operation of the sense amplifier/data latch circuit will be described. It is noted that the following description of the operation is given while paying attention to the bit line BLk and assuming that a word line WL3 is selected.

Figure 40:
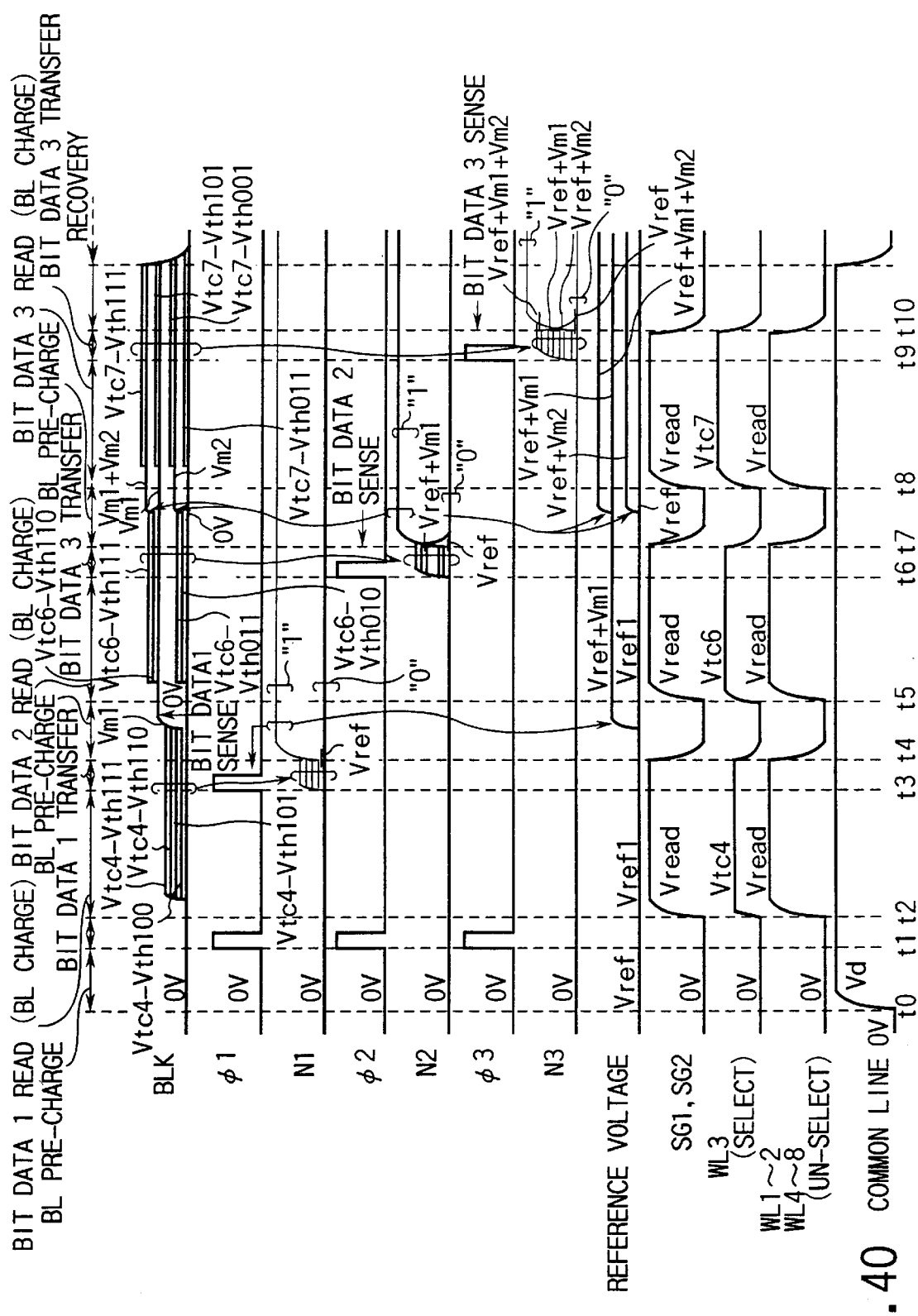
FIG. 40 is a waveform view showing the operation of the NAND type EEPROM shown in FIG. 38.

FIG. 40 is a waveform view showing the operation of the NAND type EEPROM shown in FIG. 38.

As shown in FIG. 40, at a time t0, the bit line BLk is pre-charged with 0V.

At a time t0, signals ø1, ø2 and ø3 are temporarily set at "H" level and positive-phase nodes N1, N2 and N3 are pre-charged with 0V.

At a time t2, while the potential of the bit line BLk is changed from 0V to a floating state and the potential of a common line CL is set at Vd, the potentials of select gate lines SG1 and SG2 are set at a potential Vread, that of the select word line WL3 is set at a potential Vtc4 and those of non-select word lines WL1, WL2 and WL4 to WL8 are set at the potential Vread. By doing so, the potential of the bit line BLk is changed according to the threshold voltage of the memory cell MC3. That is, if the threshold voltage of the memory cell MC3 is higher than the potential Vtc4, the memory cell MC3 is turned off and the potential of the bit line BLk substantially remains 0V. If the threshold voltage of the memory cell MC3 is lower than the potential Vtc4, the memory cell MC3 is turned on and the potential of the bit line BLk is increased from 0V to one of "Vtc4–Vth100", "Vtc4–Vth110", "Vtc4–Vth110" and "Vtc4–Vth111" according to the threshold voltage of the memory cell.

At a time t3, the signal ø1 is temporarily set at "H" level and the potential of the bit line BLk is transferred to the positive-phase node N1.

At a time t4, the potential of the positive-phase node N1 and the potential Vref of the anti-phase node /N1 are compared/amplified. If the potential of the positive-phase node N1 is higher than the potential Vref of the anti-phase node /N1, it is determined that the bit data 1 is "1". If the potential of the positive-phase node N1 is lower, it is determined that the bit data 1 is "0". In response to the determination of the bit data 1 as "0" or "1", the potential of the bit line BLk is changed. That is, when the bit data 1 is "0", the potential of the bit line BLk is set at 0V. When the bit data 1 is "1", the potential of the bit line BLk is changed to the positive potential Vm1. When the bit data 1 is "1", the positive potential Vm1 is added to the reference potential Vref.

In this embodiment, after the signal ø1 is changed from "H" level to "L" level, all the potentials of the select gate lines SG1 and SG2, the select word line WL3 and the non-select word lines WL1, WL2 and WL4 to WL8 are set at 0V.

At a time t5, while the potential of the bit line BLk is changed from 0V to a floating state or from the positive potential Vm1 to a floating state and that of the common line CL is set at Vd, the potentials of the select gate lines SG1 and SG2 are set at the potential Vread, that of the select word line WL3 is set at a potential Vtc6 and those of the non-select word lines WL1, WL2 and WL4 to WL8 are set at the potential Vread. By doing so, the potential of the bit line BLk is changed according to the threshold voltage of the memory cell MC3. That is, if the threshold voltage of the memory cell MC3 is higher than the potential Vtc6, the memory cell MC3 is turned off and the potential of the bit line BLK substantially remains 0V or the positive potential Vm1. If the threshold voltage of the memory cell MC3 is lower than the potential Vtc6, the memory cell MC3 is turned on and the potential of the bit line BLk is increased by "Vtc6–Vth010" or "Vtc6–Vth011".

At a time t6, the signal ø2 is temporarily set at "H" level and the potential of the bit line BLk is transferred to the positive-phase node N2.

At a time t7, the potential of the positive-phase node N2 and the potential Vref of the anti-phase node /N2 are compared/amplified. If the potential of the positive-phase node N2 is higher than the potential Vref or Vref+Vm1 of the anti-phase node /N2, it is determined that the bit data 2 is "1". If the potential of the positive-phase node N2 is lower than the potential Vref or Vref+Vm1, it is determined that the bit data 2 is "0". In response to the determination of the bit data 2 as "0" or "1", the potential of the bit line BLk and the reference potential Vref are changed. That is, when the bit data 2 is "0", the potential of the bit line BLk is set at 0V or the positive potential Vm1. If the bit data 1 is "1", the positive potential Vm2 is added to the potential of the bit line BLk and also to the reference potential Vref.

In this embodiment, after the signal ø2 is changed from "H" level to "L" level, all the potentials of the select gate lines SG1 and SG2, the select word line WL3 and the non-select word lines WL1, WL2 and WL4 to WL8 are set at 0V.

At a time t8, while the potential of the bit line BLk is changed from 0V to a floating state, from the positive potential Vm2 to a floating state, from the positive potential Vm1 to a floating state or from the positive potential Vm1+Vm2 to a floating state and the potential of the common line CL is set at Vd, the potentials of the select gate lines SG1 and SG2 are set at the potential Vread, that of the select word line WL3 is set at a potential Vtc7 and those of the non-select word lines WL1, WL2 and WL4 to WL8 are set at the potential Vread. By doing so, the potential of the bit line BLk is changed according to the threshold voltage of the memory cell MC3. That is, if the threshold voltage of the memory cell MC3 is higher than the potential Vtc7, the memory cell MC3 is turned off and the potential of the bit line BLk substantially remains 0V, the positive potential Vm2, the positive potential Vm1 or the positive potential Vm1+Vm2. If the threshold voltage of the memory cell MC3 is lower than the potential Vtc7, the memory cell MC3 is turned on and the potential of the bit line BLk is increased by "Vtc7–Vth001".

At a time t9, the signal ø3 is temporarily set at "H" level and the potential of the bit line BLk is transferred to the positive-phase node N3.

At a time t10, the potential of the positive-phase node N3 and the potential Vref of the anti-phase node /N3 are compared/amplified. If the potential of the positive-phase node N3 is higher than the potential Vref, Vref+Vm2, Vref+Vm1 or Vref+Vm1+Vm2 of the anti-phase node /N3, it is determined that the bit data 3 is "1". If the potential of the positive-phase node N3 is lower than the potential Vref, Vref+Vm2, Vref+Vm1 or Vref+Vm1+Vm2 of the anti-phase node /N3, it is determined that the bit data 3 is "0".

In the NAND type EEPROM shown in FIG. 38 as stated above, the eight-level data stored in one memory cell can be converted to three-bit data by carrying out data read three times and comparison/amplification three times.

Figure 41:
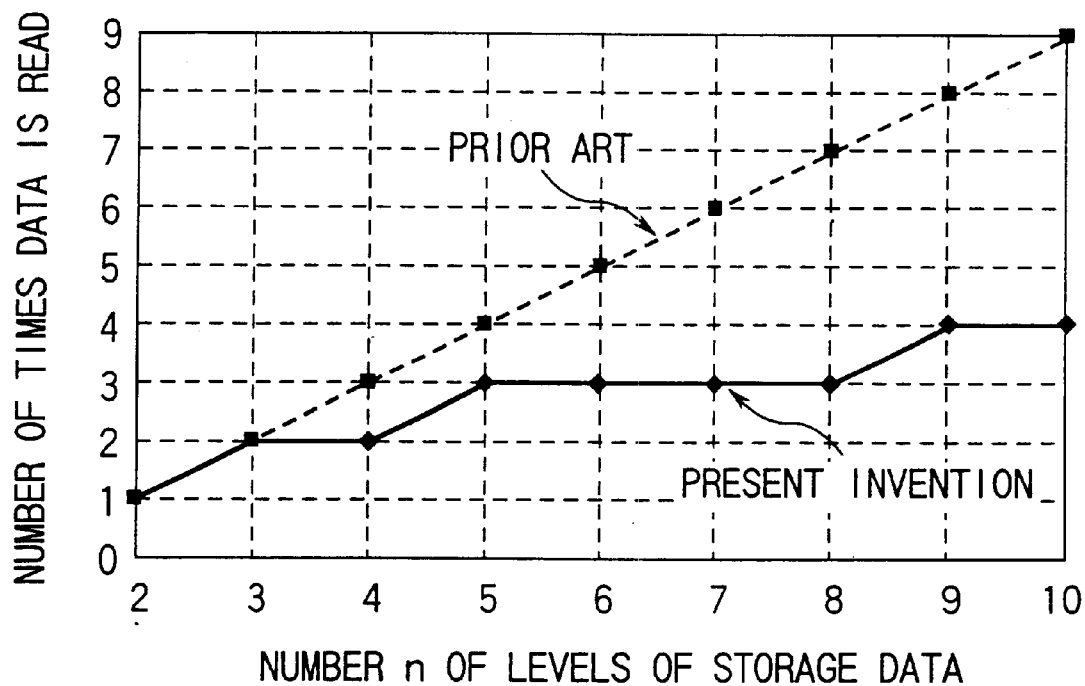
FIG. 41 is a graph showing the relationship between the number of data levels and the number of times of data read.

FIG. 41 shows the relationship between the number of data levels and the number of times of data read.

As shown in FIG. 41, according to the third to sixth embodiments, it is possible to reduce the number of times of data read necessary to determine the number of data levels n from conventional (n−1) to not less than m (where m is the lowest integer satisfying $\log_2 n = m$) and less than (n−1). By reducing the number of times of data read, time required for data read can be shortened.

Description has been given to the invention according to the third to sixth embodiments. Needless to say, the present invention should not be limited to the third to sixth embodiments and may be modified in various manners within the scope of the concept of the present invention.

For example, the third to sixth embodiments have illustrated the NAND type EEPROM. The present invention should not be limited to the NAND type EEPROM but may be applicable to other types of EEPROM including NOR type, DINOR type, AND type and the like.

The fourth and sixth embodiments have particularly illustrated a case where the potential supplied to the source line or bit line during the third read operation is obtained by adding the positive potential Vm2 to the positive potential Vm1 supplied to the source line or bit line during the second read operation. It is also possible to separately prepare a potential almost equal to the sum of the positive potentials Vm1 and Vm2 without adding the positive potential Vm2 and to supply the potential to the source line or bit line by switching operation.

Likewise, the fifth and sixth embodiments have illustrated a case where the reference potential Vref is changed by adding thereto the positive potential Vm, the positive potential Vm1 or the positive potential Vm2. It is also possible that two types of reference potentials and four types thereof are prepared in the second and fourth embodiments, respectively and that these reference potentials are supplied to the sense amplifiers/latch circuits 10 (10-1 to 10-3) by switching operation.

As stated so far, according to the invention in the first and second embodiments, in case of controlling the distribution of the threshold voltages of the memory cells after data erase, soft erase operation for gradually shifting the threshold voltages in negative direction is adopted. As a result, it is possible to greatly narrow the distribution of threshold voltages after data erase even for the memory cell which has been miniaturized considerably. This makes it possible to greatly reduce chances of memory cell writing errors or threshold voltage variation during data write. It is possible to provide a highly reliable nonvolatile semiconductor memory which is a binary or multilevel memory miniaturized to not more than the rule of a gate length of 0.25 μm.

According to the invention in the third to sixth embodiments, it is possible to shorten time required for reading data from a memory cell in a nonvolatile semiconductor memory having memory cells each of which stores n-level (where n is an integer of not less than 4) data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor device comprising:
   a memory cell array including at least first and second memory cells each storing n-level data, where n is an integer not less than 4;
   a first wiring which applies a source potential to the first memory cell; and
   a second wiring which applies a source potential to the second memory cell, wherein
      when determining the n-level data, read of the n-level data is divided into not less than m and less than (n−1) data read operations, where m is a lowest integer satisfying $\log_2 n \leq m$;
      among the divided data read operations, a first data read operation is carried out while setting the source potentials of the first and second memory cells at a common potential; and
      a second data read operation following the first data read operation is carried out according to a result of the first data read operation while individually setting the source potentials of the first and second memory cells.

2. A nonvolatile semiconductor device comprising:
   a first source line driving circuit;
   a first data determination circuit;
   a first memory cell which stores n-level data, where n is an integer not less than 4, the first memory cell located between the first source line driving circuit and the first data determination circuit;
   a second source line driving circuit;
   a second data determination circuit; and
   a second memory cell which stores n-level data, where n is an integer not less than 4, the second memory cell located between the second source line driving circuit and the second data determination circuit, wherein when determining the n-level data, read of the n-level data is divided into not less than m and less than (n−1) data read operations, where m is a smallest integer satisfying $\log_2 n \leq m$;

among the divided data read operations, during a first data read operation, the first and second source line driving circuits supply a common potential to sources of the first and second memory cells; and during a second data read operation following the first data read operation, the first and second source line driving circuits supply individual potentials to sources of the first and second memory cells according to a determination result of the first data read operation carried out by the first and second data determination circuits.

3. A nonvolatile semiconductor memory device comprising:

a memory cell array including at least first and second memory cells each storing n-level data, where n is an integer not less than 4;

a first data determination circuit which determines the n-level data stored by the first memory cell, the first data determination circuit associated with the first memory cell through a first signal line;

a second data determination circuit which determines the n-level data stored by the second memory cell, the second data determination circuit associated with the second memory cell through a second signal line;

a first charge/discharge circuit which charges and discharges the first signal line; and a second charge/discharge circuit which charges and discharges the second signal line, wherein when determining the n-level data, read of the n-level data is divided into not less than m and less than (n−1) data read operations, where m is a lowest integer satisfying $\log_2 n = m$;

among the divided data read operations, during a first data read operation, the first and second charge/discharge circuits set potentials of the first and second signal lines at a common potential;

during a second data read operation following the first data read operation, the first and second charge/discharge circuits set potentials of the first and second signal lines at individual potentials, according to a determination result of the first data read operation carried out by the first and second data determination circuits.

4. A nonvolatile semiconductor memory device comprising:

a memory cell array including at least first and second memory cells each storing n-level data, where n is an integer not less than 4;

a first data determination circuit which determines the n-level data stored by the first memory cell; and a second data determination circuit which determines the n-level data stored by the second memory cell, wherein when determining the n-level data, read of the n-level data is divided into not more than m and less than (n−1) data read operations, where m is a smallest integer satisfying $\log_2 n \leq m$;

among the divided data read operations, during a first data read operation, reference potentials of the first and second data determination circuits are set at a common first potential; and during a second data read operation following the first data read operation, the reference potentials of the first and second data determination circuits are set at the first potential or a second potential different from the first potential, respectively, according to a result of the first data read operation.

5. A nonvolatile semiconductor memory device according to claim 1, wherein each of the first and second read operations is carried out while setting gate potentials of the first and second memory cells at a common gate potential.

6. A nonvolatile semiconductor memory device according to claim 2, wherein each of the first and second read operations is carried out while setting gate potentials of the first and second memory cells at a common gate potential.

7. A nonvolatile semiconductor memory device according to claim 3, wherein each of the first and second read operations is carried out while setting gate potentials of the first and second memory cells at a common gate potential.

8. A nonvolatile semiconductor memory device according to claim 4, wherein each of the first and second read operations is carried out while setting gate potentials of the first and second memory cells at a common gate potential.

* * * * *